United States Patent
Lu et al.

(10) Patent No.: US 11,695,073 B2
(45) Date of Patent: *Jul. 4, 2023

(54) MEMORY ARRAY GATE STRUCTURES

(71) Applicant: Taiwan Semiconductor Manufacturing Co., Ltd., Hsinchu (TW)

(72) Inventors: Chun-Chieh Lu, Taipei (TW); Sai-Hooi Yeong, Zhubei (TW); Bo-Feng Young, Taipei (TW); Yu-Ming Lin, Hsinchu (TW); Chih-Yu Chang, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 14 days.

This patent is subject to a terminal disclaimer.

(21) Appl. No.: 17/072,367

(22) Filed: Oct. 16, 2020

(65) Prior Publication Data

US 2021/0376153 A1 Dec. 2, 2021

Related U.S. Application Data

(60) Provisional application No. 63/031,730, filed on May 29, 2020.

(51) Int. Cl.
*H01L 29/78* (2006.01)
*G11C 11/22* (2006.01)
(Continued)

(52) U.S. Cl.
CPC ...... *H01L 29/78391* (2014.09); *G11C 11/223* (2013.01); *G11C 11/2255* (2013.01);
(Continued)

(58) Field of Classification Search
None
See application file for complete search history.

(56) References Cited

U.S. PATENT DOCUMENTS 6,204,158 B1 3/2001 Hendrix et al.
8,530,976 B1 9/2013 Ratnakumar et al.
(Continued)

FOREIGN PATENT DOCUMENTS

KR 20150038352 A 4/2015
KR 20150118395 A 10/2015
(Continued)

OTHER PUBLICATIONS

Kim et al., "Synergistic Improvement of Long-Term Plasticity in Photonic Synapses Using Ferroelectric Polarization in Hafnia-Based Oxide-Semiconductor Transistors" Advanced Materials, Feb. 2020, 32, Pohang, Korea, pp. 1-6.
(Continued)

*Primary Examiner* — Vincent Wall
(74) *Attorney, Agent, or Firm* — Slater Matsil, LLP

(57) ABSTRACT

A memory cell includes a thin film transistor over a semiconductor substrate. The thin film transistor comprising: a ferroelectric (FE) material contacting a word line, the FE material being a hafnium-comprising compound, and the hafnium-comprising compound comprising a rare earth metal; and an oxide semiconductor (OS) layer contacting a source line and a bit line, wherein the FE material is disposed between the OS layer and the word line.

20 Claims, 55 Drawing Sheets

(51) Int. Cl.
*H01L 29/24* (2006.01)
*H01L 29/786* (2006.01)
*H01L 29/04* (2006.01)
*H01L 29/66* (2006.01)
*H10B 51/10* (2023.01)
*H10B 51/20* (2023.01)
*H10B 51/30* (2023.01)

(52) U.S. Cl.
CPC .......... *G11C 11/2257* (2013.01); *H01L 29/04* (2013.01); *H01L 29/24* (2013.01); *H01L 29/66969* (2013.01); *H01L 29/7869* (2013.01); *H10B 51/10* (2023.02); *H10B 51/20* (2023.02); *H10B 51/30* (2023.02)

(56) References Cited

U.S. PATENT DOCUMENTS

| | | | |
|---|---|---|---|
| 9,318,315 B2 | 4/2016 | Mueller et al. | |
| 10,367,003 B2 | 7/2019 | Kang et al. | |
| 10,910,393 B2 | 2/2021 | Lai et al. | |
| 2004/0026725 A1 | 2/2004 | Gnadinger | |
| 2008/0258140 A1 | 10/2008 | Lee et al. | |
| 2008/0258141 A1 | 10/2008 | Park et al. | |
| 2010/0133601 A1 | 6/2010 | Miyazaki et al. | |
| 2010/0330738 A1* | 12/2010 | Uchiyama | H01L 29/66969 204/298.13 |
| 2011/0180796 A1 | 7/2011 | Yamazaki et al. | |
| 2011/0215317 A1 | 9/2011 | Yamazaki et al. | |
| 2012/0181534 A1 | 7/2012 | Hatano | |
| 2012/0228687 A1 | 9/2012 | Noda | |
| 2013/0083588 A1 | 4/2013 | Takemura | |
| 2013/0320344 A1 | 12/2013 | Kim et al. | |
| 2015/0037934 A1 | 2/2015 | Yamazaki | |
| 2015/0132944 A1 | 5/2015 | Park | |
| 2015/0206978 A1 | 7/2015 | Miki et al. | |
| 2015/0311256 A1 | 10/2015 | Rabkin et al. | |
| 2015/0357343 A1 | 12/2015 | Ishida et al. | |
| 2016/0336068 A1 | 11/2016 | Yamazaki et al. | |
| 2017/0077308 A1 | 3/2017 | Yamazaki et al. | |
| 2017/0179026 A1* | 6/2017 | Toyama | H01L 21/76802 |
| 2017/0221910 A1 | 8/2017 | Chen et al. | |
| 2017/0236848 A1 | 8/2017 | Yamazaki | |
| 2017/0337884 A1 | 11/2017 | Kurokawa | |
| 2017/0345940 A1 | 11/2017 | Suzuki et al. | |
| 2018/0130823 A1 | 5/2018 | Kim | |
| 2018/0145180 A1 | 5/2018 | Koezuka et al. | |
| 2018/0151583 A1 | 5/2018 | Lupino et al. | |
| 2018/0151588 A1 | 5/2018 | Tsutsumi et al. | |
| 2018/0269210 A1 | 9/2018 | Tezuka et al. | |
| 2018/0315794 A1 | 11/2018 | Kamalanathan et al. | |
| 2018/0350837 A1 | 12/2018 | Yoo et al. | |
| 2019/0074286 A1 | 3/2019 | Singh et al. | |
| 2019/0148393 A1 | 5/2019 | Lue | |
| 2019/0259778 A1 | 8/2019 | Yoo | |
| 2019/0326308 A1* | 10/2019 | Pu | H01L 27/0688 |
| 2019/0393353 A1 | 12/2019 | Jeong et al. | |
| 2020/0018541 A1 | 1/2020 | Villanueva et al. | |
| 2020/0075631 A1 | 3/2020 | Dong et al. | |
| 2020/0091171 A1 | 3/2020 | Tokuhira et al. | |
| 2020/0098776 A1 | 3/2020 | Sugisaka et al. | |
| 2020/0105635 A1 | 4/2020 | Yu et al. | |
| 2020/0185411 A1 | 6/2020 | Herner et al. | |
| 2020/0212068 A1* | 7/2020 | Lee | H01L 29/41741 |
| 2020/0227727 A1 | 7/2020 | Li | |
| 2021/0066348 A1 | 3/2021 | Prasad et al. | |
| 2021/0074727 A1 | 3/2021 | Prasad et al. | |
| 2021/0082955 A1 | 3/2021 | Rajashekhar et al. | |
| 2021/0174856 A1 | 6/2021 | Chen et al. | |
| 2021/0175253 A1 | 6/2021 | Han et al. | |
| 2021/0327890 A1 | 10/2021 | Makala et al. | |

FOREIGN PATENT DOCUMENTS

| | | | |
|---|---|---|---|
| KR | 20180059271 A | 6/2018 | |
| KR | 20190036077 A | 4/2019 | |
| KR | 20190105174 A | 9/2019 | |
| KR | 20200000664 A | 1/2020 | |
| TW | 201244065 A | 11/2012 | |
| TW | 201517236 A | 5/2015 | |
| TW | 201631627 A | 9/2016 | |
| TW | 201703264 A | 1/2017 | |
| TW | 201727836 A | 8/2017 | |
| TW | 201804615 A | 2/2018 | |
| TW | 201830586 A | 8/2018 | |
| TW | 201843811 A | 12/2018 | |
| TW | 201904029 A | 1/2019 | |
| TW | 201913577 A | 8/2019 | |
| TW | I673831 B | 10/2019 | |
| TW | 201942980 A | 11/2019 | |
| TW | 202010102 A | 3/2020 | |
| TW | 202013684 A | 4/2020 | |
| WO | 0209191 A2 | 1/2002 | |
| WO | 2018004581 A1 | 1/2018 | |
| WO | 2018136734 A1 | 7/2018 | |
| WO | 2019125352 A1 | 6/2019 | |
| WO | 2019152226 A1 | 8/2019 | |

OTHER PUBLICATIONS

Wei, et al., Chemical solution deposition of ferroelectric Sr:HfO2 film from inorganic salt precursors Journal of Alloys and Compounds, 731 (2018), China, available online Sep. 25, 2017, pp. 546-553.

* cited by examiner

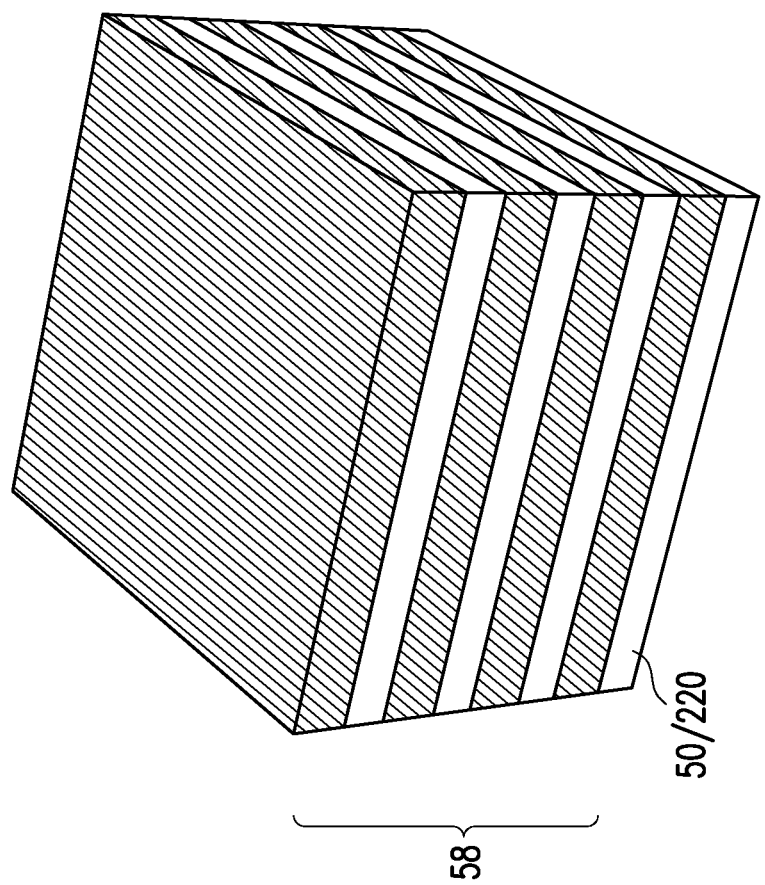

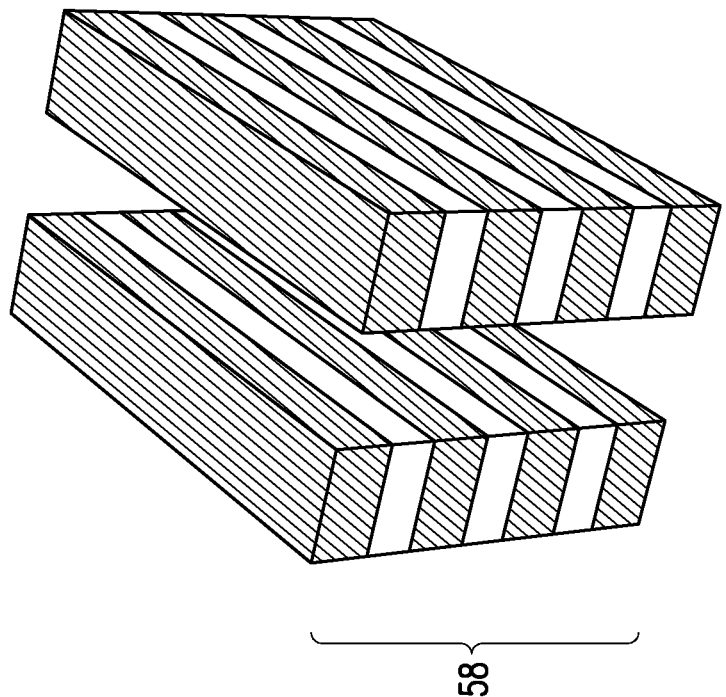

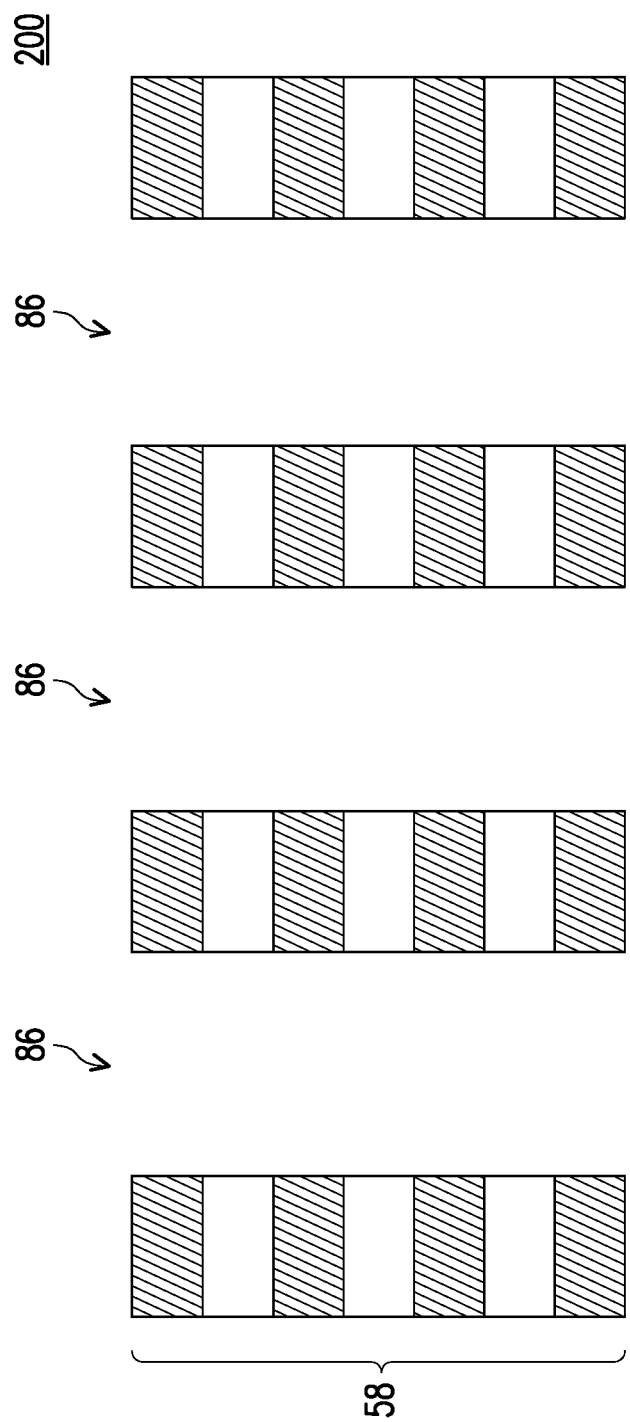

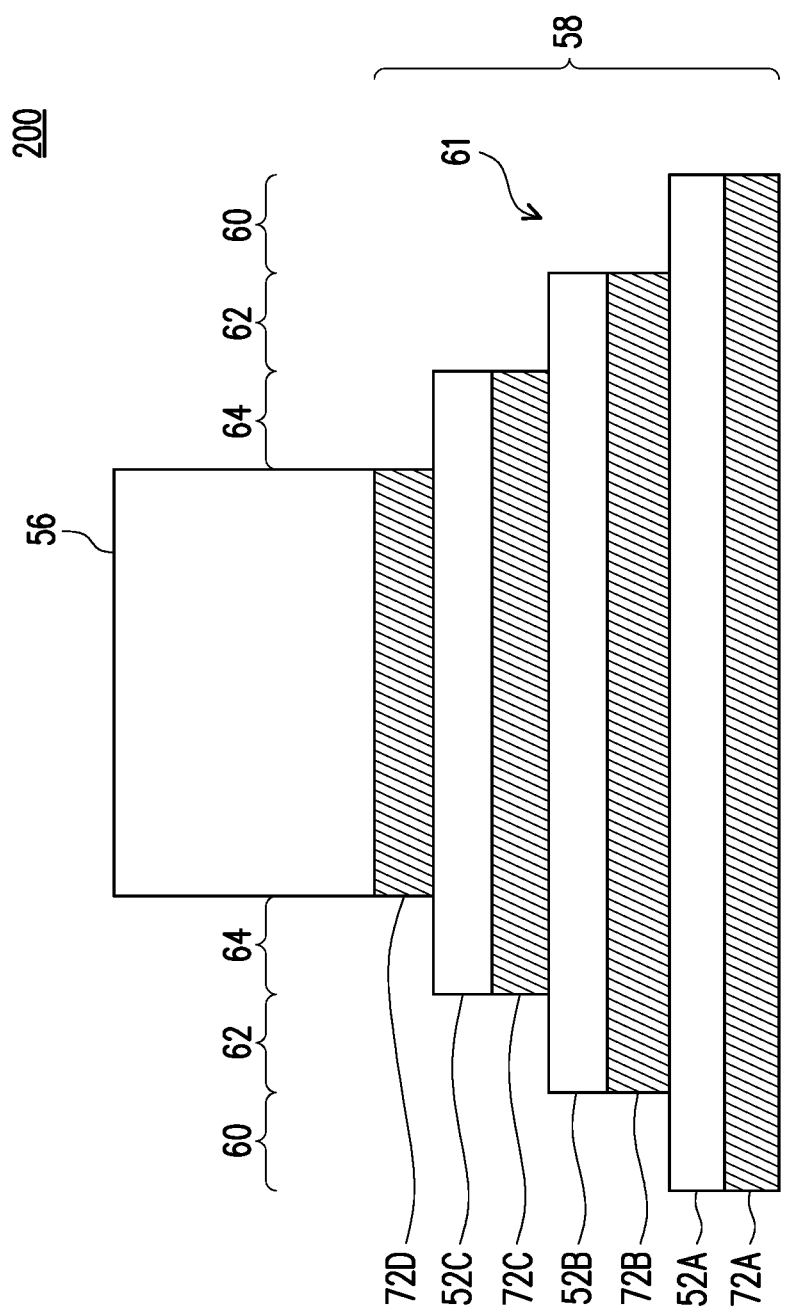

| Dopant | Hf | Si | Al | Zr | Ce | Y | Gd | La | Sr |
|---|---|---|---|---|---|---|---|---|---|
| Ionic Radius (pm) | 85 | 54 | 67.5 | 86 | 102 | 104 | 108 | 117 | 132 |
| Preferred Phase | - | t | t | t | t/c | t/c | t/c | t/c | t/c |

MEMORY ARRAY GATE STRUCTURES

PRIORITY CLAIM AND CROSS-REFERENCE

This application claims the benefit of U.S. Provisional Application No. 63/031,730, filed on May 29, 2020, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4, 5, 6, 7, 8A, 8B, 9A, 9B, 9C, 9E, 9F, 9G, 10A, 10B, 11, 12, 13, 14A, 14B, 14C, 15A, 15B, 15C, 16A, 16B, 16C, 17A, 17B, 17C, 18A, 18B, 18C, 19, 20, 21, 22, 23, 24, 25, 26A, 26B, 27, 28A, 28B, 28C, and 28D illustrate varying views of manufacturing a memory array in accordance with some embodiments.

FIG. 32 illustrates a table of ionic radius and preferred phases of various elements.

DETAILED DESCRIPTION

Figure 1A:
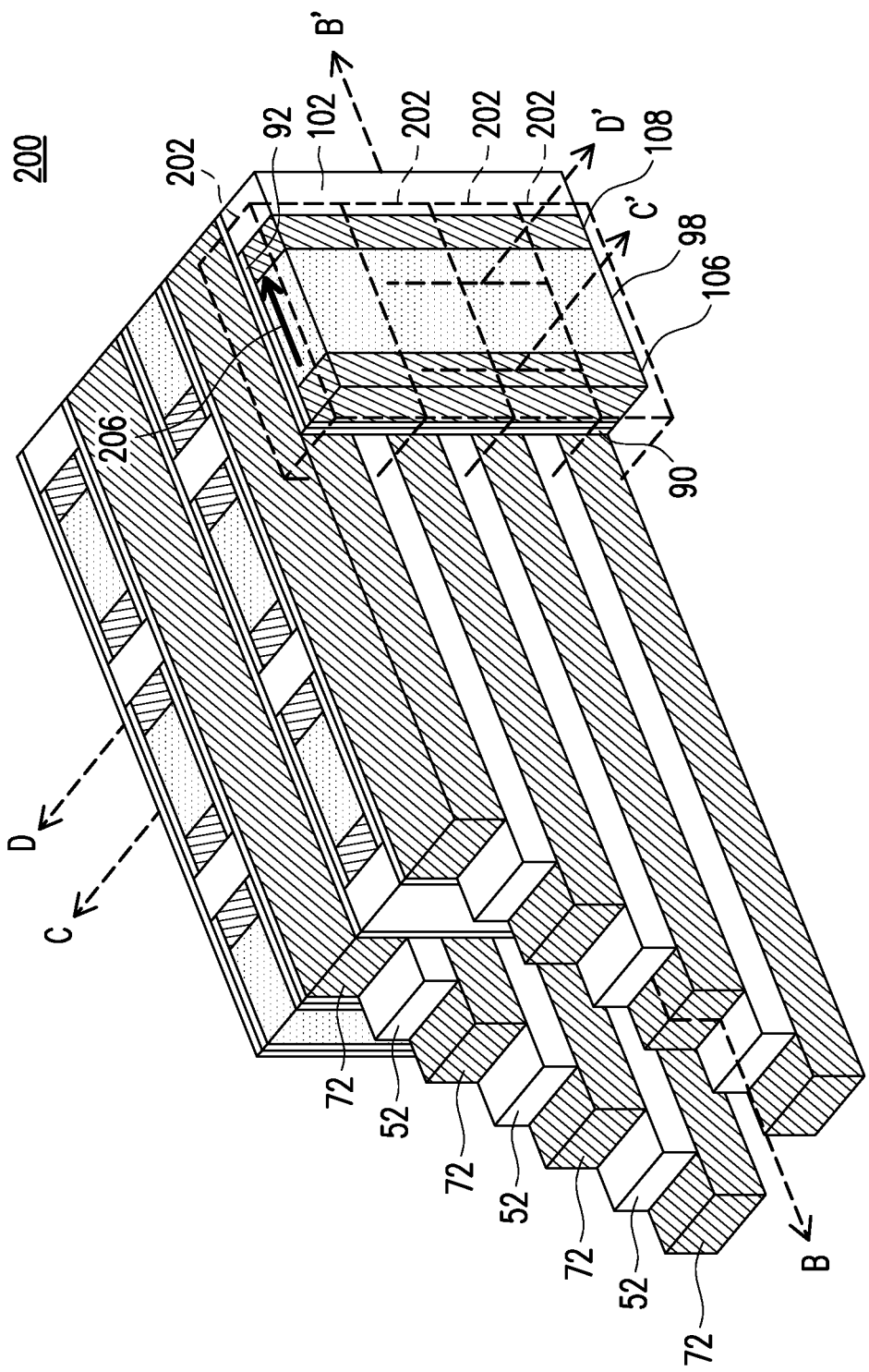
FIGS. 1A, 1B, and 1C illustrate a perspective view, a circuit diagram, and a top down view of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array with a plurality of vertically stacked memory cells. Each memory cell includes thin film transistor (TFT) having a word line region acting as a gate electrode, a bit line region acting as a first source/drain electrode, and a source line region acting as a second source/drain electrode. Each TFT further includes a ferroelectric (FE) material (e.g., as a gate dielectric layer) and an oxide semiconductor (OS) channel region.

Figure 1B:
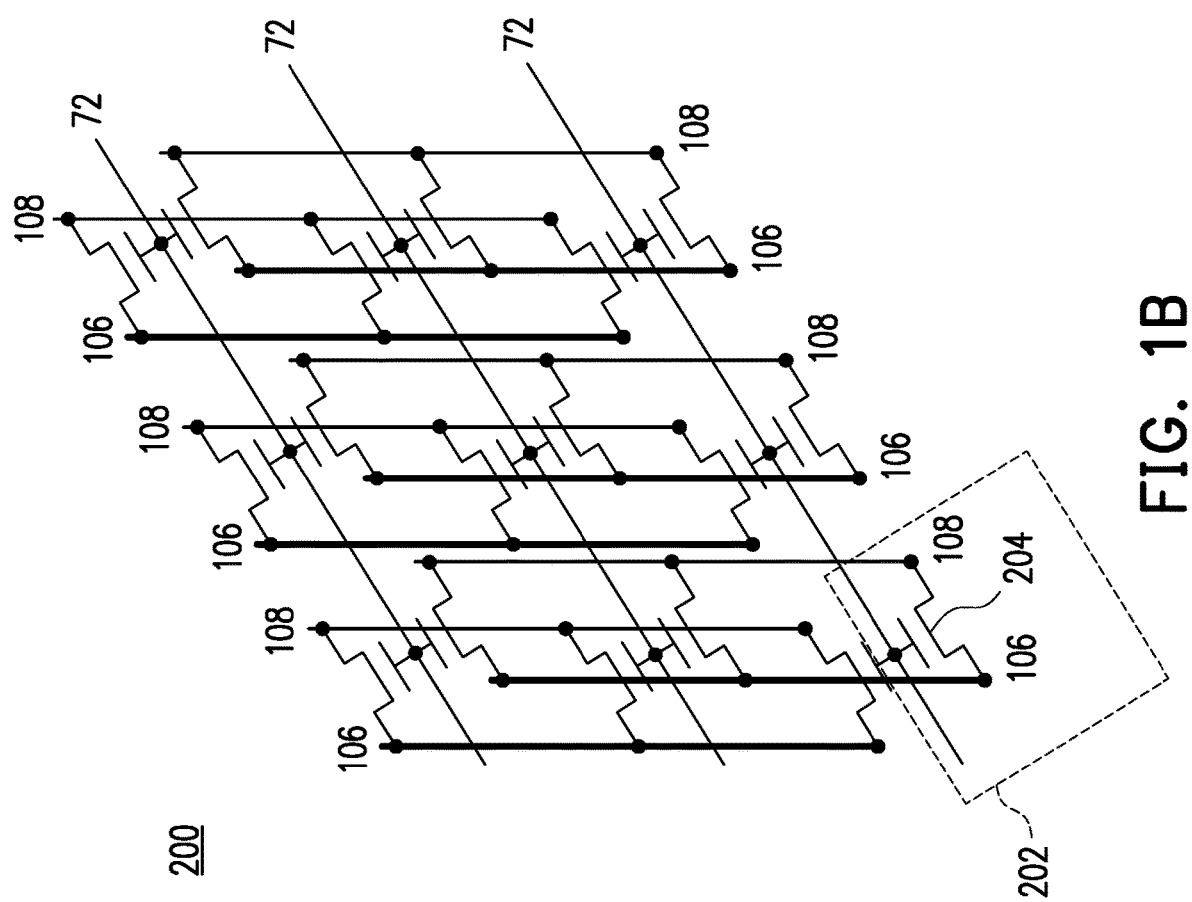
Figure 1C:
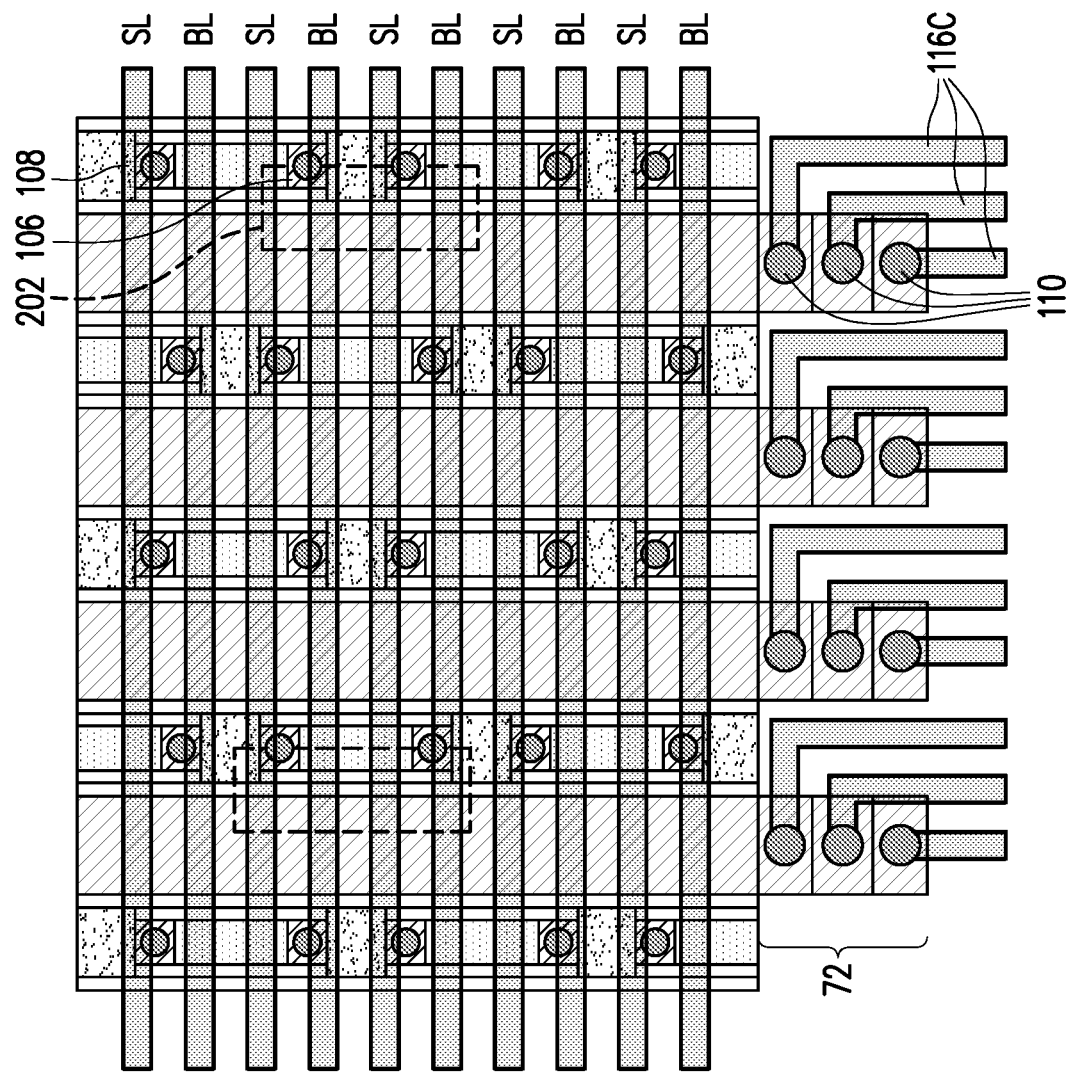

FIGS. 1A, 1B, and 1C illustrate examples of a memory array according to some embodiments. FIG. 1A illustrates an example of a portion of the memory array 200 in a three-dimensional view; FIG. 1B illustrates a circuit diagram of the memory array 200; and FIG. 1C illustrates a top down view of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as, above one or more active devices (e.g., transistors) formed on a semiconductor substrate.

In some embodiments, the memory array 200 is a flash memory array, such as a NOR flash memory array, or the like. Each memory cell 202 may include a thin film transistor (TFT) 204 with a ferroelectric (FE) material 90 as a gate dielectric. In some embodiments, a gate of each TFT 204 is electrically coupled to a respective word line (e.g., conductive line 72), a first source/drain region of each TFT 204 is electrically coupled to a respective bit line (e.g., conductive line 106), and a second source/drain region of each TFT 204 is electrically coupled to a respective source line (e.g., conductive line 108), which electrically couples the second source/drain region to ground. The memory cells 202 in a same horizontal row of the memory array 200 may share a common word line while the memory cells in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest.

Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72. For example, conductive lines 116C may be connected to the exposed portion of each of the conductive lines 72 by a conductive contacts no (see also FIG. 28A-28D).

The memory array 200 further includes a plurality of conductive lines 106 (e.g., bit lines (BLs) connected to overlying BLs, see also FIGS. 28A-28D) and conductive lines 108 (e.g., source lines (SLs) connected to overlying SLs, see also FIGS. 28A-28D). The conductive lines 106 and 108 may each extend in a direction perpendicular to the conductive lines 72. A dielectric material 98 is disposed between and isolates adjacent ones of the conductive lines 106 and the conductive lines 108. Pairs of the conductive lines 106 and 108 along with an intersecting conductive line 72 define boundaries of each memory cell 202, and a dielectric material 102 is disposed between and isolates adjacent pairs of the conductive lines 106 and 108. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

The memory array 200 may also include an oxide semiconductor (OS) layer 92. The OS layer 92 may provide channel regions for the TFTs 204 of the memory cells 202. For example, when an appropriate voltage (e.g., higher than a respective threshold voltage ($V_{th}$) of a corresponding TFT 204) is applied through a corresponding conductive line 72, a region of the OS layer 92 that intersects the conductive line 72 may allow current to flow from the conductive lines 106 to the conductive lines 108 (e.g., in the direction indicated by arrow 206).

An FE material 90 is disposed between the conductive lines 72 and the OS layer 92, and the FE material 90 may provide gate dielectrics for the TFTs 204. Accordingly, the memory array 200 may also be referred to as a ferroelectric random access memory (FERAM) array. In some embodiments, the FE material 90 may be a hafnium-based compound that comprises a rare earth metal. The rare earth metal may have an ionic radius larger than hafnium. For example, the rare earth metal may be lanthanum, yttrium, gadolinium, cerium, strontium, or the like. The inclusion of the rare earth metal may allow for the FE material 90 to achieve an orthorhombic crystalline structure with a relatively low-temperature annealing process (e.g., at about 400° C. or less). For example, the rare earth dopants in the FE material 90 may enlarge the composition range of a stable orthorhombic phase of the FE layer 90. Thus, the FE layer 90 comprising an embodiment rare earth metal provides an improved low thermal budget, back end of line (BEOL) integration for the memory array 200. Further, by including a rare earth metal in the FE material 90, the intrinsic fatigue performance and endurance of the FE material 90 may be improved. For example, in experimental data, the endurance of the FE material 90 may be improved by at least ten times compared to a FE material without an embodiment rare earth metal, and the FE material 90 may allow for at least $10^8$ polarization cycles without significant degradation of the FE material 90. Accordingly, various embodiments improve reliability of the resulting device and manufacturing ease.

The FE material 90 may be polarized in one of two different directions, and the polarization direction may be changed by applying an appropriate voltage differential across the FE material 90 and generating an appropriate electric field. The polarization may be relatively localized (e.g., generally contained within each boundaries of the memory cells 202), and a continuous region of the FE material 90 may extend across a plurality of memory cells 202. Depending on a polarization direction of a particular region of the FE material 90, a threshold voltage of a corresponding TFT 204 varies, and a digital value (e.g., 0 or 1) can be stored. For example, when a region of the FE material 90 has a first electrical polarization direction, the corresponding TFT 204 may have a relatively low threshold voltage, and when the region of the FE material 90 has a second electrical polarization direction, the corresponding TFT 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202, a write voltage is applied across a portion of the FE material 90 corresponding to the memory cell 202. The write voltage can be applied, for example, by applying appropriate voltages to a corresponding conductive line 72 (e.g., the word line) and the corresponding conductive lines 106/108 (e.g., the bit line/source line). By applying the write voltage across the portion of the FE material 90, a polarization direction of the region of the FE material 90 can be changed. As a result, the corresponding threshold voltage of the corresponding TFT 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202, a read voltage (a voltage between the low and high threshold voltages) is applied to the corresponding conductive line 72 (e.g., the world line). Depending on the polarization direction of the corresponding region of the FE material 90, the TFT 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation.

FIG. 1A further illustrates reference cross-sections of the memory array 200 that are used in later figures. Cross-section B-B' is along a longitudinal axis of conductive lines 72 and in a direction, for example, parallel to the direction of current flow of the TFTs 204. Cross-section C-C' is perpendicular to cross-section B-B' and is parallel to a longitudinal axis of the conductive lines 72. Cross-section C-C' extends through the conductive lines 106. Cross-section D-D' is parallel to cross-section C-C' and extends through the dielectric material 102. Subsequent figures refer to these reference cross-sections for clarity.

FIGS. 2 through 28B are views of intermediate stages in the manufacturing of the memory array 200, in accordance with some embodiments. In FIGS. 2 through 8B the multi-layer stack 58 is formed and trenches are formed in the multi-layer stack 58, thereby defining the conductive lines 72, in accordance with some embodiments. The conductive lines 72 may correspond to word lines in the memory array 200, and the conductive lines 72 may further provide gate electrodes for the resulting TFTs of the memory array 200. FIGS. 3A and 8A are illustrated in a three-dimensional view. FIGS. 2, 3B, 4, 5, 6, 7, and 8B are illustrated along reference cross-section C-C' illustrated in FIG. 1A.

Figure 2:
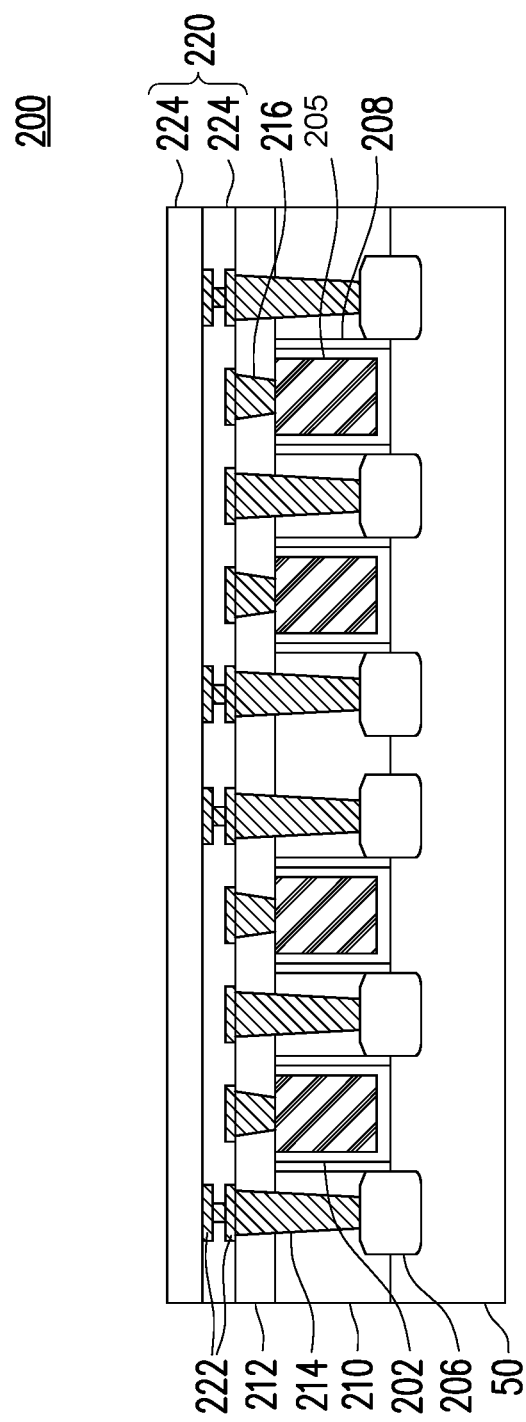
Figure 3B:
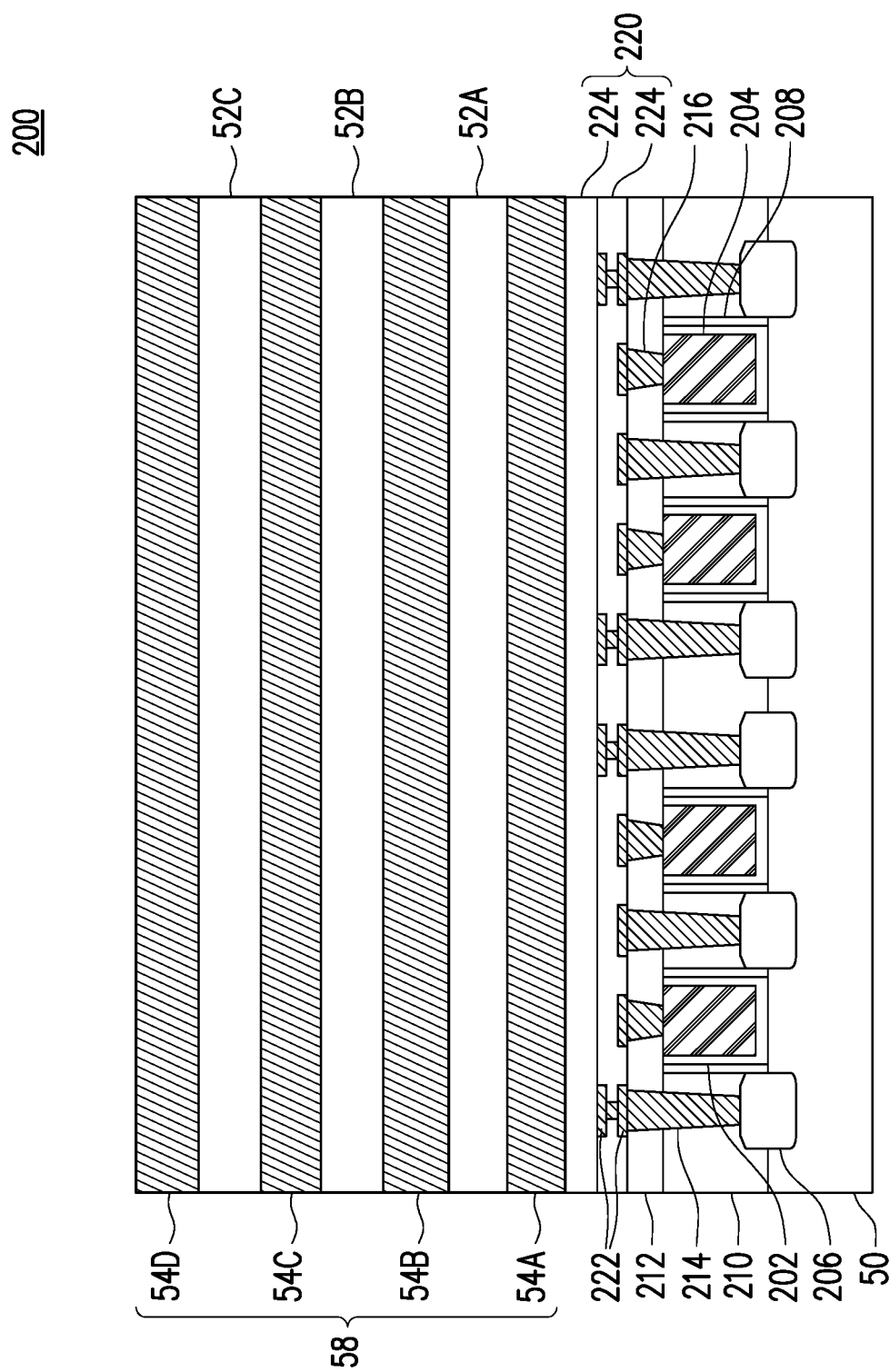

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 202 over top surfaces of the substrate 50 and gate electrodes 205 over the gate dielectric layers 202. Source/drain regions 206 are disposed in the substrate 50 on opposite sides of the gate dielectric layers 202 and the gate electrodes 205. Gate spacers 208 are formed along sidewalls of the gate dielectric layers 202 and separate the source/drain regions 206 from the gate electrodes 205 by appropriate lateral distances. In some embodiments, the transistors may be planar field effect transistors (FETs), fin field effect transistors (finFETs), nano-field effect transistors (nanoFETs), or the like.

A first ILD 210 surrounds and isolates the source/drain regions 206, the gate dielectric layers 202, and the gate electrodes 205 and a second ILD 212 is over the first ILD 210. Source/drain contacts 214 extend through the second ILD 212 and the first ILD 210 and are electrically coupled to the source/drain regions 206 and gate contacts 216 extend through the second ILD 212 and are electrically coupled to the gate electrodes 205. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 200 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

In FIGS. 3A and 3B, a multi-layer stack 58 is formed over the structure of FIG. 2. The substrate 50, the transistors, the ILDs, and the interconnect structure 220 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of conductive lines 72A-D (collectively referred to as conductive layers 54) and dielectric layers 52A-C (collectively referred to as dielectric layers 52). The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and dielectric layers 52.

Figure 4:
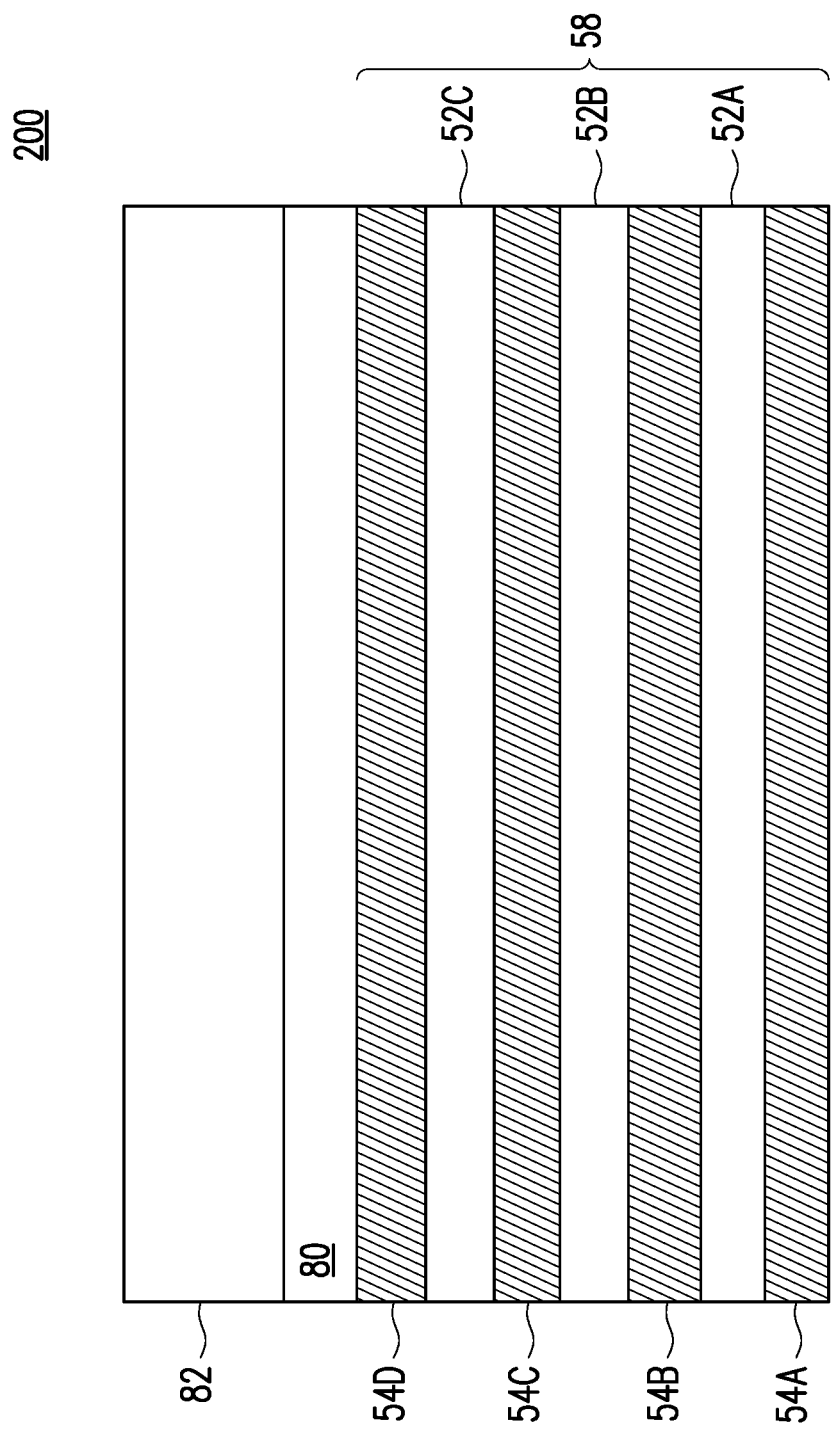

In FIG. 4 a hard mask 80 and a photoresist 82 are deposited over the multi-layer stack 58. The hard mask layer 80 may include, for example, silicon nitride, silicon oxynitride, or the like, which may be deposited by CVD, PVD, ALD, PECVD, or the like. The photoresist 82 can be formed by using a spin-on technique, for example.

Figure 5:
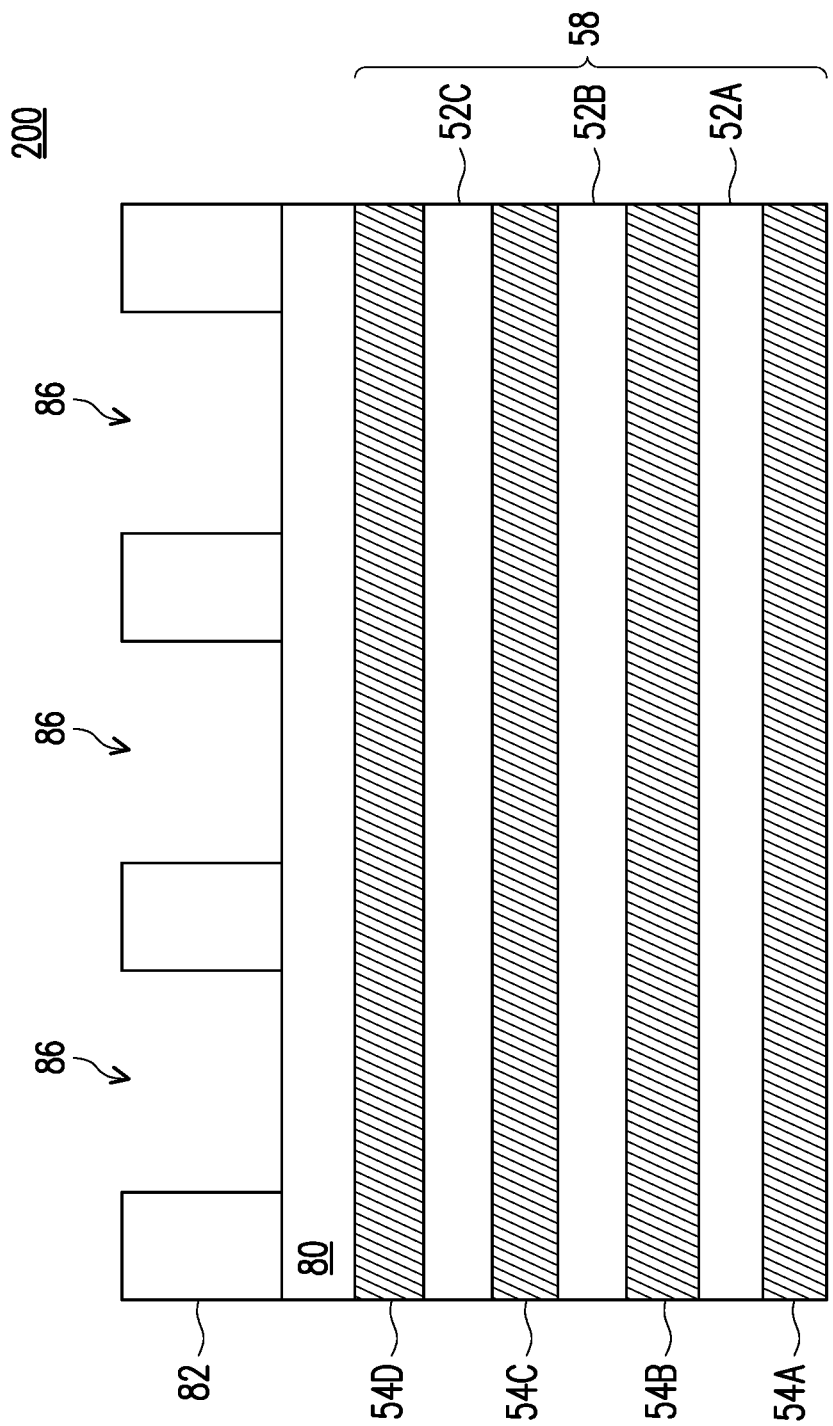

In FIG. 5, the photoresist 82 is patterned to form trenches 86. The photoresists can be patterned using acceptable photolithography techniques. For example, the photoresist 82 be exposed to light for patterning. After the exposure process, the photoresist 82 may be developed to remove exposed or unexposed portions of the photo resist depending on whether a negative or positive resist is used, thereby defining a patterning of the form trenches 86.

Figure 6:
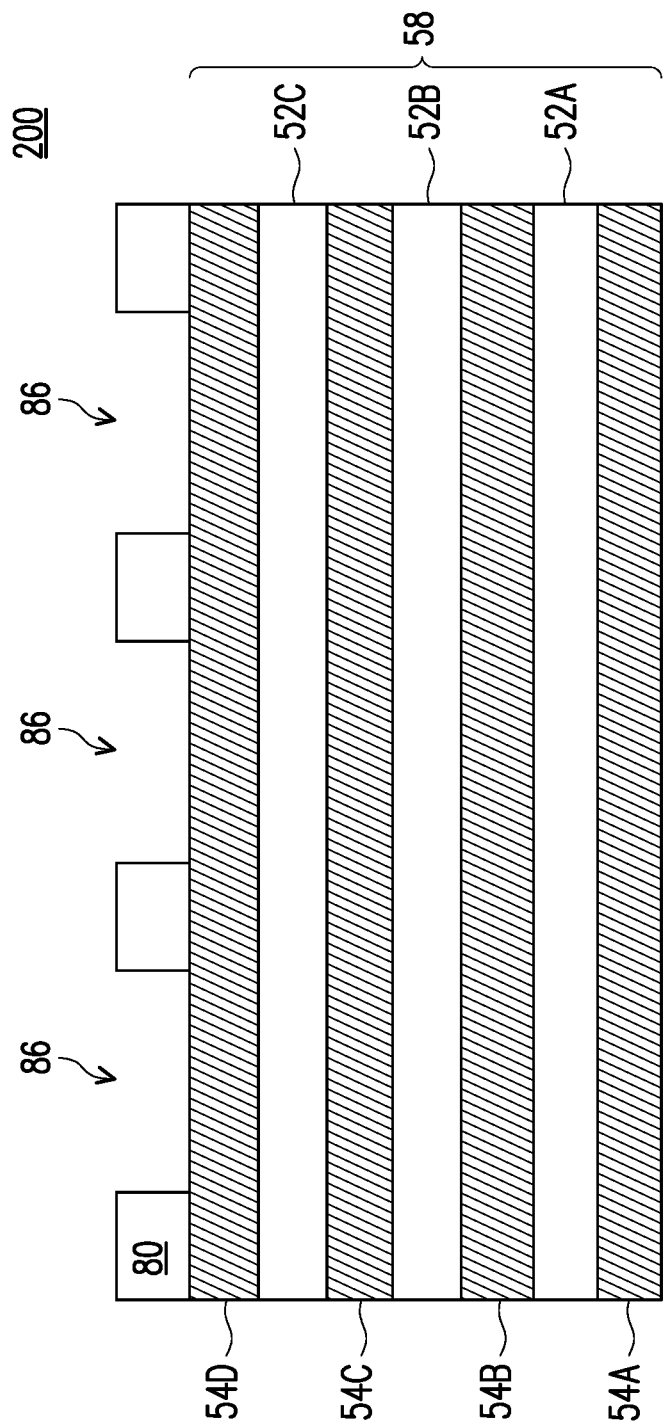

In FIG. 6, a pattern of the photoresist 82 is transferred to the hard mask 84 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 84. The photoresist 82 may be removed by an ashing process, for example.

Figure 7:
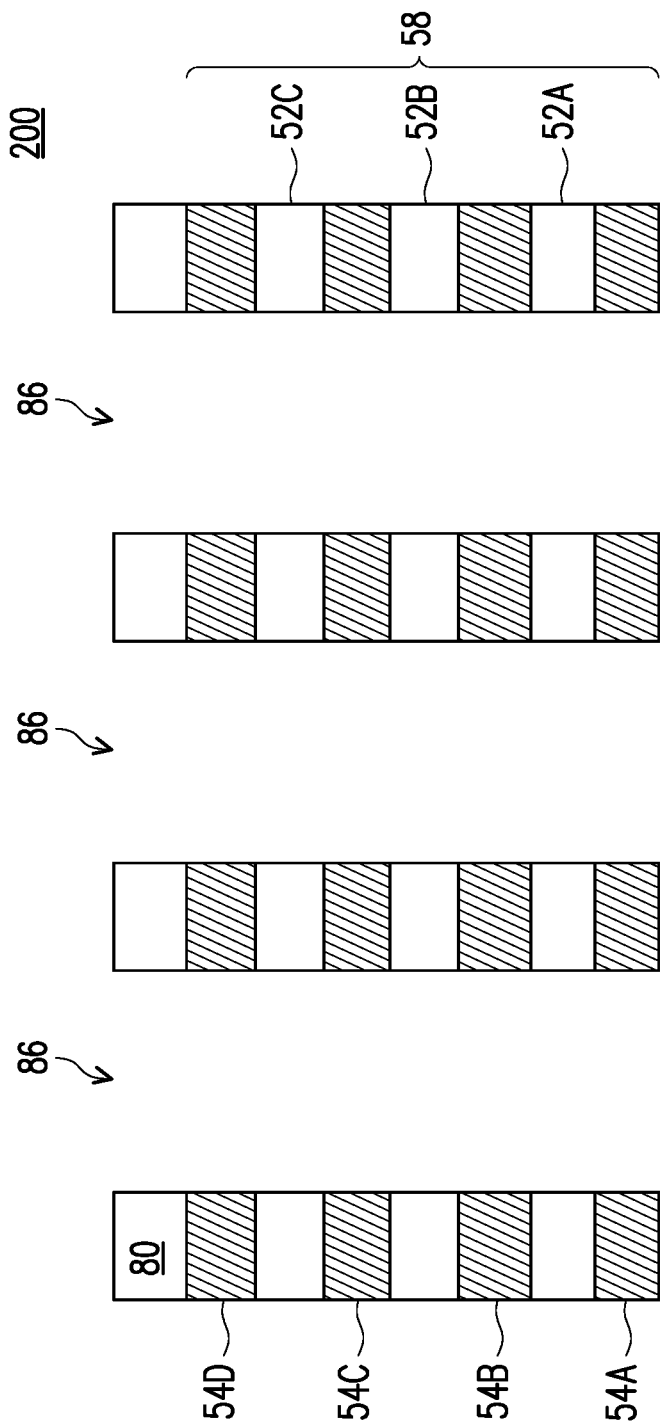

In FIG. 7, a pattern of the hard mask 84 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other. Subsequently, in FIGS. 8A and 8B, the hard mask 84 may then be removed by an acceptable process, such as a wet etching process, a dry etching process, a planarization process, combinations thereof, or the like.

Figure 9A:
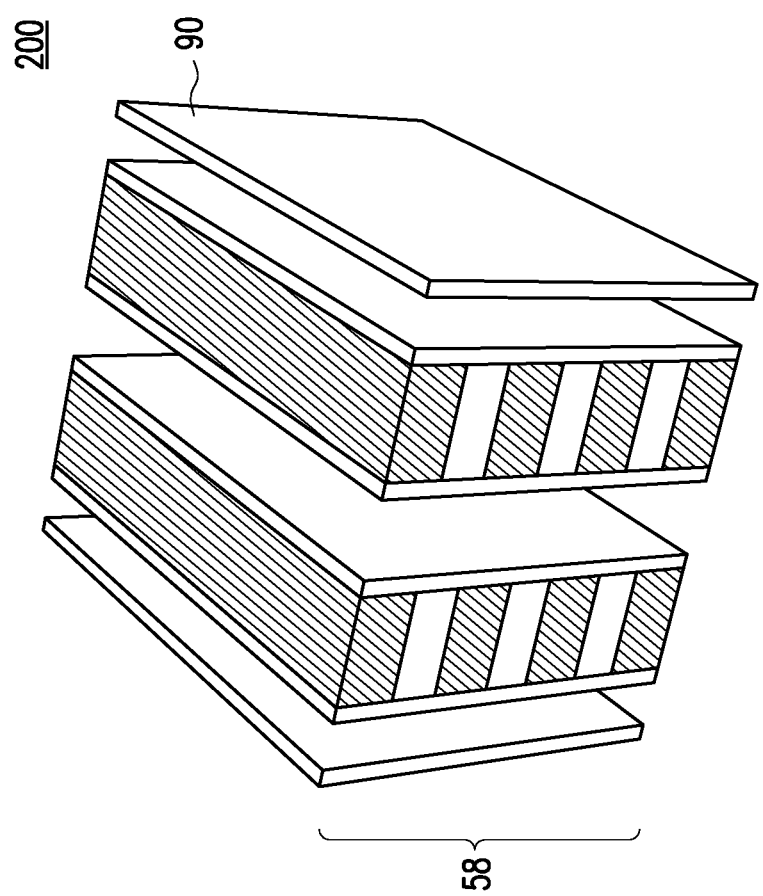
Figure 12:
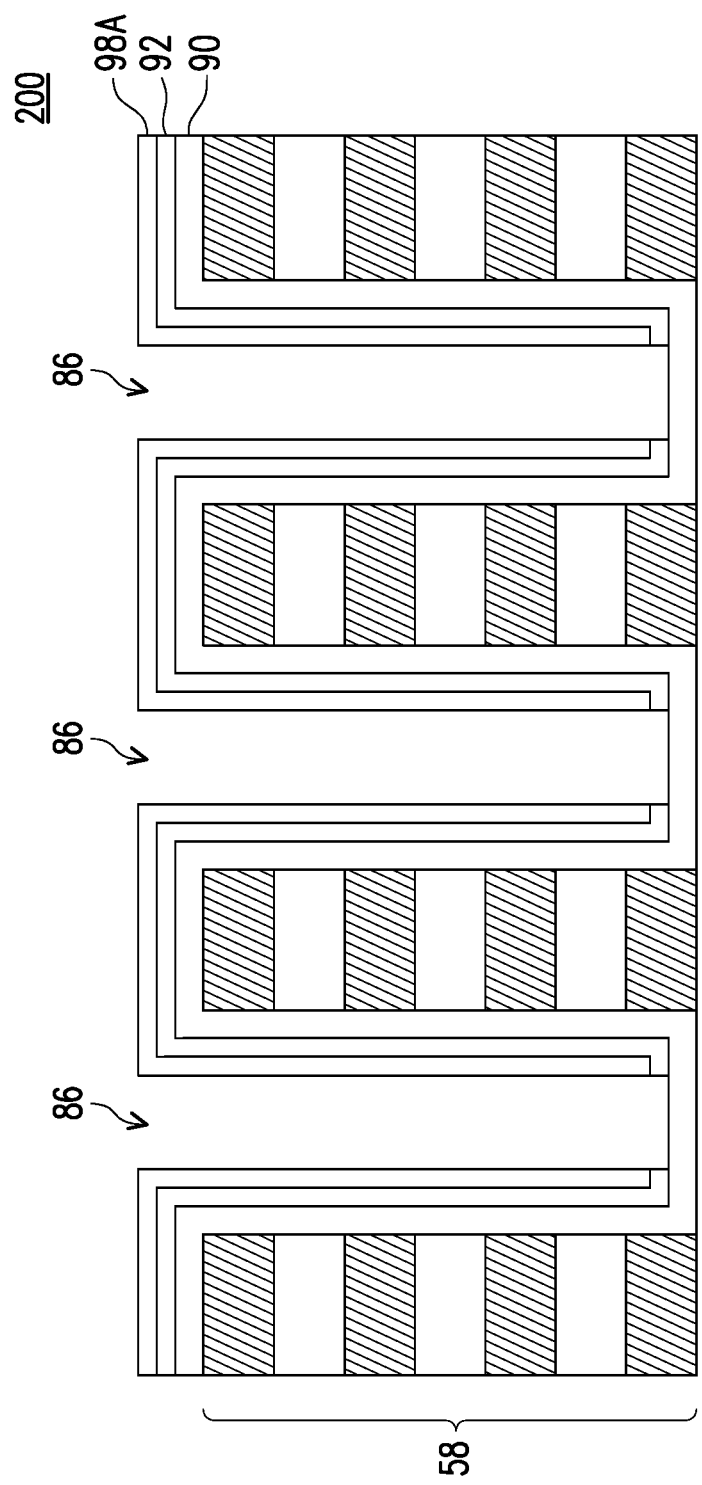
Figure 13:
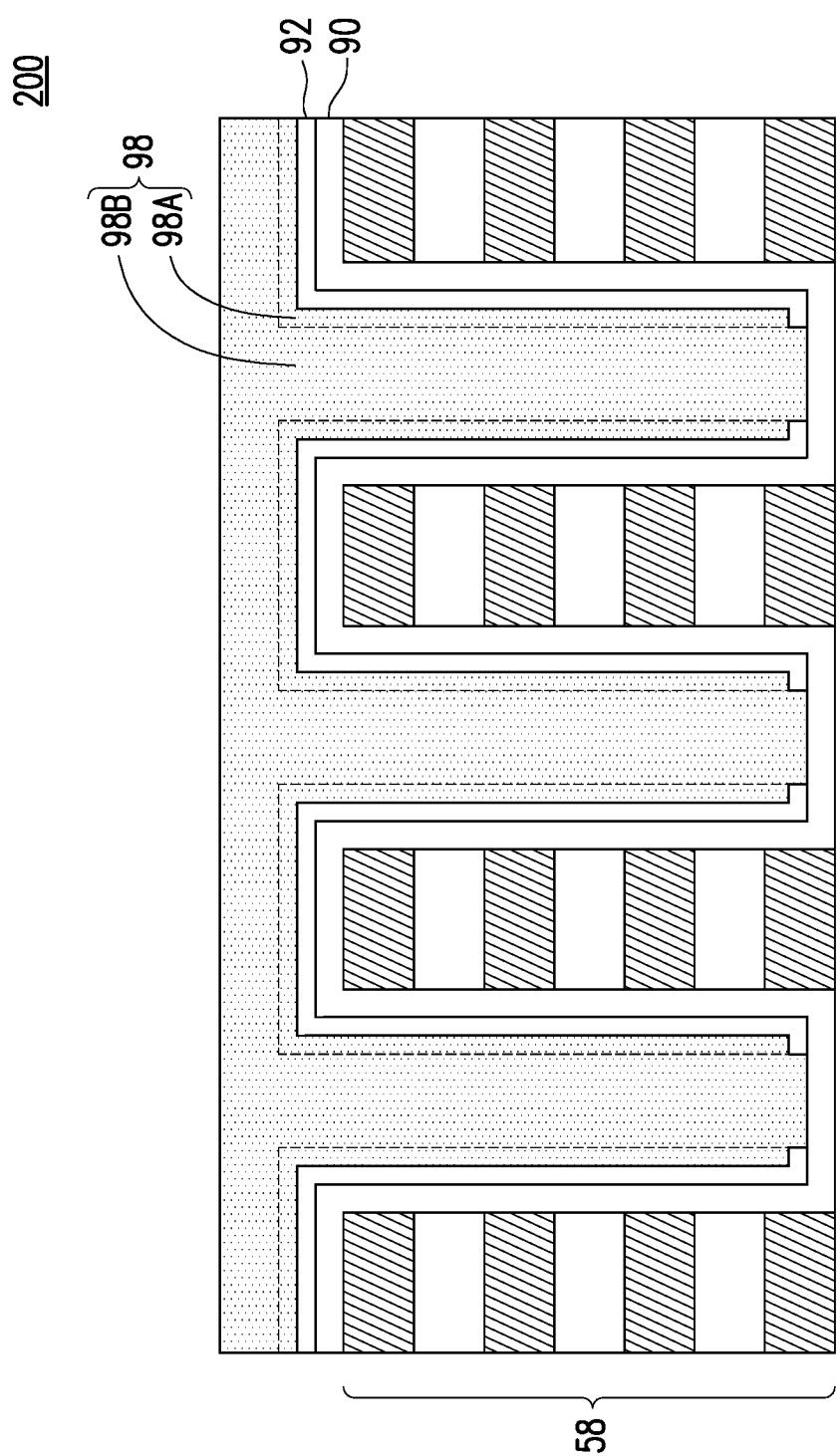
Figure 14A:
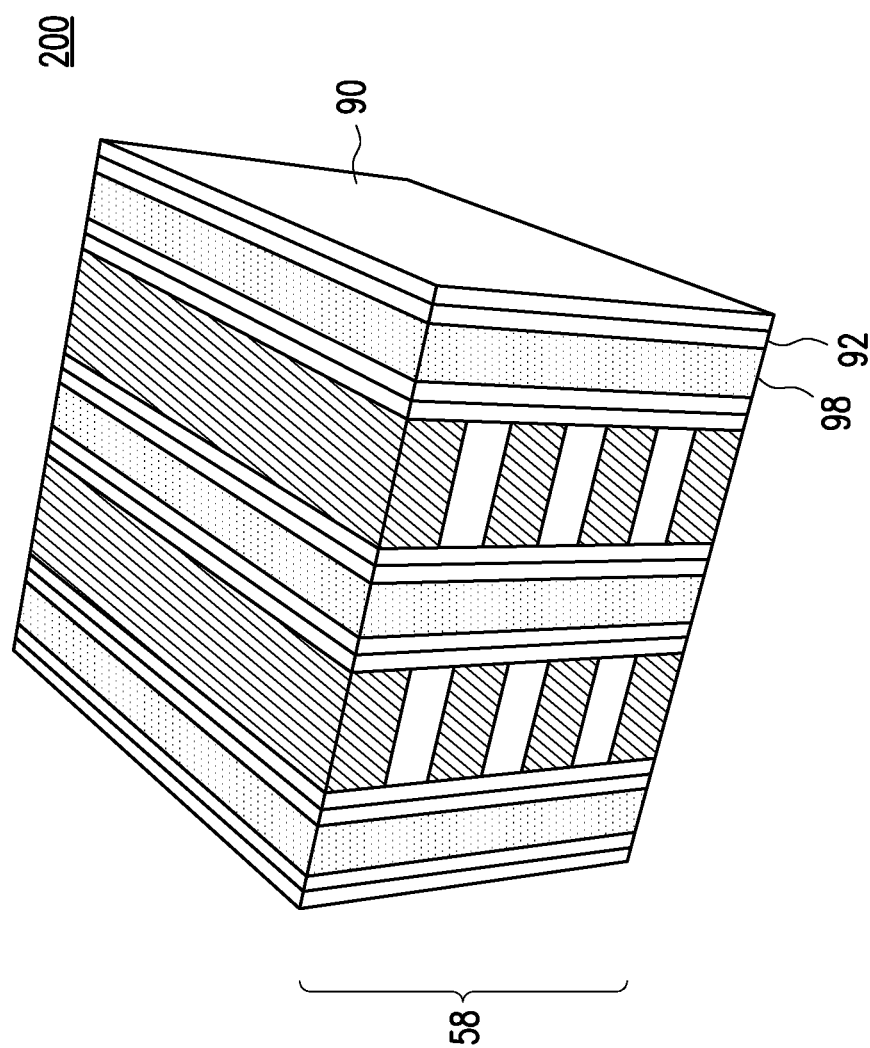
Figure 14B:
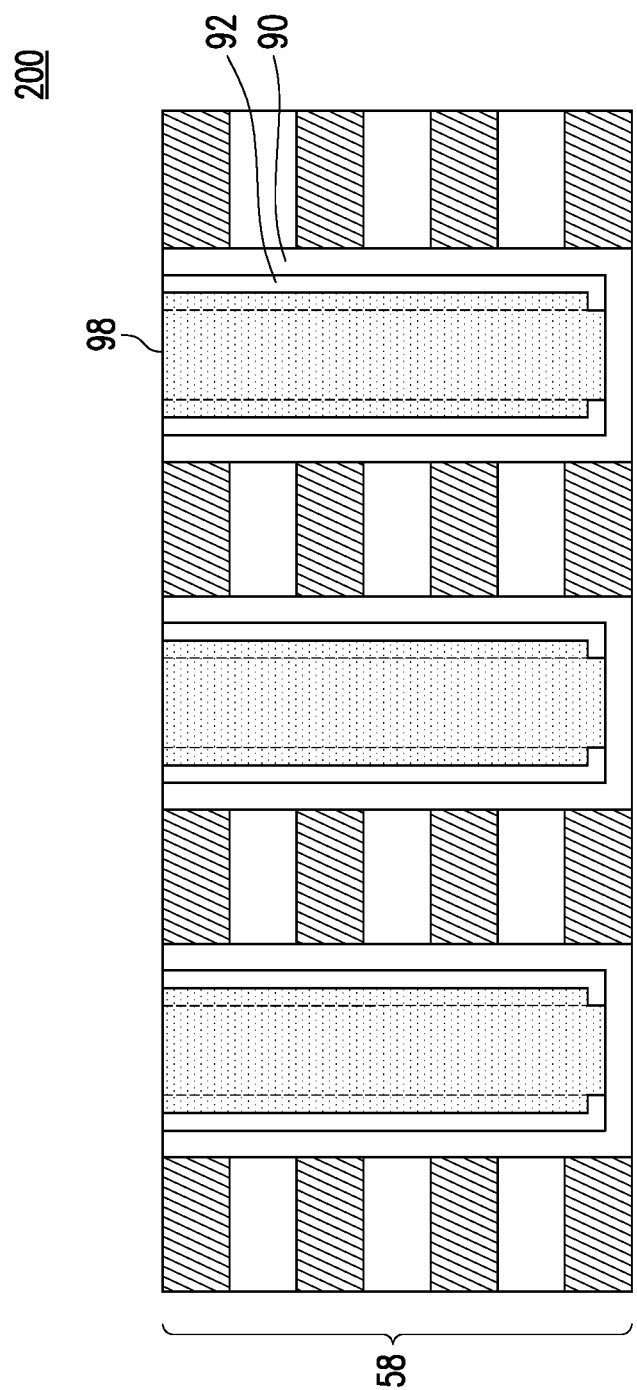
Figure 14C:

FIGS. 9A through 14C illustrate forming and patterning channel regions for the TFTs 204 (see FIG. 1B) in the trenches 86. FIGS. 9A, 10A, and 14A are illustrated in a three-dimensional view. In FIGS. 9B, 9C, 9D, 10B, 11, 12, 13, and 14B cross-sectional views are provided along line C-C' of FIG. 1A. FIG. 14C illustrates a corresponding top-down view of the TFT structure.

Figure 9B:
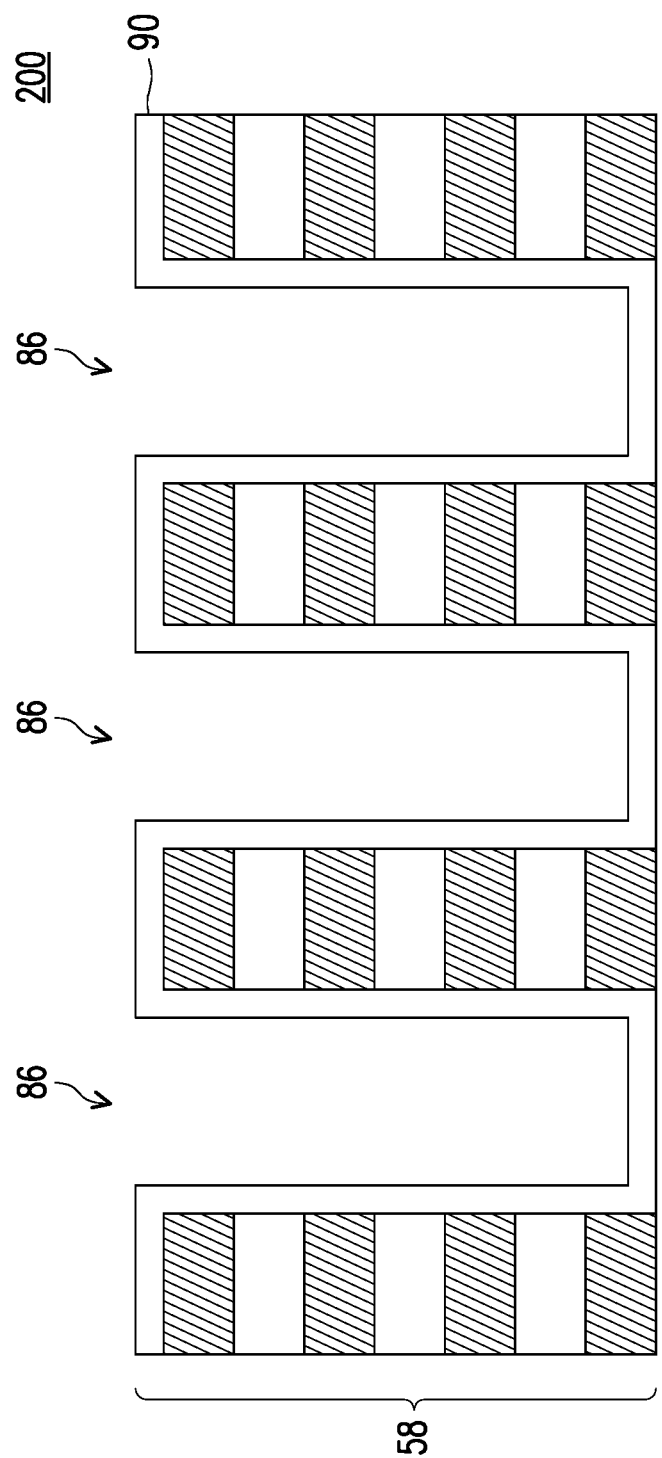

In FIGS. 9A and 9B, a FE material 90 is conformally deposited in the trenches 86. The FE material 90 may have a material that is capable of switching between two different polarization directions by applying an appropriate voltage differential across the FE material 90. For example, the polarization of the FE material 90 may change due to an electric field resulting from applying the voltage differential.

Figure 33:
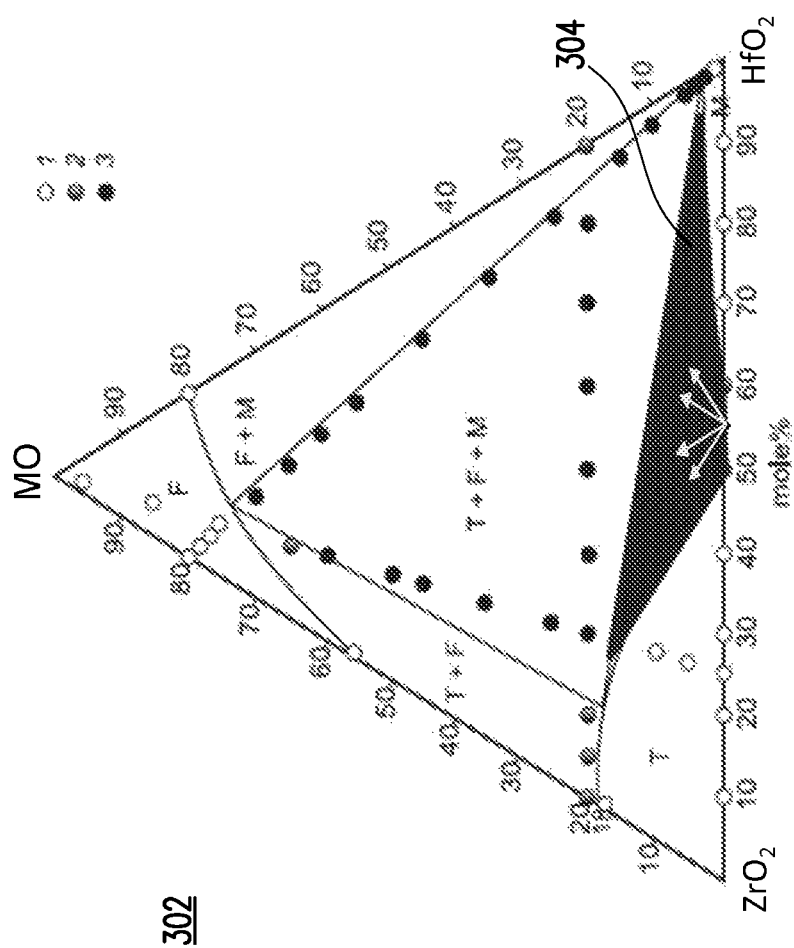
FIG. 33 illustrates a phase diagram for an embodiment hafnium-comprising compound.

For example, the FE material 90 may be a high-k dielectric material, such as a hafnium (Hf) based dielectric material, or the like. In some embodiments, the FE material 90 is a hafnium-comprising compound, such as hafnium zirconium oxide (HfZnO), hafnium aluminum oxide (HfAlO), hafnium lanthanum oxide (HfLaO), hafnium cerium oxide (HfCeO), hafnium oxide (HfO), hafnium gadolinium oxide (HfGdO), hafnium silicon oxide (HfSiO), hafnium zirconium lanthanum oxide (HfZrLaO), hafnium zirconium gadolinium oxide (HfZrGdO), hafnium zirconium yttrium oxide (HfZrYO), hafnium zirconium cerium oxide (HfZrCeO), hafnium zirconium strontium oxide (HfZrSrO), or the like. For example, the hafnium-comprising compound may further comprise a rare earth metal, such as a rare earth metal with an ionic radius greater than hafnium. In some embodiments, the rare earth metal may be cerium (Ce), yttrium (Y), gadolinium (Gd), lanthanum, (La), strontium (Sr), or the like. FIG. 32 provides a table 300 showing ionic radiuses of various elements and a corresponding preferred phase (e.g., tetragonal (t) or tetragonal/cubic (t/c)) of each of the elements. As illustrated, rare earth metals with a higher ionic radius than hafnium may have a preferred phase that is tetragonal and cubic (t/c). By including these rare earth metals with a preferred t/c phase in the hafnium-comprising compound of the FE material 90, an orthorhombic lattice structure can be achieved in the FE material 90 at a relatively low annealing temperature (e.g., at temperatures of about 400° C. or less). For example, FIG. 33 illustrates a phase diagram 302 of hafnium dioxide ($HfO_2$), zirconium dioxide ($ZrO_2$), and a rare earth metal oxide (MO). In FIG. 33, the composition range 304 of the orthorhombic phase is relatively large and may be larger than an orthorhombic composition range of a hafnium-based compound without an embodiment rare earth metal. By including a rare earth metal, an orthorhombic lattice structure in the FE material 90 may be achieved relatively easily (e.g., at a lower temperature), and the FE material 90 may be formed within the relatively low thermal budget of BEOL processes (e.g., at a temperature that does not damage front end of line (FEOL) features, such as active devices formed on the substrate 50).

Figure 9C:
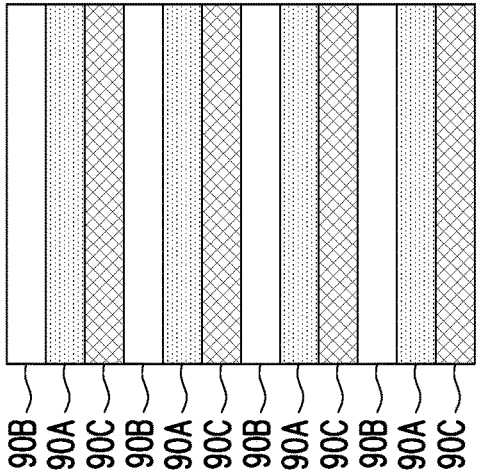
Figure 9D:
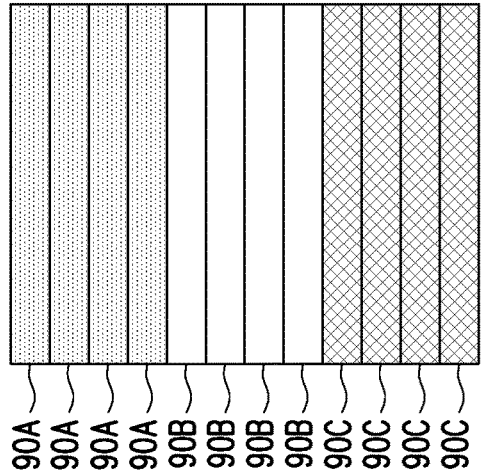
Figure 9E:
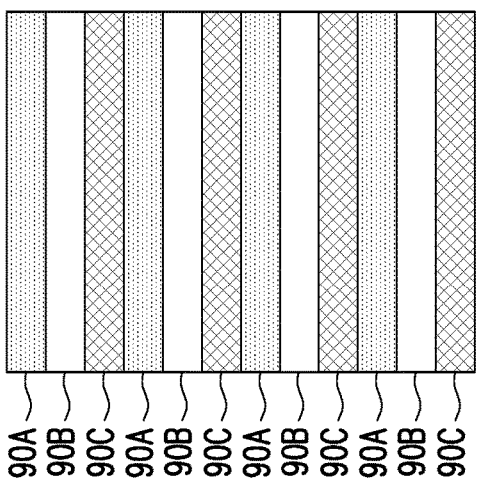
Figure 9F:
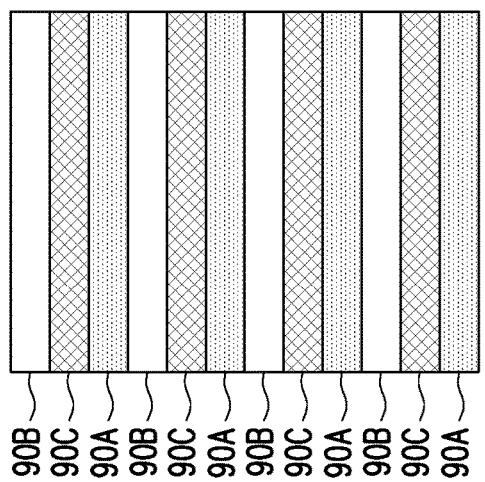

The FE material 90 is formed using an ALD process in some embodiments. FIGS. 9C, 9C, 9E, and 9F illustrate detailed views of the FE material 90 during the ALD process according to some embodiments. The ALD process may include forming a plurality of monolayers 90A-C with each monolayer being a one molecule thick. The monolayer 90A may be a monolayer of a rare earth metal oxide, such as an oxide of a rare earth metal with a greater ionic radius than hafnium. In some embodiments, the monolayer 90A is CeO, YO, GdO, LaO, SrO, or the like. The monolayer 90B may be a monolayer zirconium dioxide ($ZrO_2$) or the like, and the monolayer 90C may be a monolayer of hafnium dioxide ($HfO_2$) or the like. A material of each of the monolayers 90A, 90B, 90C may be formed by flowing one or more appropriate precursors into the ALD deposition chamber in the form trenches 86. For example, to form lanthanum oxide, $La(fAMD)_3$ or the like may be flowed as a precursor into the ALD chamber; to form yttrium oxide, $Y(CpBut)_3$ or the like may be flowed as a precursor into the ALD chamber; to form gadolinium oxide, $Gd(DPDMG)_3$ or the like may be flowed as a precursor into the ALD chamber; to form cerium oxide, $Ce(iPrCp)_2(N\text{-}iPr\text{-}amd)$ or the like may be flowed as a precursor into the ALD chamber; and to form yttrium oxide $Y(CpBut)_3$ or the like may be flowed as a precursor into the ALD chamber. Other precursors may be used in other embodiments.

The monolayers 90A, 90B, and 90C may be deposited in any suitable order. For example, FIG. 9C illustrates an embodiment where the monolayers 90A, 90B, and 90C are deposited with a repeating pattern of a monolayer 90C, a monolayer 90B deposited directly on the monolayer 90C, and a monolayer 90A deposited directly on the monolayer 90B. As another example, FIG. 9D illustrates an embodiment where the monolayers 90A, 90B, and 90C are deposited with a repeating pattern of a monolayer 90C, a monolayer 90A deposited directly on the monolayer 90C, and a monolayer 90B deposited directly on the monolayer 90A. As another example, FIG. 9E illustrates an embodiment where the monolayers 90A, 90B, and 90C are deposited with a repeating pattern of a monolayer 90A, a monolayer 90C deposited directly on the monolayer 90A, and a monolayer 90B deposited directly on the monolayer 90C. As yet another example, FIG. 9D illustrates an embodiment where a plurality of the monolayers 90C are formed, a plurality of the monolayers 90B are formed directly on the plurality of the monolayers 90C, and a plurality of the monolayers 90A are formed directly on the plurality of the monolayers 90B. FIGS. 9C through 9F illustrate a particular quantity and pattern of monolayers 90A, 90B, and 90C for illustrative purposes only. Other patterns and/or other quantities of the monolayers 90A, 90B, and 90C may be formed in other embodiments.

In some embodiments, a respective quantity of each of the monolayers 90A, 90B, and 90C may be selected so that the FE material 90 is within the composition range of its orthorhombic phase (e.g., range 304 of FIG. 33 in some embodiments). For example, a mole percentage of zirconium in the FE layer 90 may be in a range of about 40% to about 70%, and a mole percentage of the rare earth metal in the FE layer 90 maybe in a range of about 1% to about 10%. The mole percentage of elements in the FE layer 90 can be controlled by forming an appropriate quantity of each of the monolayers 90A, 90B, or 90C. By forming the FE material 90 with the above composition, the FE material 90 may have an orthorhombic lattice structure after annealing. It has been observed that when the quantities of various elements (e.g., zirconium and/or the rare earth metal) are outside the above ranges, the FE material 90 may not have an orthorhombic lattice structure after annealing.

Figure 9G:
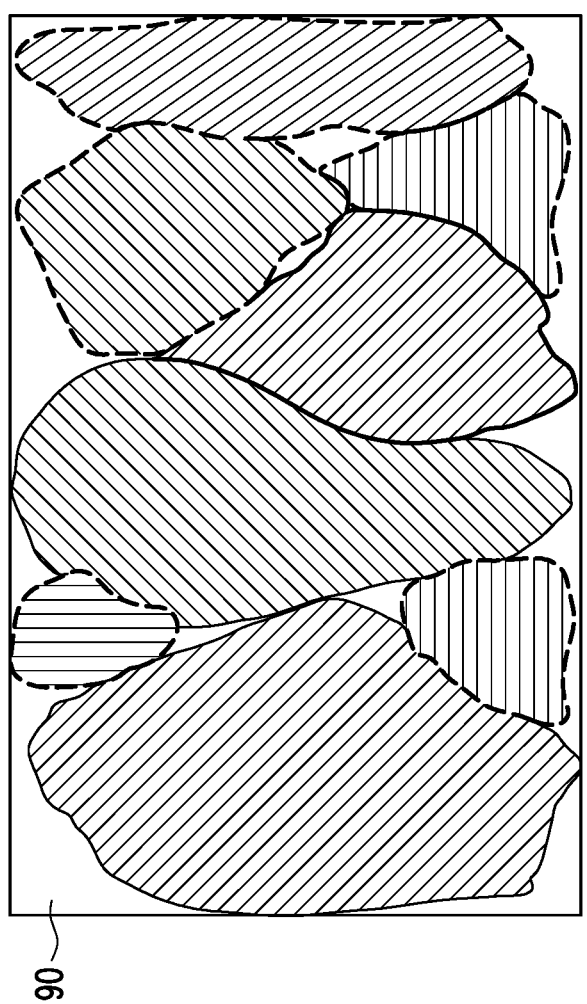

After the various monolayers (e.g., the monolayers 90A, 90B, and 90C) are deposited, an annealing process may be performed. As a result of the annealing process, the FE material 90 may have a crystalline structure with an orthorhombic lattice. FIG. 9G illustrates a ferroelectric phase hafnium zirconium rare earth metal oxide that results from the annealing process. The annealing temperature may be performed at about 400° C. or less. By including the rare earth metal (e.g., having a larger ionic radius than hafnium) in the FE material 90, an orthorhombic lattice structure can still be achieved in the FE material 90 from the relatively low temperature anneal. Accordingly, BEOL integration of the memory array 200 may be improved. Further, it has been observed that by including the rare earth metal in the FE material 90, an endurance of the FE material 90 may be improved by ten times or more. For example, $10^8$ or more polarization cycles may performed without significant degradation of the FE material 90.

Figure 10A:
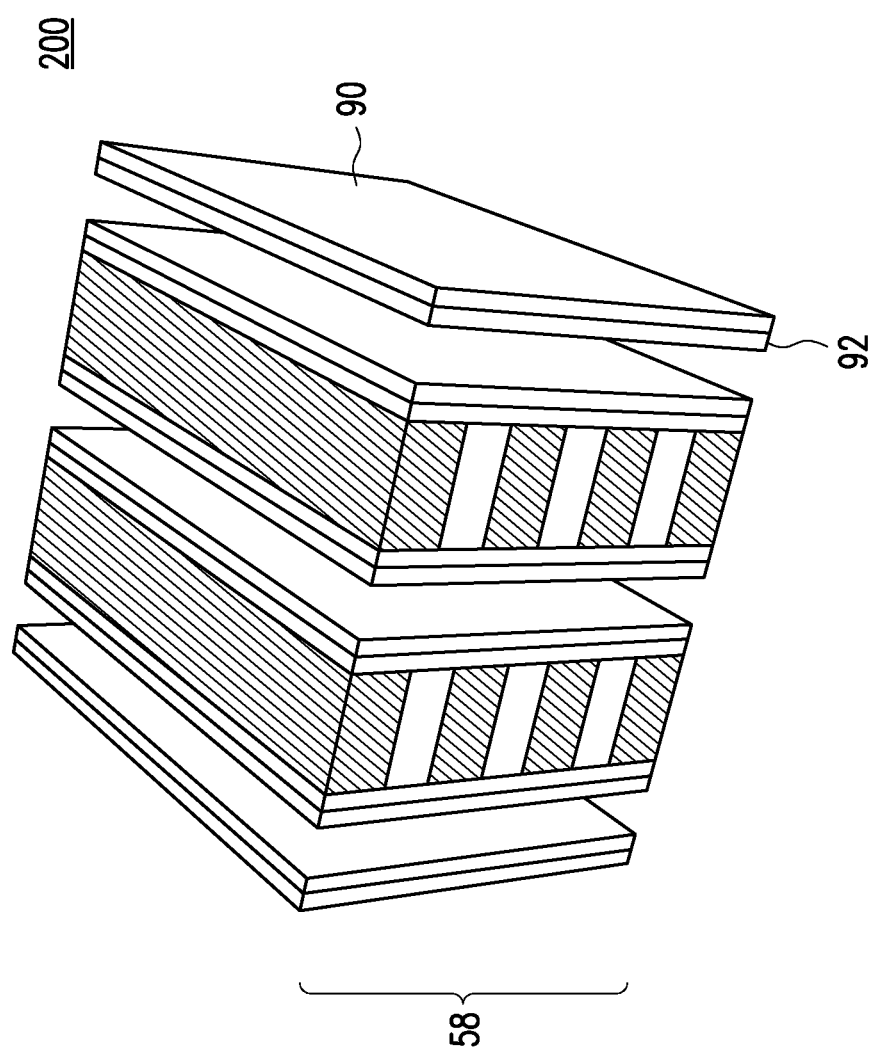
Figure 10B:
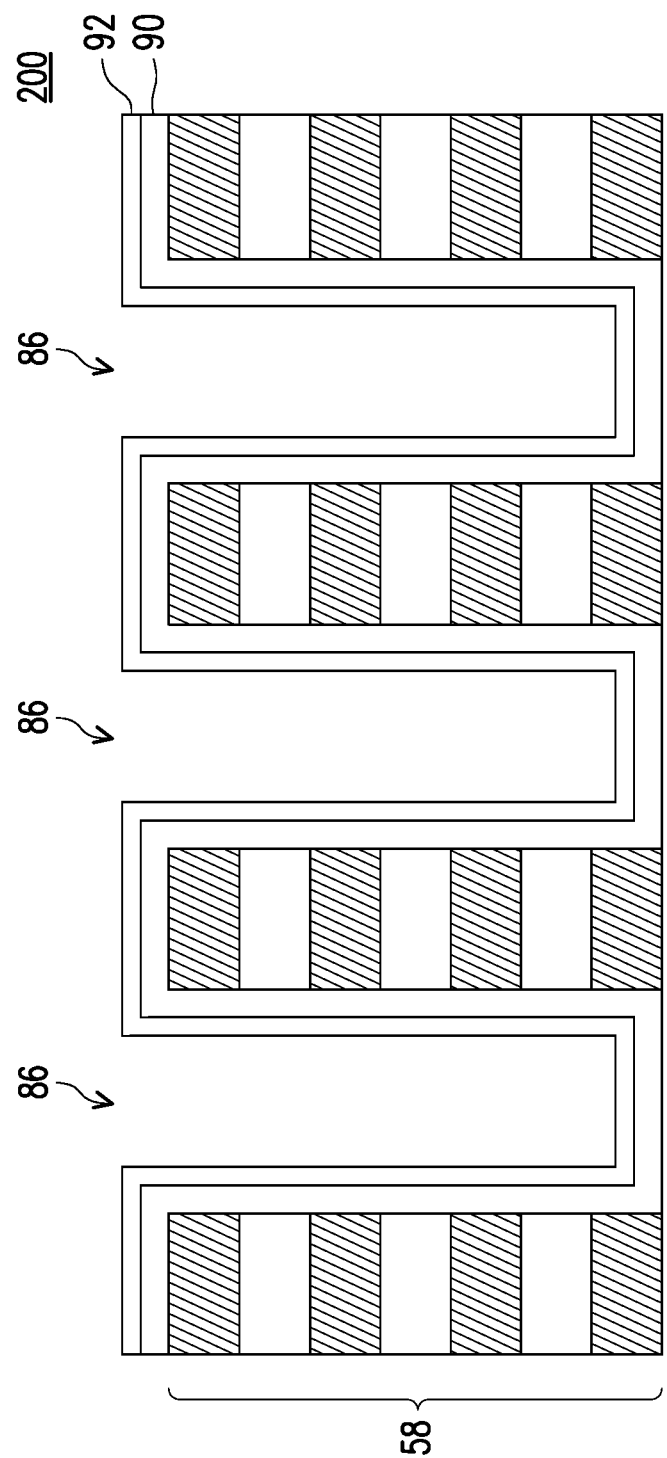

In FIGS. 10A and 10B, the OS layer 92 is conformally deposited in the trenches 86 over the FE material 90. The OS layer 92 comprises a material suitable for providing a channel region for a TFT (e.g., TFTs 204, see FIG. 1A) such as zinc oxide (ZnO), indium tungsten oxide (InWO), indium gallium zinc oxide (InGaZnO), indium zinc oxide (InZnO), indium tin oxide (ITO), combinations thereof, or the like. The OS layer 92 may be deposited by CVD, PVD, ALD, PECVD, or the like. The OS layer 92 may extend along sidewalls and a bottom surface of the trenches 86 over the FE layer 90. After the OS layer 92 is deposited, an annealing step (e.g., at a temperature range of about 300° C. to about 450° C.) in oxygen-related ambient may be performed to activate the charge carriers of the OS layer 92.

Figure 11:
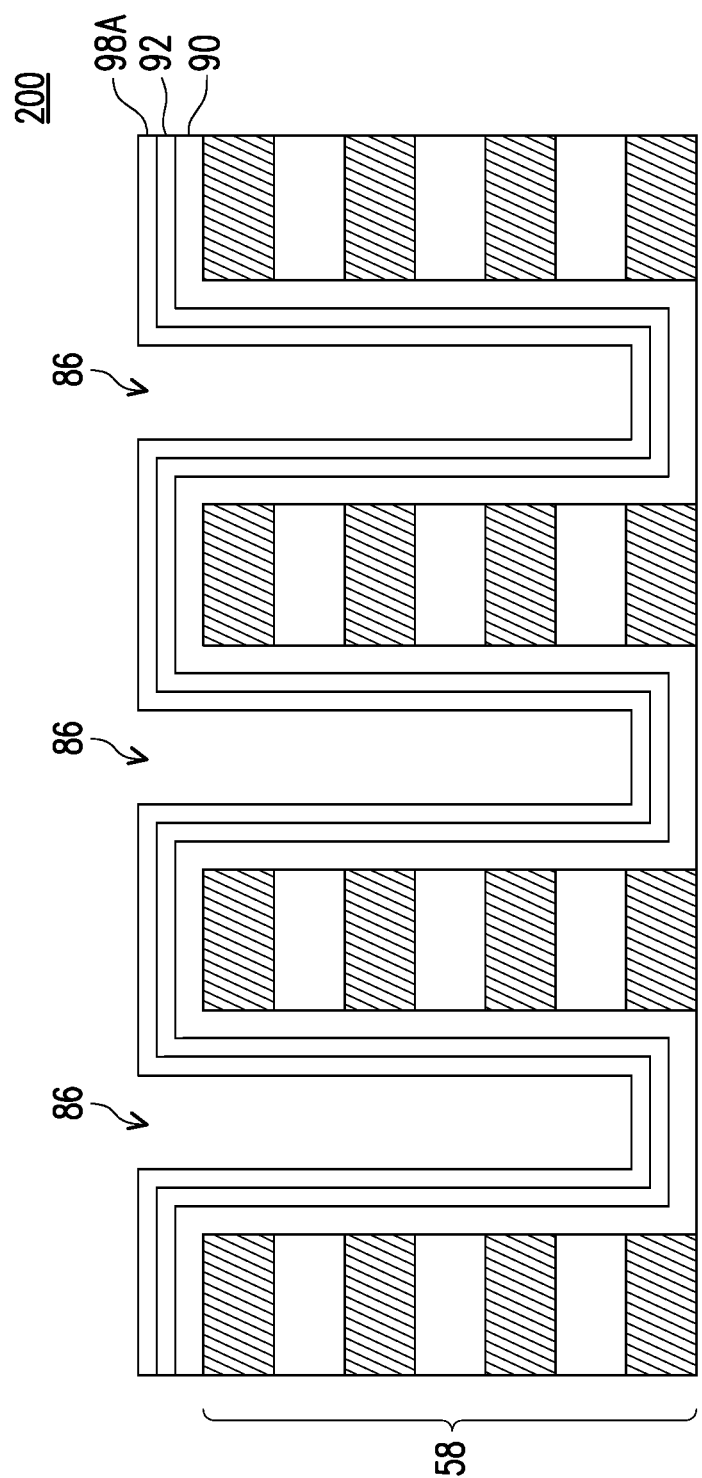

In FIG. 11, a dielectric layer 98A is deposited in the trenches 86 over the OS layer 92. The dielectric layer 98A may include, for example, silicon oxide, silicon nitride, silicon oxynitride, or the like, which may be deposited by CVD, PVD, ALD, PECVD, or the like. The dielectric layer 98A may extend along sidewalls and a bottom surface of the trenches 86 over the OS layer 92.

In FIG. 12, bottom portions of the dielectric layer 98A in the trenches 86 are removed using a combination of photolithography and etching, for example. The etching may be any acceptable etch process, such as by wet or dry etching, a reactive ion etch (RIE), neutral beam etch (NBE), the like, or a combination thereof. The etching may be anisotropic.

Subsequently, as also illustrated by FIG. 12, the dielectric layer 98A may be used as an etch mask to etch through a bottom portion of the OS layer 92 in the trenches 86. The etching may be any acceptable etch process, such as by wet or dry etching, a reactive ion etch (RIE), neutral beam etch (NBE), the like, or a combination thereof. The etching may be anisotropic. Etching the OS layer 92 may expose portions of the FE material 90 on a bottom surface of the trenches 86. Thus, portions of the OS layer 92 on opposing sidewalls of the trenches 86 may be separated from each other, which improves isolation between the memory cells 202 of the memory array 200 (see FIG. 1A).

In FIG. 13, an additional dielectric material 98B may be deposited to fill remaining portions of the trenches 86. The dielectric material 98B may have a same material composition and be formed using a like process as the dielectric layer 98A. The dielectric material 98B and the dielectric layer 98A may be referred to collectively as the dielectric material 98 herein after.

In FIGS. 14A through 14C, a removal process is then applied to the dielectric material 98, the OS layer 92, and the FE material 90 to remove excess material over the multi-layer stack 58. In some embodiments, a planarization process such as a chemical mechanical polish (CMP), an etch-back process, combinations thereof, or the like may be utilized. The planarization process exposes the multi-layer stack 58 such that top surface of the multi-layer stack 58 is level after the planarization process is complete. FIG. 14C illustrates a corresponding top-down view of the structure illustrated in FIG. 14A.

FIGS. 15A through 18C illustrate intermediate steps of manufacturing conductive lines 106 and 108 (e.g., source lines and bit lines) in the memory array 200. The conductive lines 106 and 108 may extend along a direction perpendicular to the conductive lines 72 such that individual cells of the memory array 200 may be selected for read and write operations. FIGS. 15A through 18C, figures ending in "A" illustrate a 3D view. In FIGS. 15A through 18C, figures ending in "B" illustrate a top down view, and Figures ending in "C" illustrate a corresponding cross-sectional view along line C-C' of FIG. 1A.

Figure 15A:
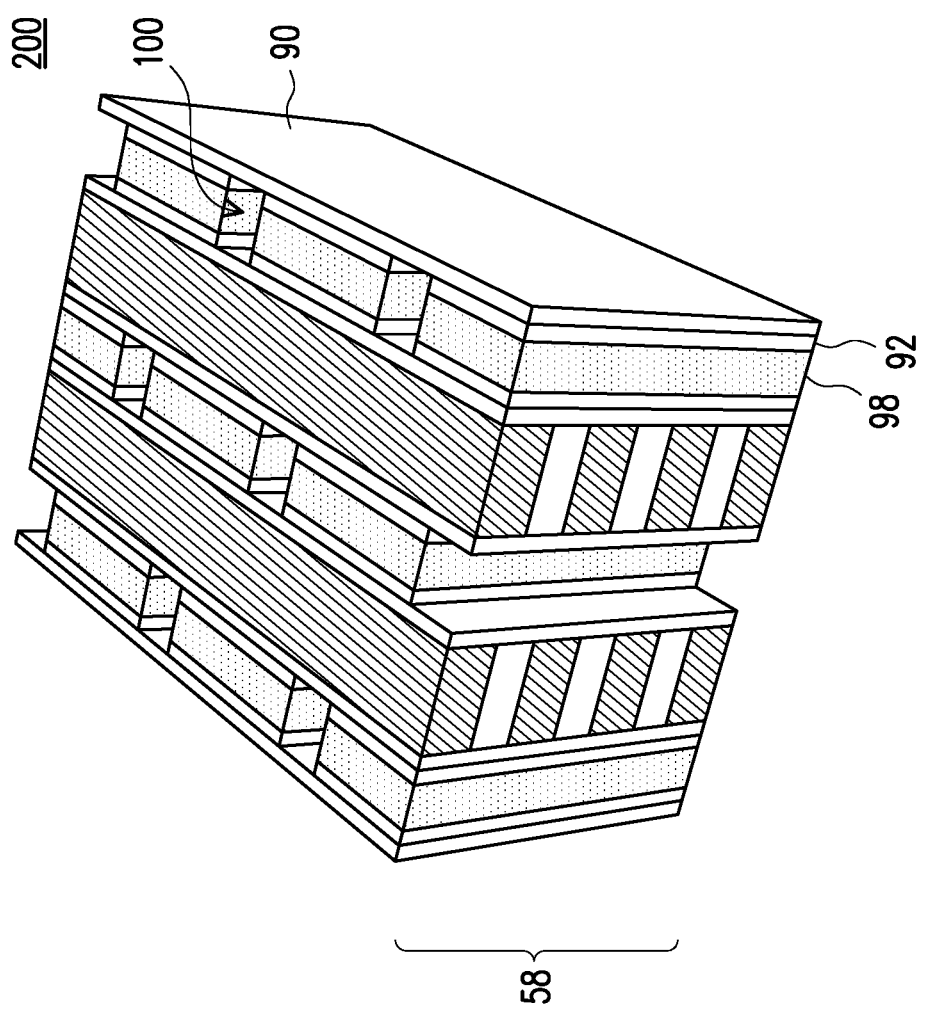
Figure 15B:
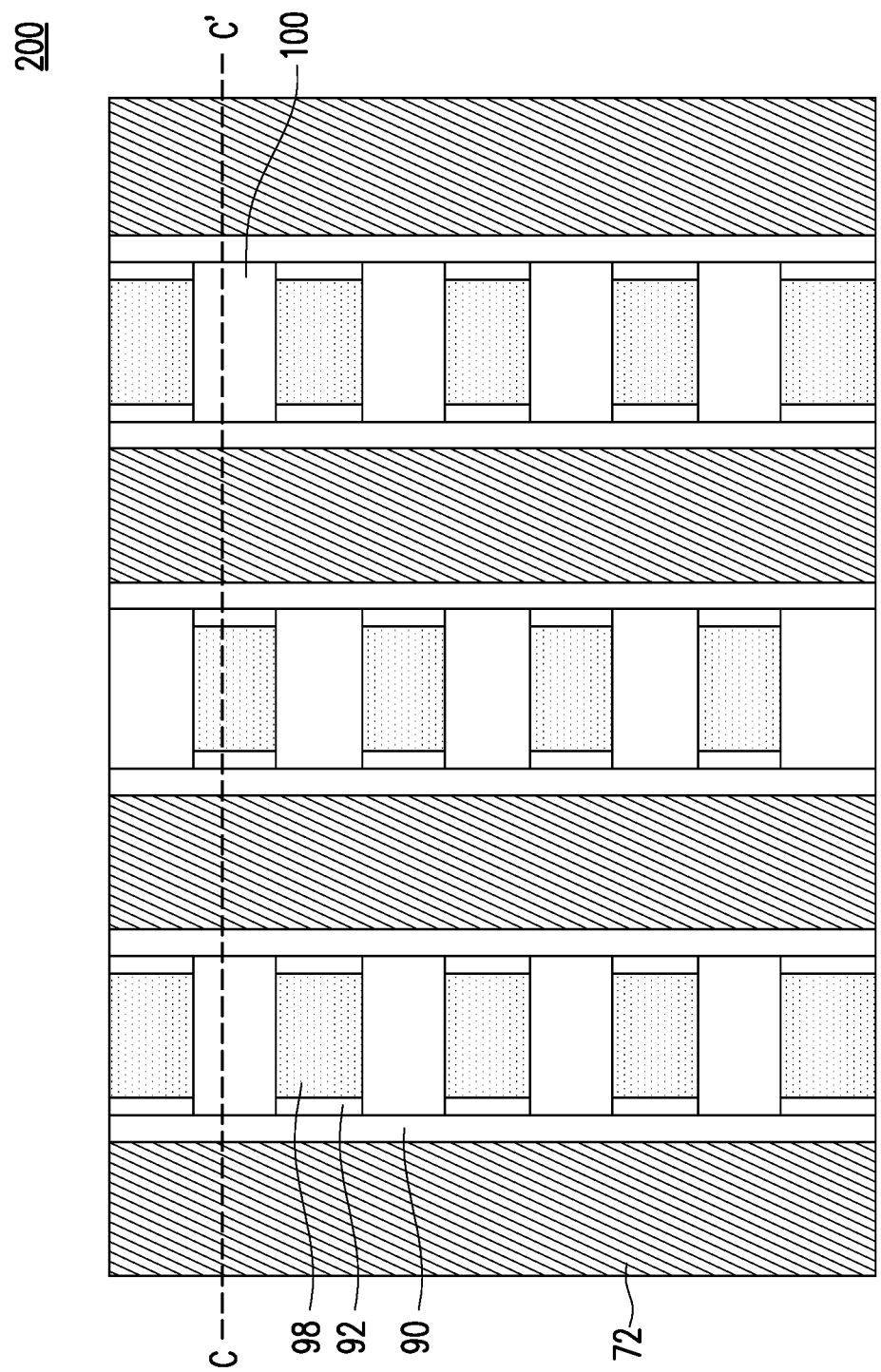
Figure 15C:
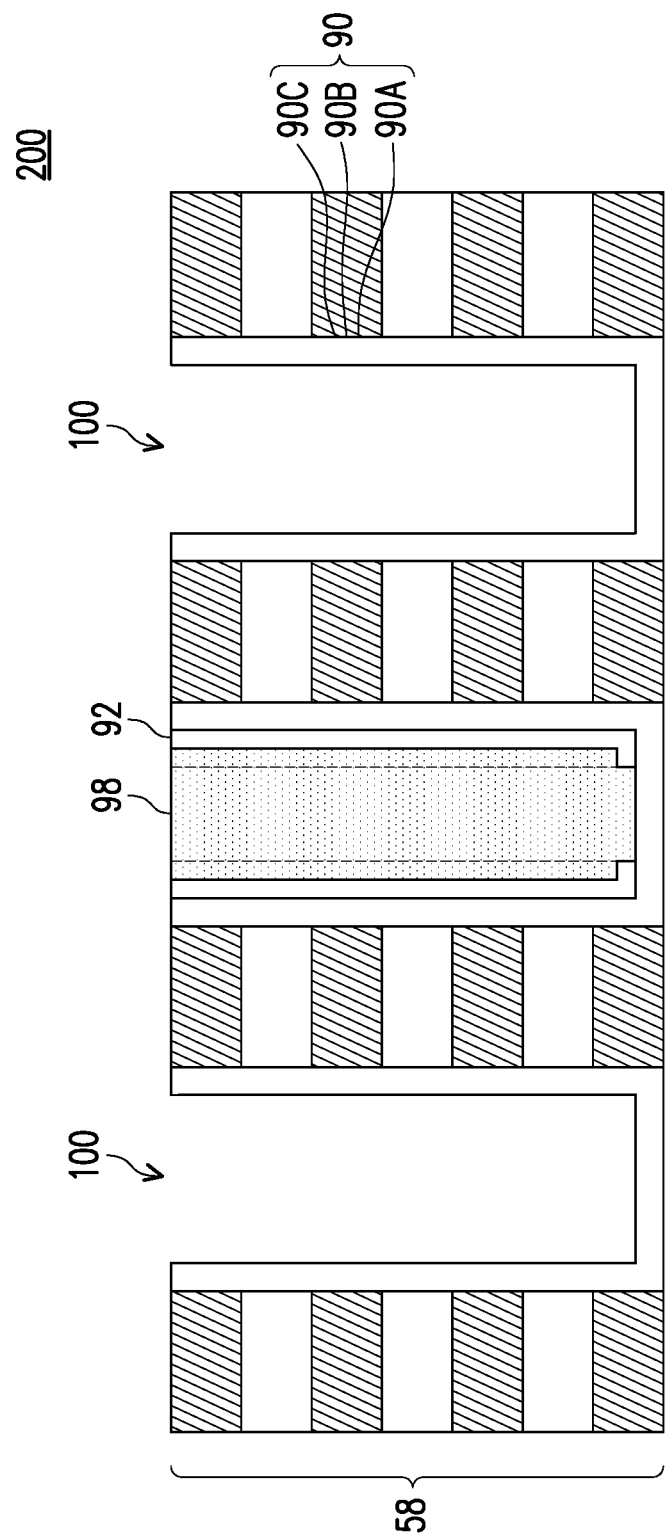
Figure 16A:
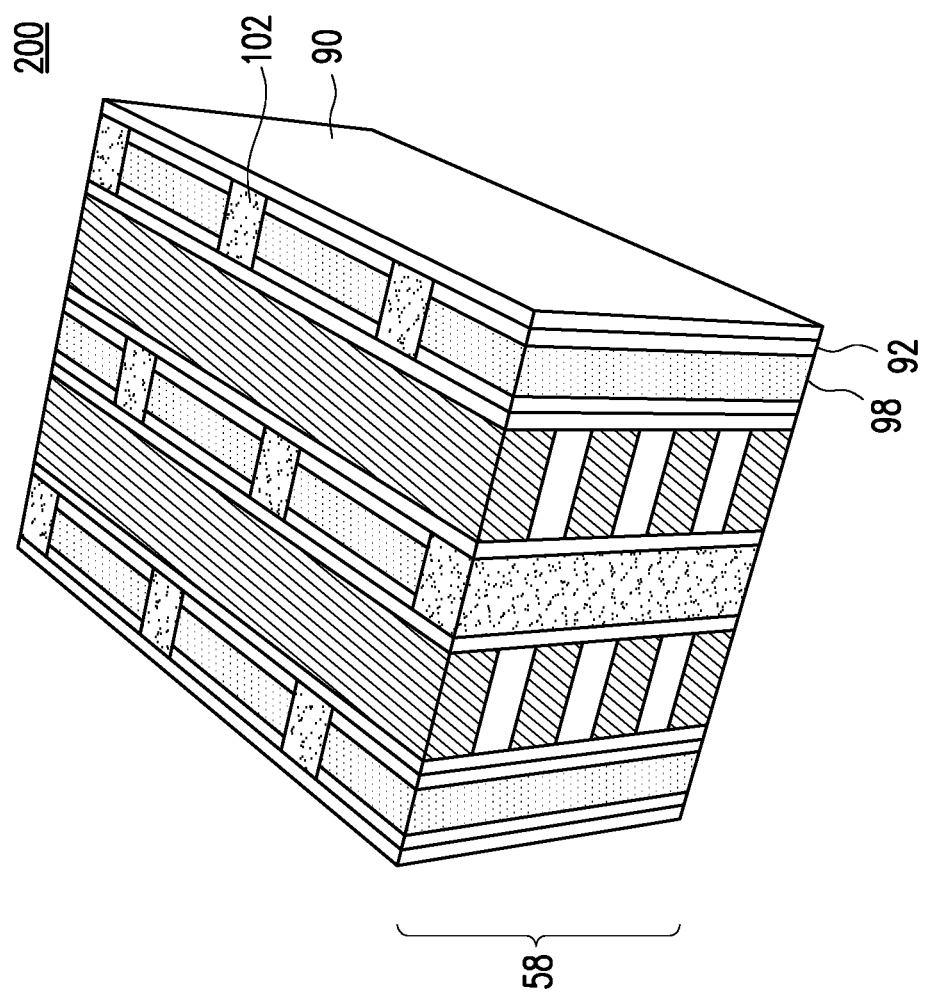
Figure 16B:
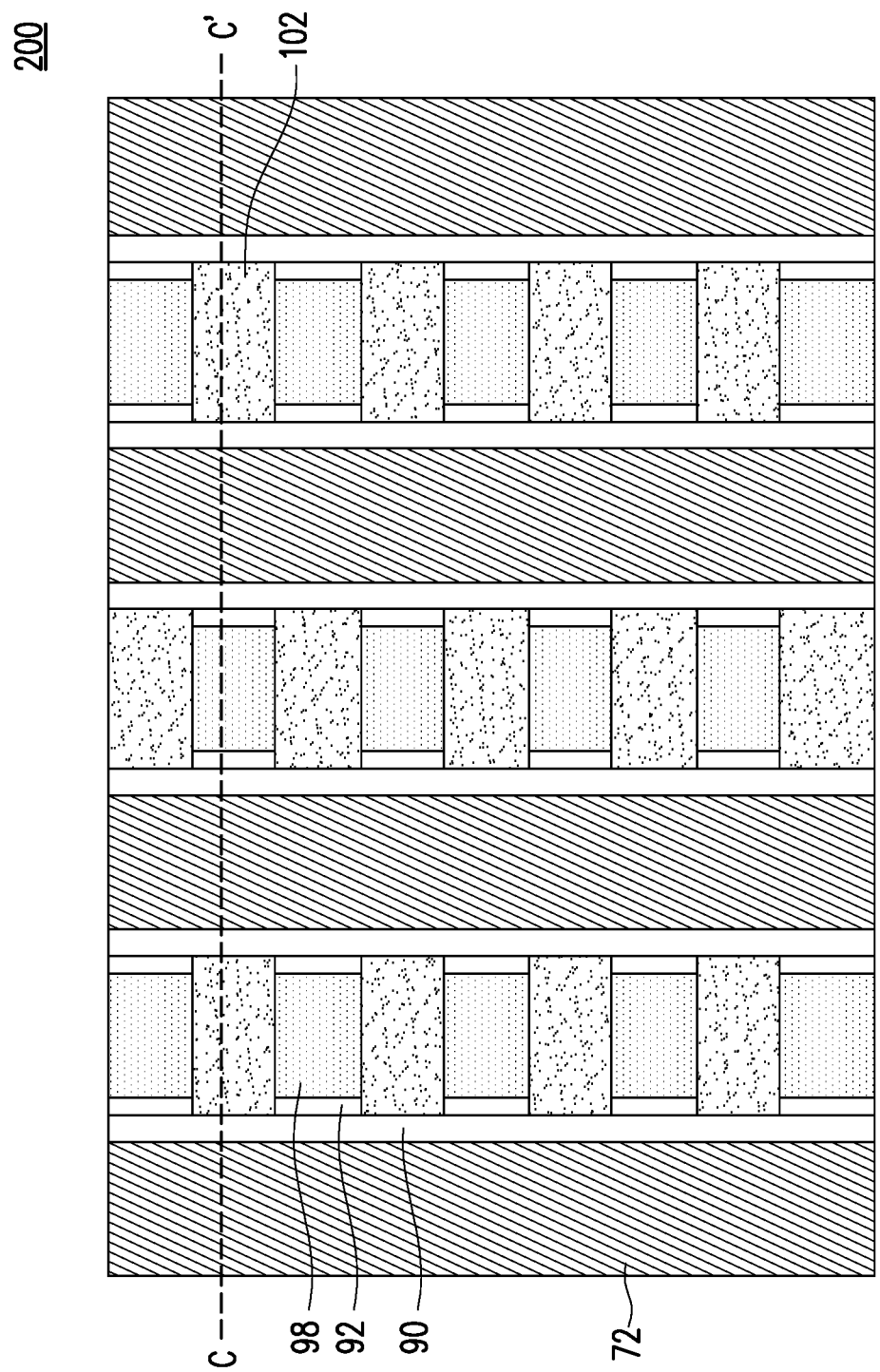
Figure 16C:
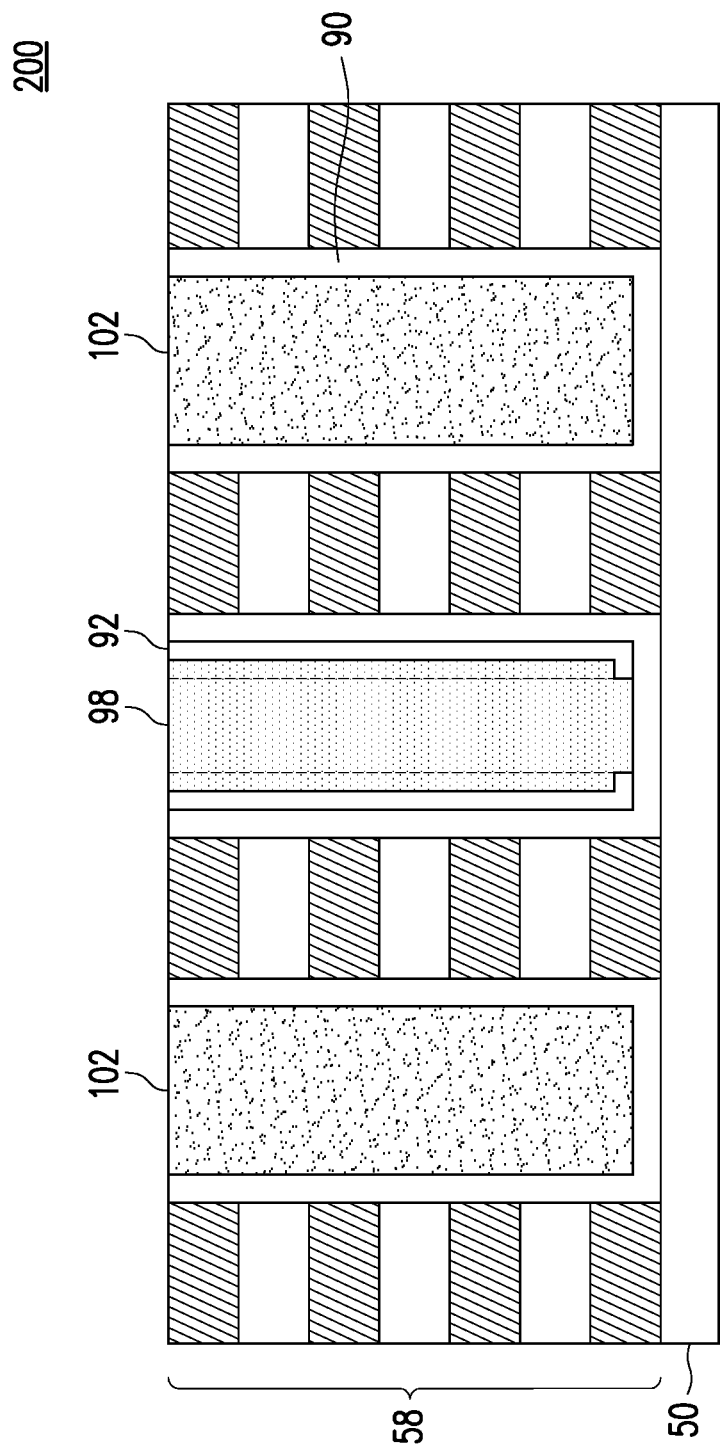

In FIGS. 15A, 15B, and 15C, trenches 100 are patterned through the OS layer 92 and the dielectric material 98. FIG. 15C illustrates a cross-section view of line C-C' in FIG. 15B. Patterning the trenches 100 may be performed through a combination of photolithography and etching, for example. The trenches 100 may be disposed between opposing sidewalls of the FE material 90, and the trenches 100 may physically separate adjacent stacks of memory cells in the memory array 200 (see FIG. 1A). In FIGS. 16A, 16B, and 16C, a dielectric material 102 is deposited in and fills the trenches 100. FIG. 16C illustrates a cross-section view of line C-C' in FIG. 16B. The dielectric layer 102 may include, for example, silicon oxide, silicon nitride, silicon oxynitride, or the like, which may be deposited by CVD, PVD, ALD, PECVD, or the like. The dielectric layer 102 may extend along sidewalls and a bottom surface of the trenches 86 over the OS layer 92. After deposition, a planarization process (e.g., a CMP, etch back, or the like) may be performed to remove excess portions of the dielectric material 102. In the resulting structure, top surfaces of the multi-layer stack 58, the FE material 90, the OS layer 92, and the dielectric material 102 may be substantially level (e.g., within process variations). In some embodiments, materials of the dielectric materials 98 and 102 may be selected so that they may be etched selectively relative each other. For example, in some embodiments, the dielectric material 98 is an oxide and the dielectric material 102 is a nitride. In some embodiments, the dielectric material 98 is a nitride and the dielectric material 102 is an oxide. Other materials are also possible.

Figure 17A:
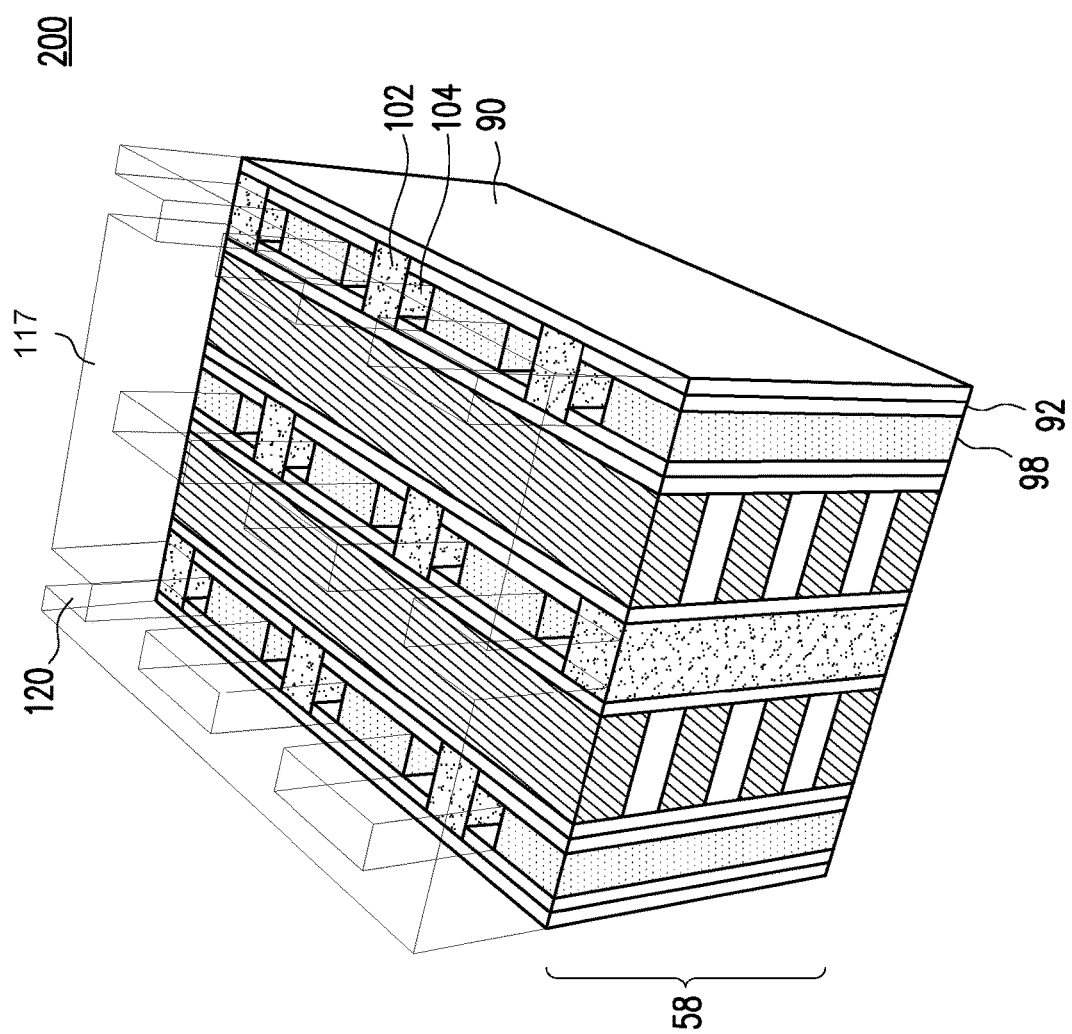
Figure 17B:
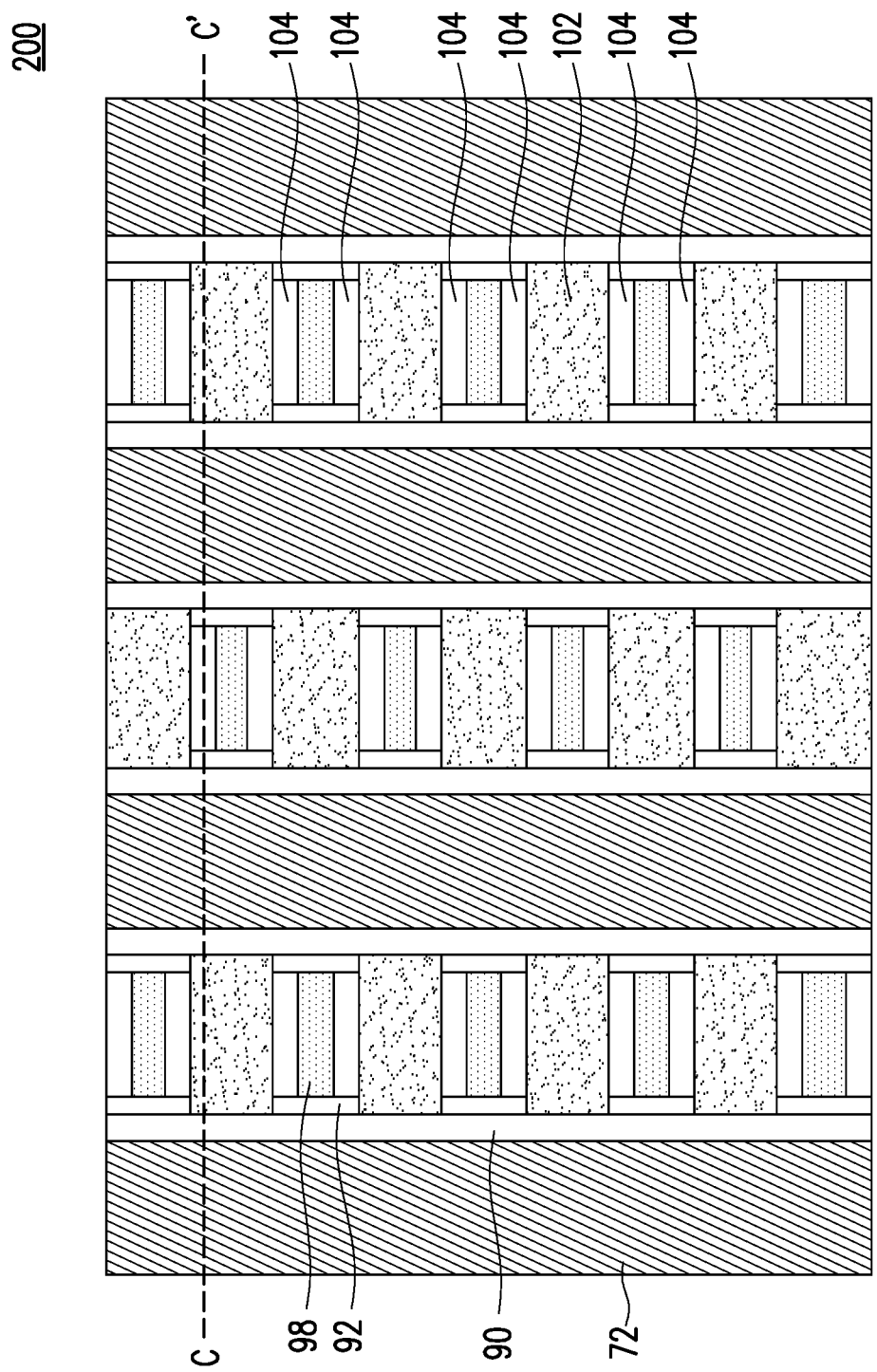
Figure 17C:
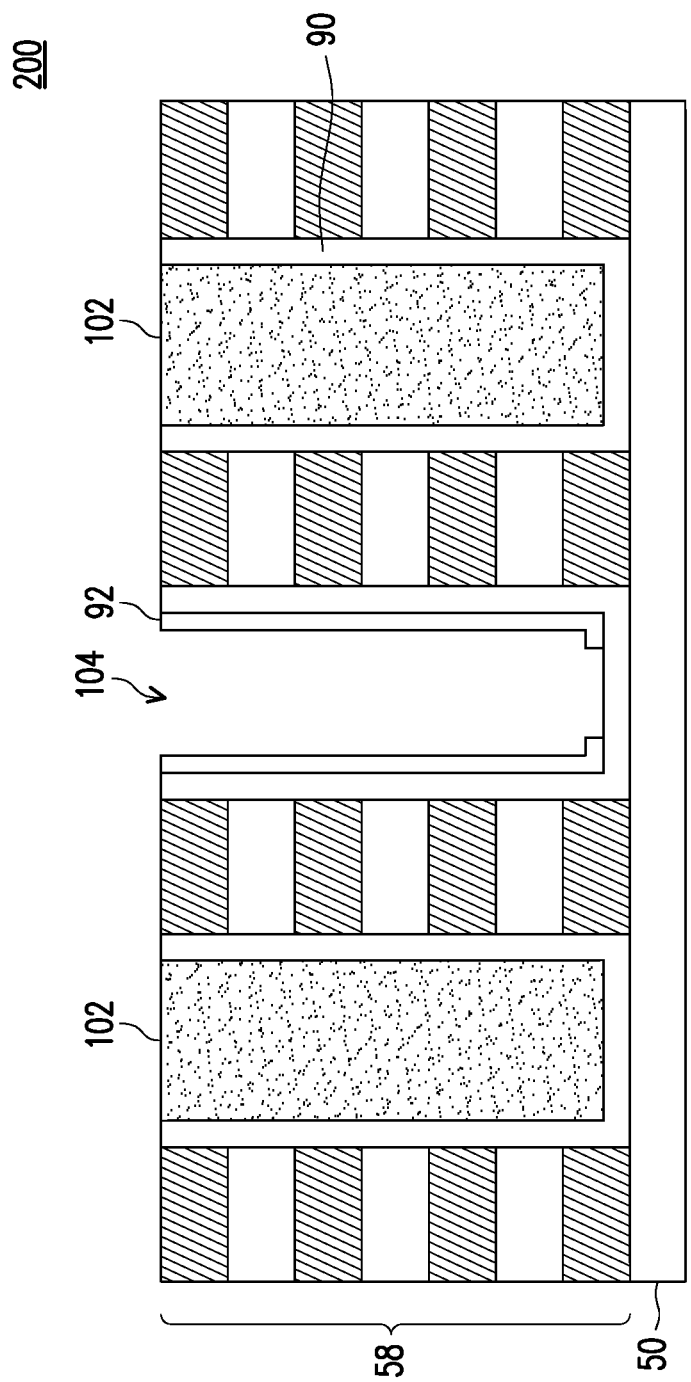

In FIGS. 17A, 17B, and 17C, trenches 104 are patterned for the conductive lines 106 and 108. FIG. 17C illustrates a top-down view of line C-C' in FIG. 17B. The trenches 104 are patterned by patterning the dielectric material 98 using a combination of photolithography and etching, for example.

For example, a photoresist 117 may be deposited over the multi-layer stack 58, the dielectric material 98, the dielectric material 102, the OS layer 92, and the FE material 90. The photoresist 117 can be formed by using a spin-on technique, for example. The photoresist 82 is patterned to define openings 120. Each of the openings 120 may overlap a corresponding region of the dielectric material 102, and each of the openings 120 may further partially expose two separate regions of the dielectric material 98. For example, each opening 120 may expose a region of the dielectric material 102; partially expose a first region of the dielectric material 98; and partially expose a second region of the dielectric material 98 that is separated from the first region of the dielectric material 98 by the region of the dielectric material 102. In this way, each of the openings 120 may define a patterning of a conductive line 106 and an adjacent conductive line 108 that are separated by the dielectric material 102. The photoresists can be patterned using acceptable photolithography techniques. For example, the photoresist 82 be exposed to light for patterning. After the exposure process, the photoresist 82 may be developed to remove exposed or unexposed portions of the photo resist depending on whether a negative or positive resist is used, thereby defining a patterning of the form openings 120.

Subsequently, portions of the dielectric material 98 exposed by the openings 120 may be removed by etching, for example. The etching may be any acceptable etch process, such as by wet or dry etching, a reactive ion etch (RIE), neutral beam etch (NBE), the like, or a combination thereof. The etching may be anisotropic. The etching process may use an etchant that etches the dielectric material 98 without significantly etching the dielectric material 102. As a result, even though the openings 120 expose the dielectric material 102, the dielectric material 102 may not be significantly removed. A pattern of the trenches 104 may correspond to the conductive lines 106 and 108 (see FIGS. 18A, 18B, and 18C). For example, a portion of the dielectric material 98 may remain between each pair of the trenches 104, and the dielectric material 102 may be disposed between adjacent pairs of the trenches 104. After the trenches 104 are patterned, the photoresist 118 may be removed by ashing, for example.

Figure 18A:
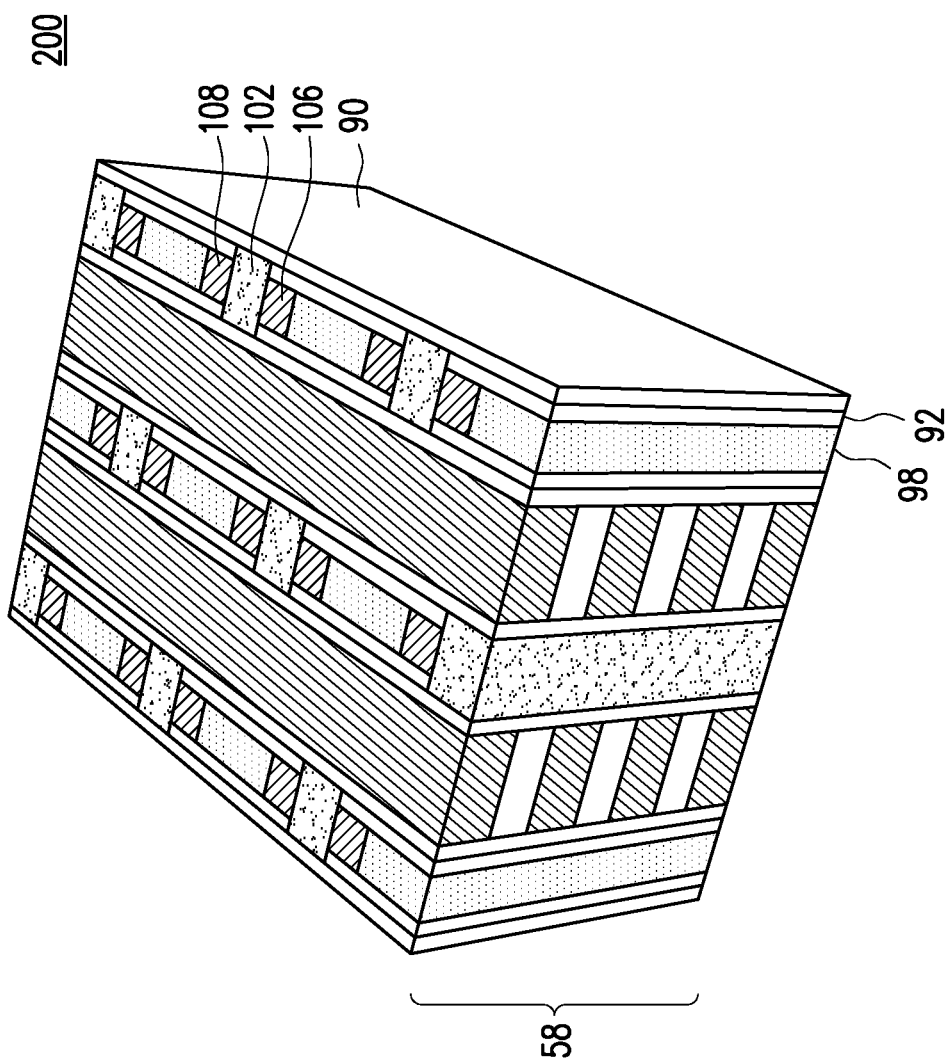
Figure 18B:
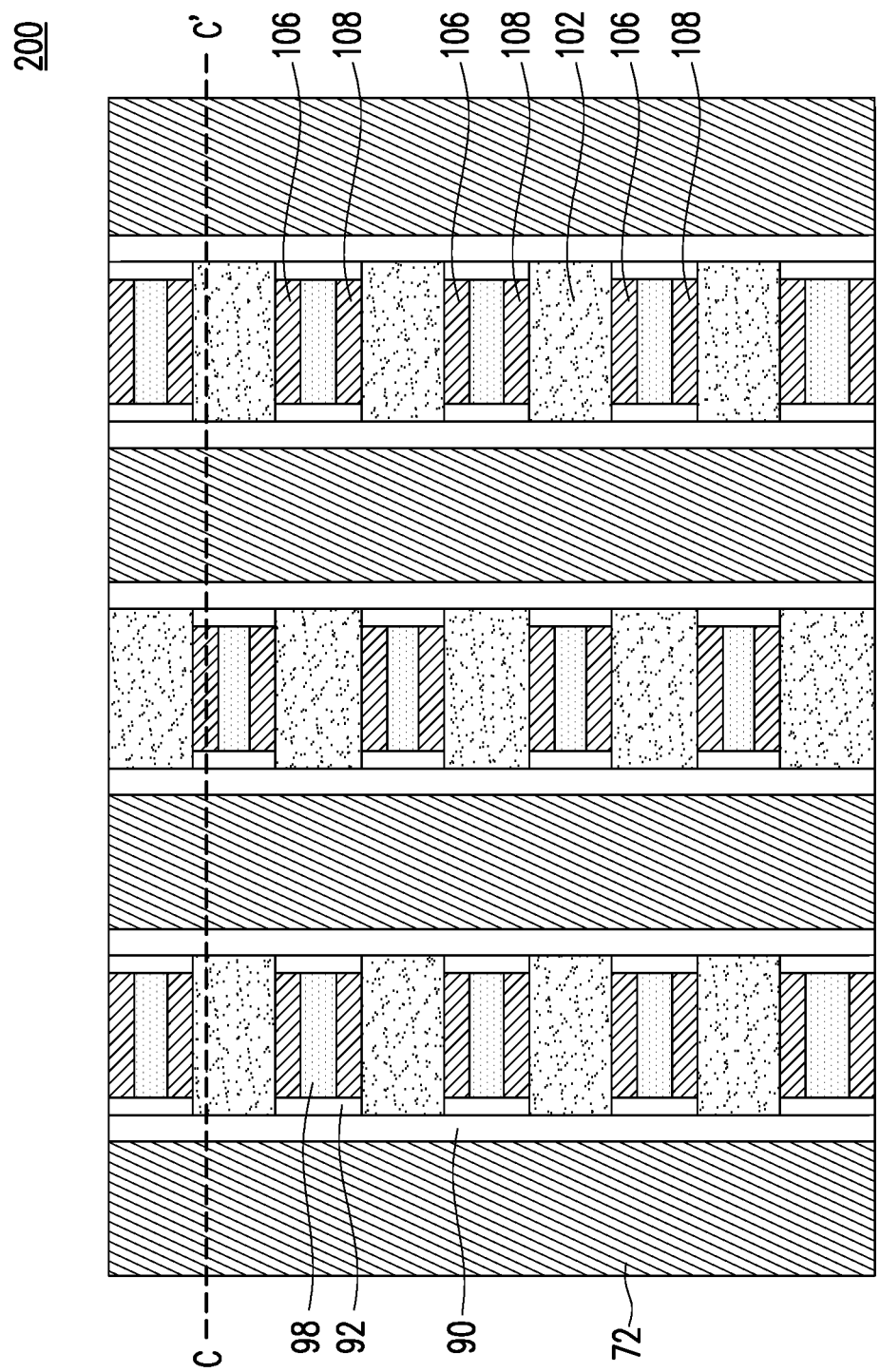
Figure 18C:
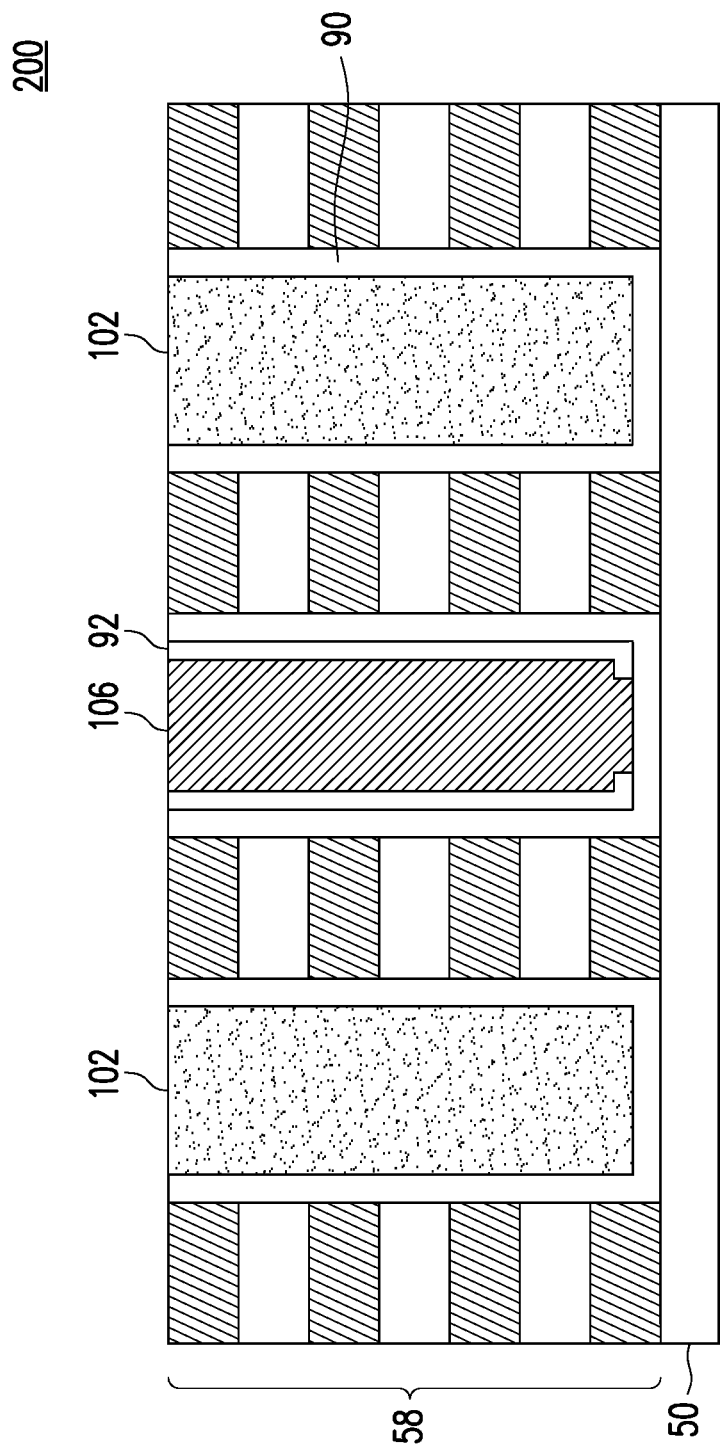

In FIGS. 18A, 18B, and 18C the trenches 104 are filled with a conductive material to form the conductive lines 106 and 108. FIG. 18C illustrates a top-down view of line C-C' in FIG. 18B. The conductive lines 106 and 108 may each comprise a conductive material, such as, copper, titanium, titanium nitride, tantalum, tantalum nitride, tungsten, ruthenium, aluminum, combinations thereof, or the like, which may be each formed using, for example, CVD, ALD, PVD, PECVD, or the like. After the conductive lines 106 and the conductive material is deposited, a planarization (e.g., a CMP, etch back, or the like) may be performed to remove excess portions of the conductive material, thereby forming the conductive lines 106 and 108. In the resulting structure, top surfaces of the multi-layer stack 58, the FE material 90, the OS layer 92, the conductive lines 106, and the conductive lines 108 may be substantially level (e.g., within process variations). The conductive lines 106 may correspond to bit lines in the memory array, and the conductive lines 108 may correspond to source lines in the memory array 200. Further the conductive lines 106 and 108 may provide source/drain electrodes for TFTs in the memory array 200. Although FIG. 18C illustrates a cross-sectional view that only shows the conductive lines 106, a cross-sectional view of the conductive lines 108 may be similar.

FIGS. 19 through 28B are views of intermediate stages in the manufacturing a staircase structure of the memory array 200, in accordance with some embodiments. FIGS. 19, 20, 21, 22, 23, 24, 25, 26B, 27, and 28B are illustrated along reference cross-section B-B' illustrated in FIG. 1. FIGS. 26A and 28A are illustrated in a three-dimensional view.

Figure 19:
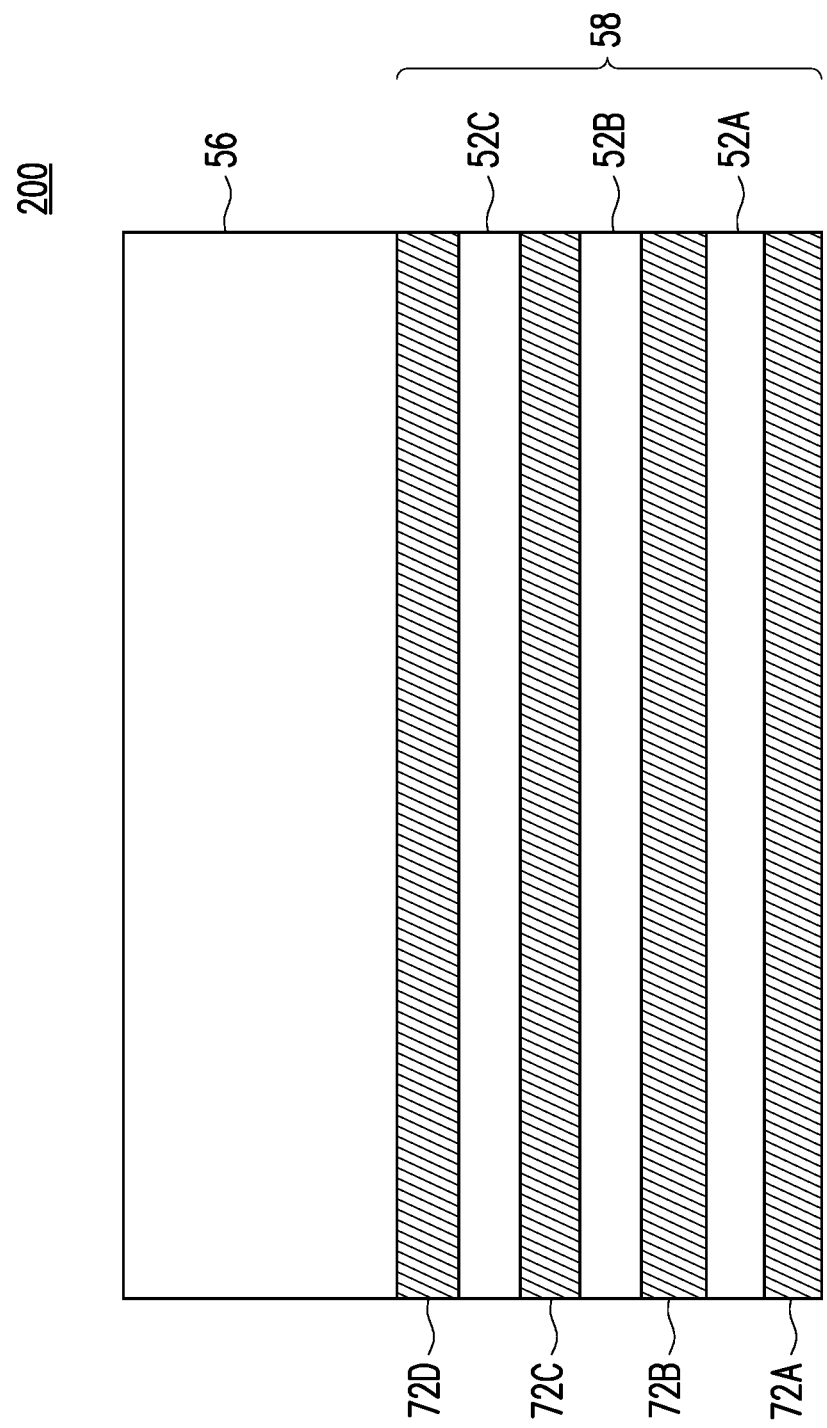

In FIG. 19 a photoresist 56 is formed over the multi-layer stack 58. As discussed above, the multi-layer stack 58 may comprise alternating layers of the conductive lines 72 (labeled 72A, 72B, 72C, and 72D) and the dielectric layers 52 (labeled 52A, 52B, and 52C). The photoresist 56 can be formed by using a spin-on technique and can be patterned using acceptable photolithography techniques.

Figure 20:
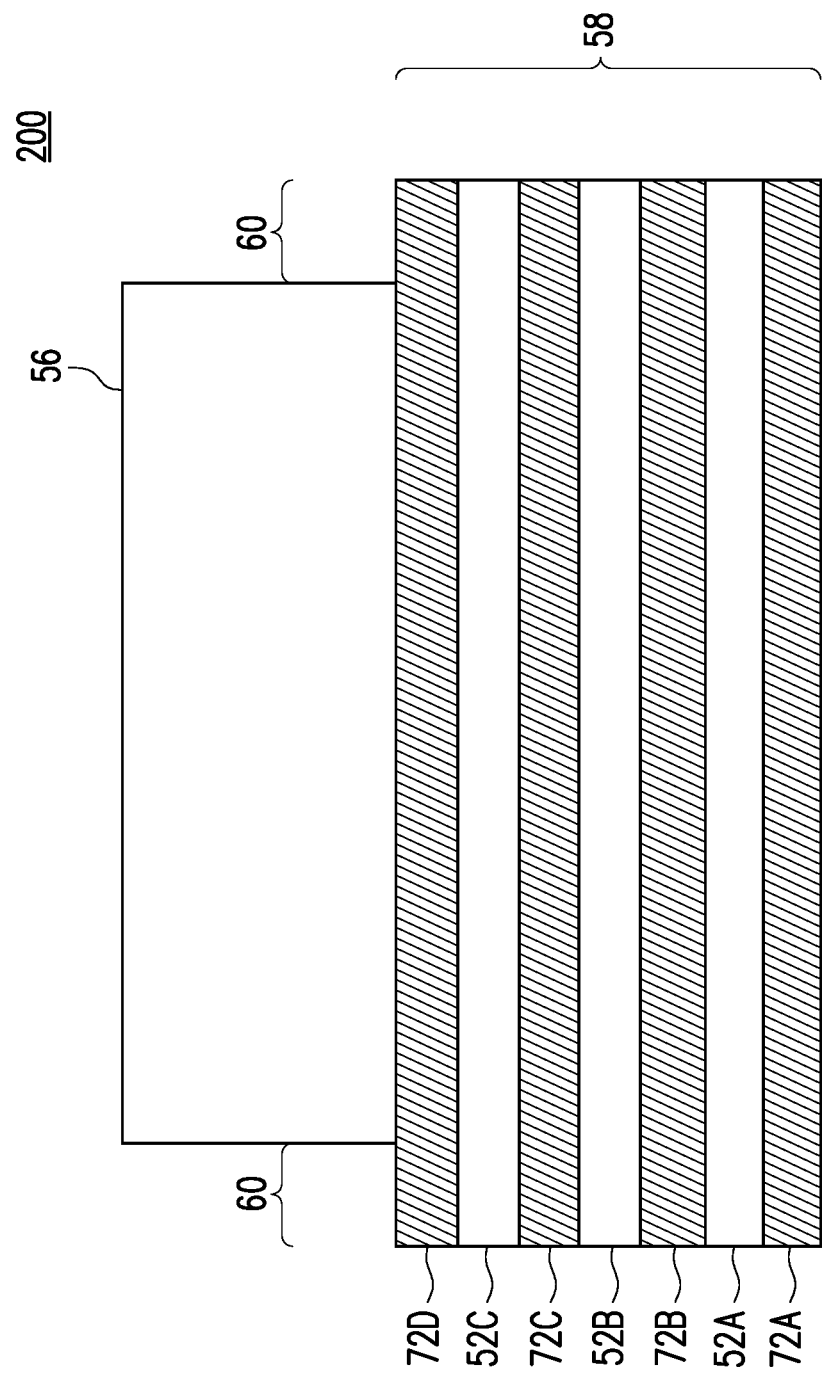

In FIG. 20, the photoresist 56 is patterned to expose the multi-layer stack 58 in regions 60 while masking remaining portions of the multi-layer stack 58 (e.g., portions containing the FE material 90, the OS layer 92, the conductive lines 106, and the conductive lines 108). For example, a topmost layer of the multi-layer stack 58 (e.g., conductive lines 72D) may be exposed in the regions 60. The photoresist may mask and protect portions of the multi-layer stack 58 containing the FE material 90, the OS layer 92, the conductive lines 106, and the conductive lines 108 until the photoresist 56 is removed (see FIGS. 26A and 26B).

Figure 21:
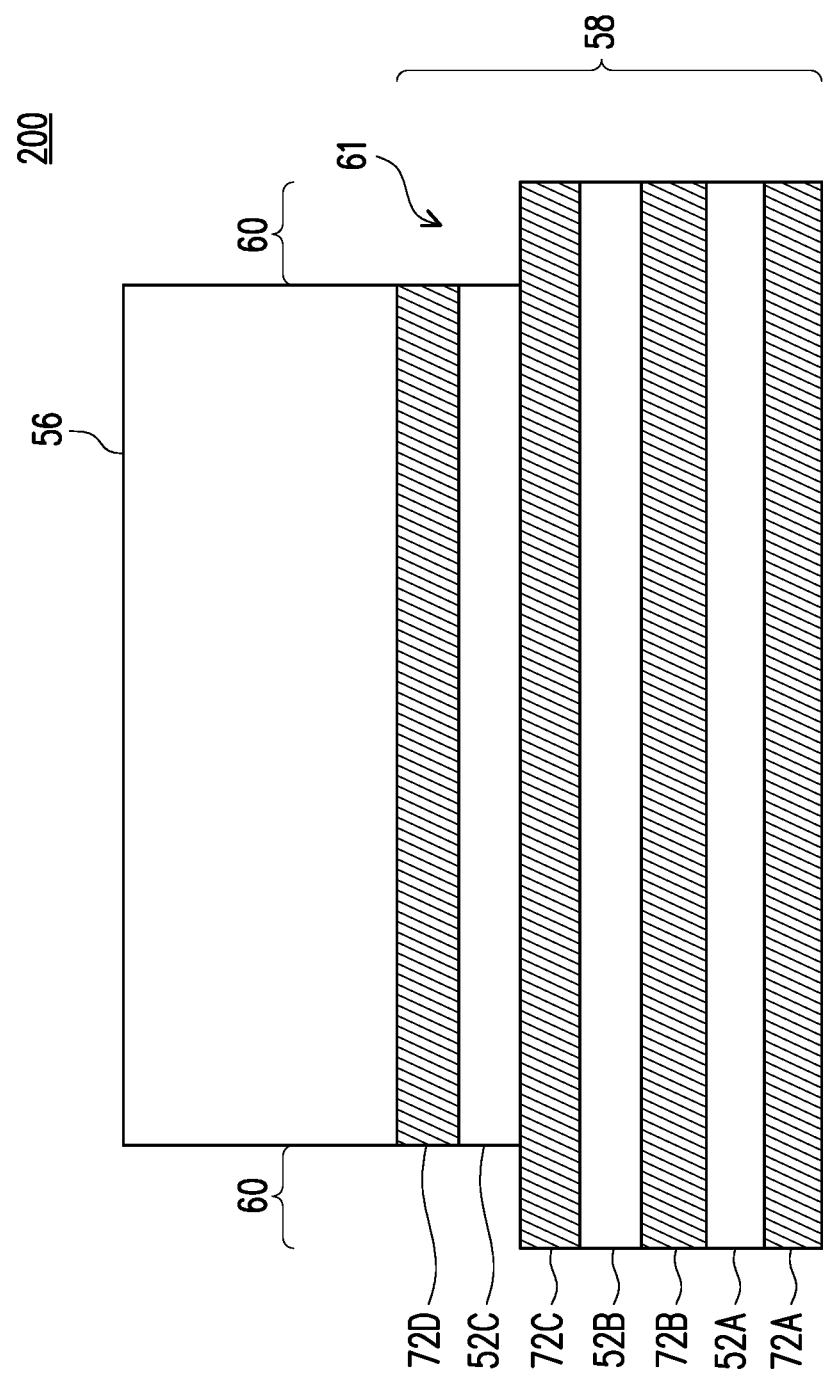

In FIG. 21, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the conductive lines 72D and dielectric layer 52C in the regions 60 and define openings 61. Because the conductive lines 72D and the dielectric layer 52C have different material compositions, etchants used to remove exposed portions of these layers may be different. In some embodiments, the dielectric layer 52C acts as an etch stop layer while etching the conductive lines 72D, and the conductive lines 72C act as an etch stop layer while etching dielectric layer 52C. As a result, the portions of the conductive layer 54E and the conductive lines 72D may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the conductive lines 72C are exposed in the regions 60.

Figure 22:
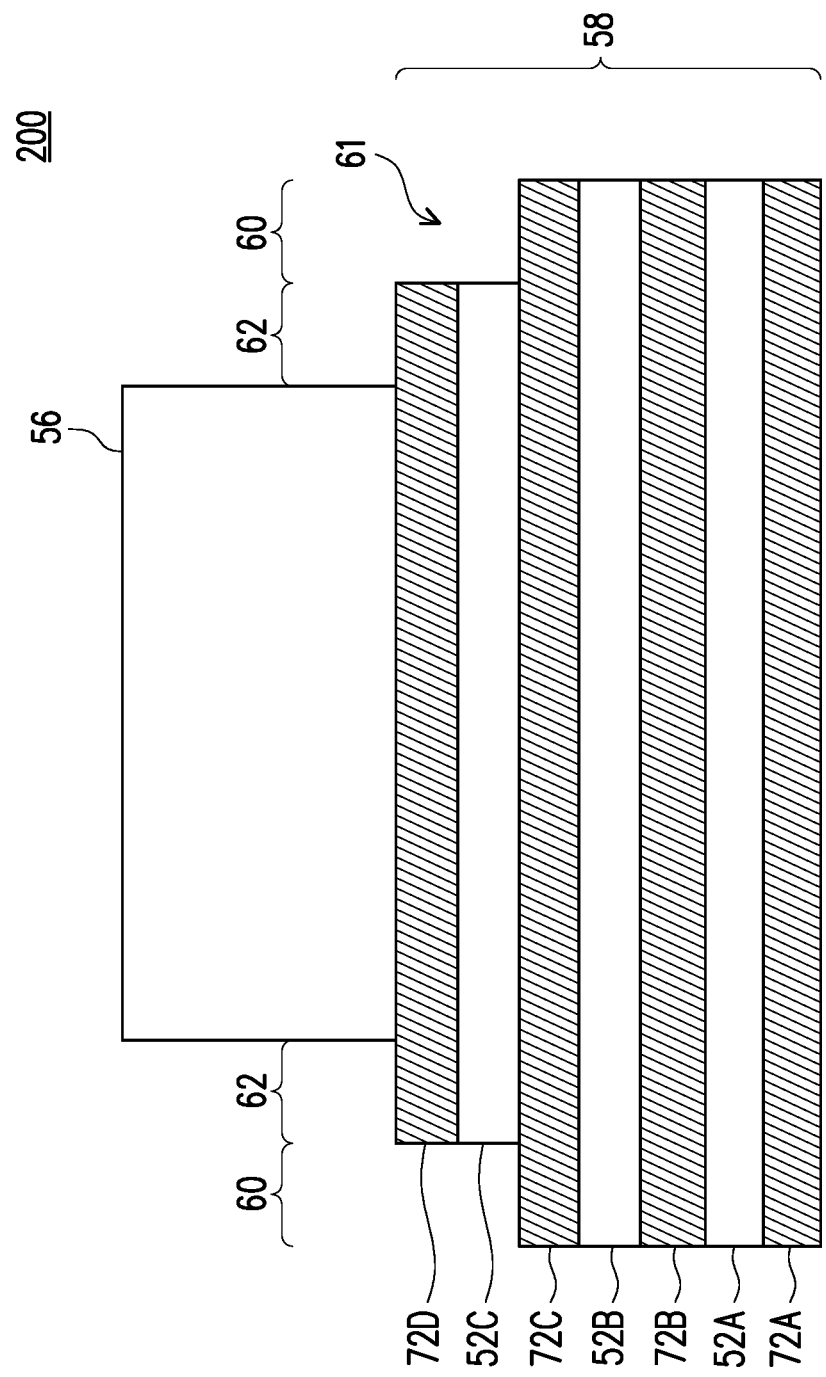

In FIG. 22, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 and 62 may be exposed. For example, a top surface of the conductive lines 72C may be exposed in the regions 60, and a top surface of the conductive line 72D may be exposed in the regions 62.

Figure 23:
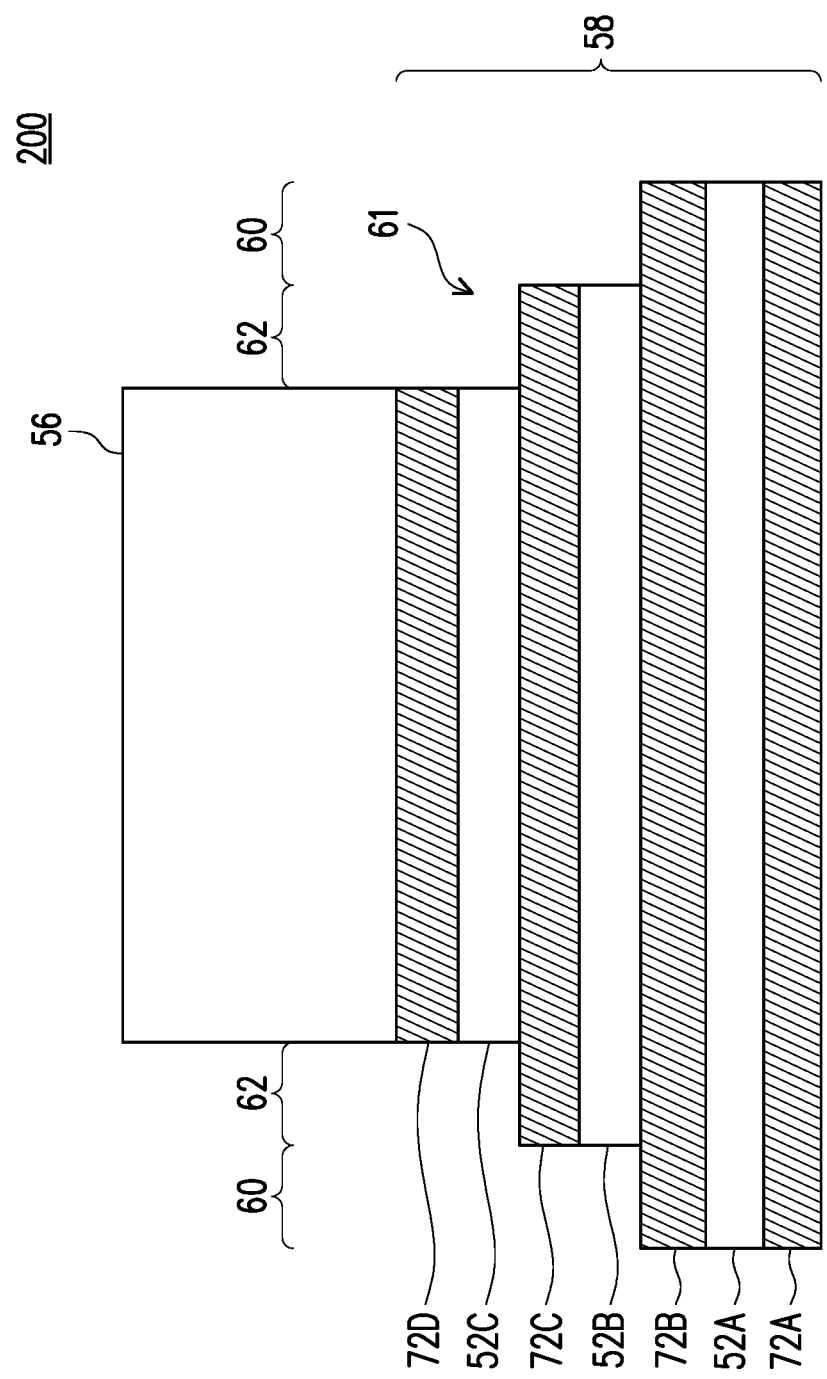

In FIG. 23, portions of the conductive lines 72D, the dielectric layer 52C, the conductive lines 72C, and the dielectric layer 52B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive lines 72D/72C and the dielectric layers 52C/52B have different material compositions, etchants used to remove exposed portions of these layers may be different. In some embodiments, the dielectric layer 52C acts as an etch stop layer while etching the conductive lines 72D; the conductive lines 72C act as an etch stop layer while etching dielectric layer 52C; the dielectric layer 52B acts as an etch stop layer while etching the conductive lines 72C; and the conductive lines 72B act as an etch stop layer while etching the dielectric layer 52B. As a result, portions of the conductive lines 72D/72C and the dielectric layer 52C/52B may be selectively removed without removing remaining layers of the multi-layer stack 58, and the openings 61 may be extended to a desired depth. Further, during the etching processes, unetched portions of the conductive lines 72 and dielectric layers 52 act as a mask for underlying layers, and as a result a previous pattern of the conductive lines 72D and dielectric layer 52C (see FIG. 22) may be transferred to the underlying conductive lines 72C and dielectric layer 52B. In the resulting structure, the conductive lines 72B are exposed in the regions 60, and the conductive lines 72C are exposed in the regions 62.

Figure 24:
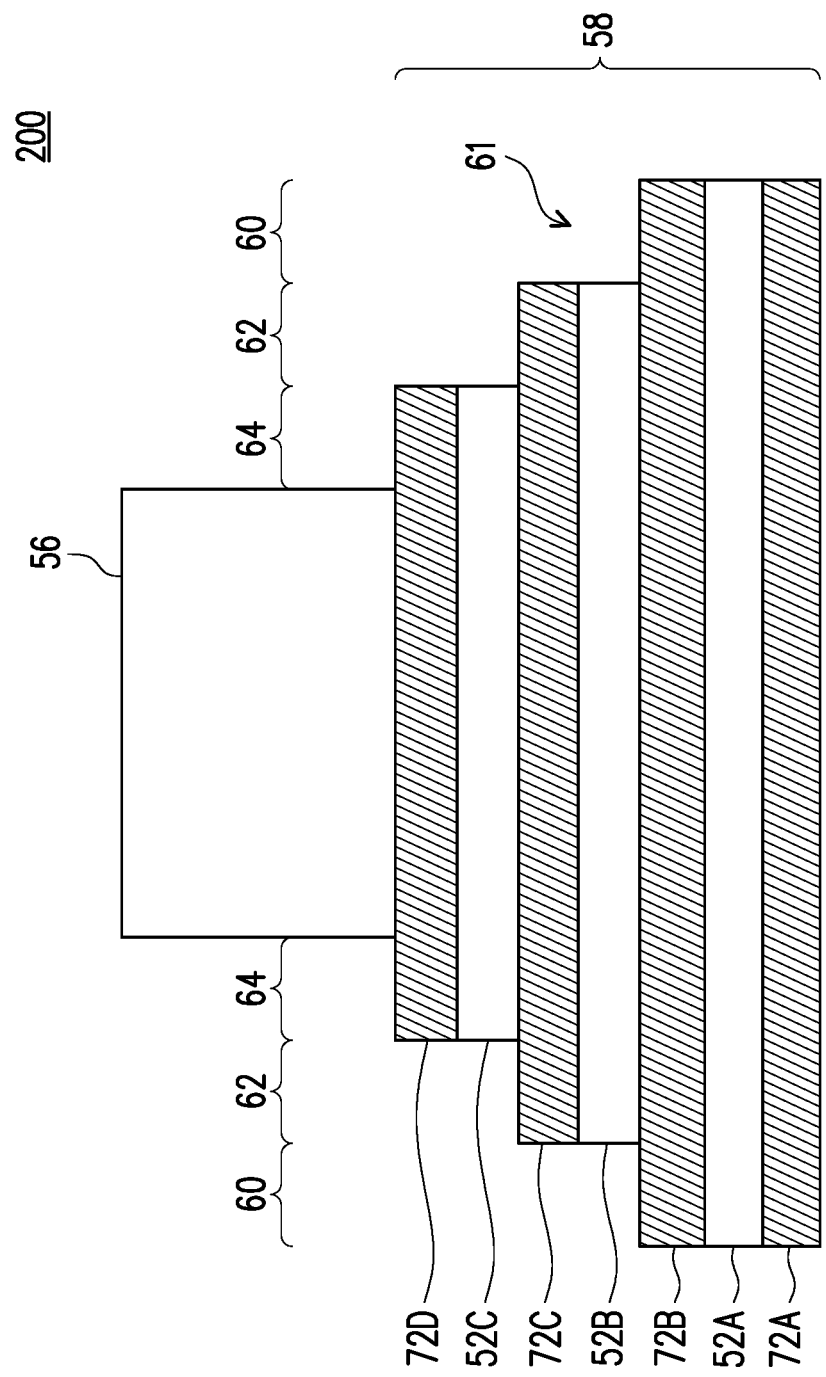

In FIG. 24, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 62, and 64 may be exposed. For example, top surfaces of the conductive lines 72B may be exposed in the regions 60; top surfaces of the conductive lines 72C may be exposed in the regions 62; and top surfaces of the conductive lines 72D may be exposed in the regions 64.

In FIG. 25, portions of the conductive lines 72D, 72C, and 72B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the dielectric layer 52C acts as an etch stop layer while etching the conductive line 72D; the dielectric layer 52B acts as an etch stop layer while etching the conductive lines 72C; and the dielectric layer 52A acts as an etch stop layer etching the conductive lines 72B. As a result, portions of the conductive lines 72D, 72C, and 72B may be selectively removed without removing remaining layers of the multi-layer stack 58, and the openings 61 may be extended to a desired depth. Further, during the etching processes, each of the dielectric layers 52 act as a mask for underlying layers, and as a result a previous pattern of the dielectric layers 52C/52B (see FIG. 24) may be transferred to the underlying conductive lines 72C/72B. In the resulting structure, the dielectric layer 52A is exposed in the regions 60; the dielectric layer 52B is exposed in the regions 62; and the dielectric layer 52C is exposed in the regions 64.

Figure 26A:
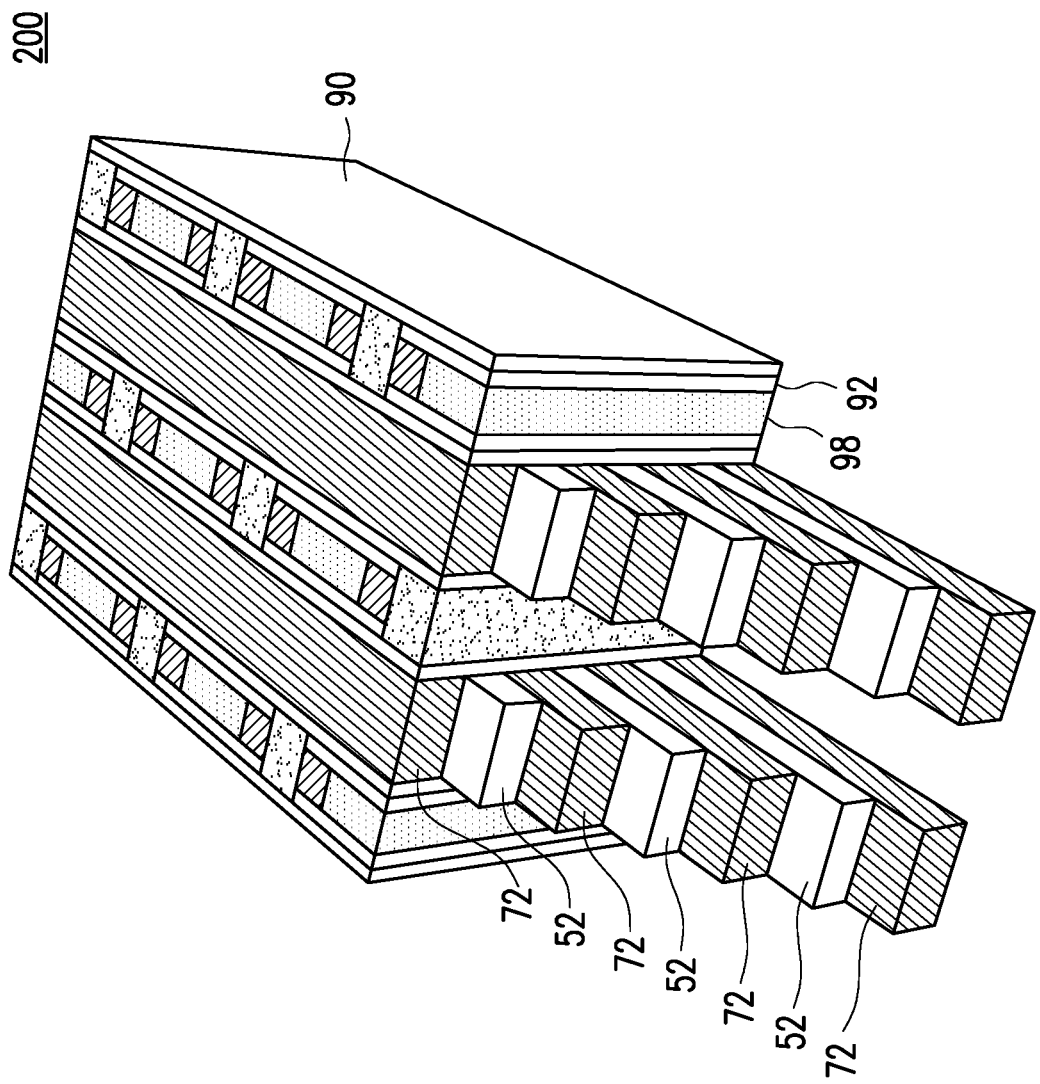
Figure 26B:
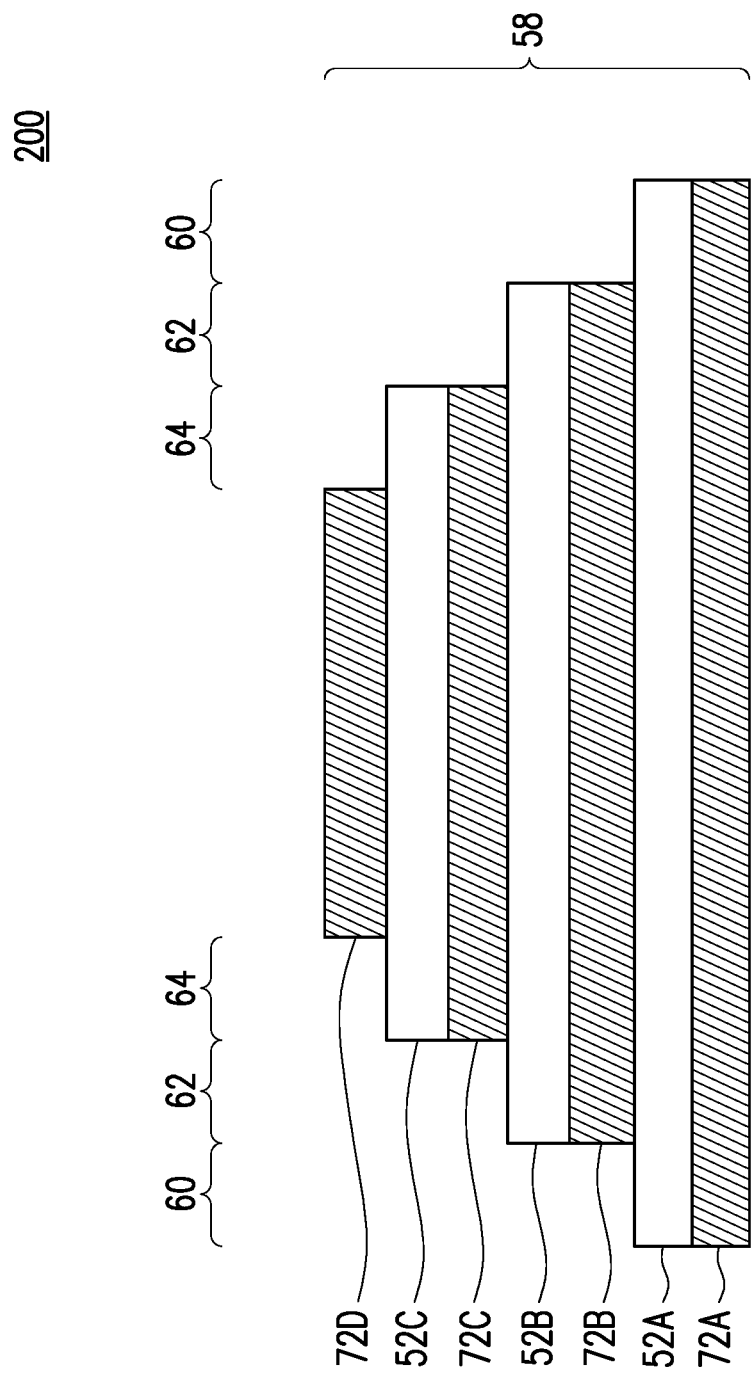

In FIGS. 26A and 26B, the photoresist 56 may be removed, such as by an acceptable ashing or wet strip process. Thus, a staircase structure 68 is formed. The staircase structure comprises a stack of alternating ones of the conductive lines 72 and the dielectric layers 52. Lower conductive lines 72 are wider and extend laterally past upper conductive lines 72, and a width of each of the conductive layers 72 increases in a direction towards the substrate 50. For example, the conductive lines 72A may longer than the conductive lines 72B; the conductive lines 72B may be longer than the conductive lines 72C; and the conductive lines 72C may be longer than the conductive lines 72D. As a result, conductive contacts can be made from above the staircase structure 68 to each of the conductive lines 72 in subsequent processing steps.

Figure 27:
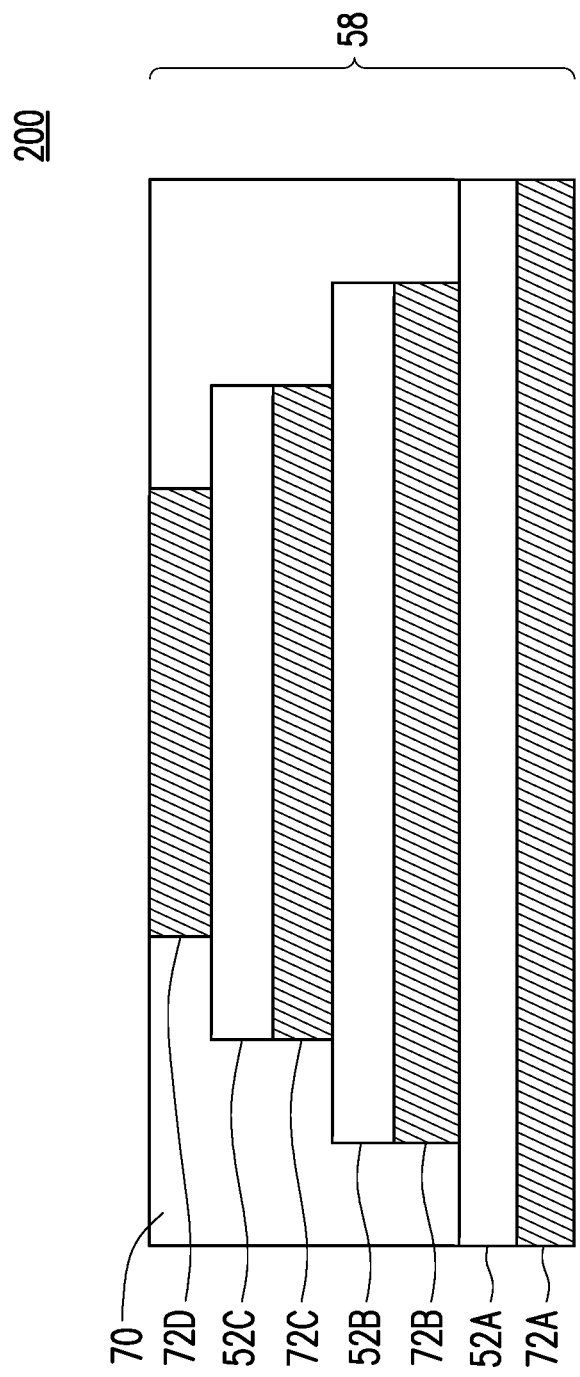

In FIG. 27, an inter-metal dielectric (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. The IMD 70 extends along sidewalls of the conductive lines 72 as well as sidewalls of the dielectric layers 52. Further, the IMD 70 may contact top surfaces of each of the dielectric layers 52.

As further illustrated in FIG. 27, a removal process is then applied to the IMD 70 to remove excess dielectric material over the multi-layer stack 58. In some embodiments, a planarization process such as a chemical mechanical polish (CMP), an etch-back process, combinations thereof, or the like may be utilized. The planarization process exposes the multi-layer stack 58 such that top surfaces of the multi-layer stack 58 and IMD 70 are level after the planarization process is complete.

Figure 28A:
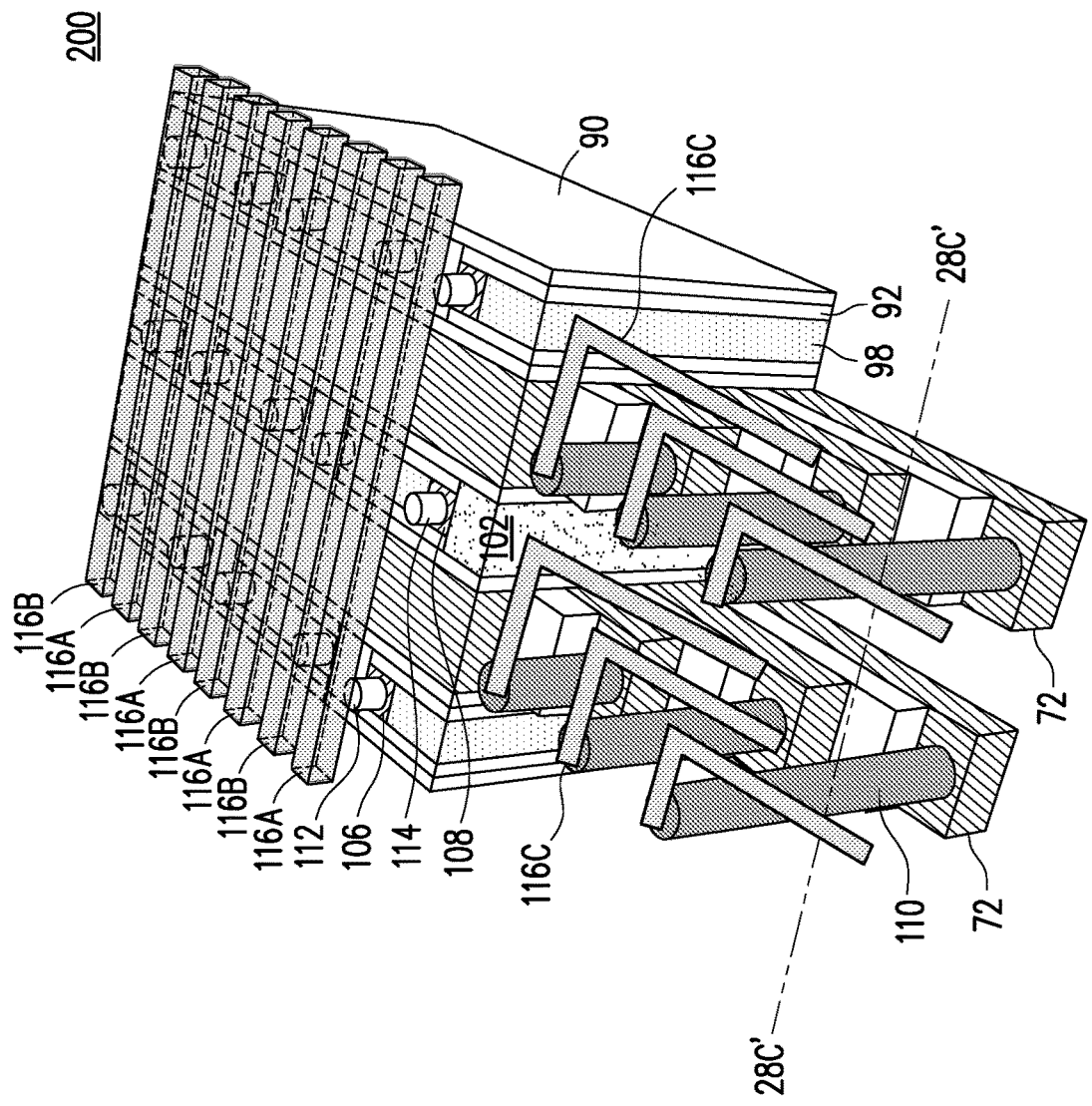
Figure 28B:
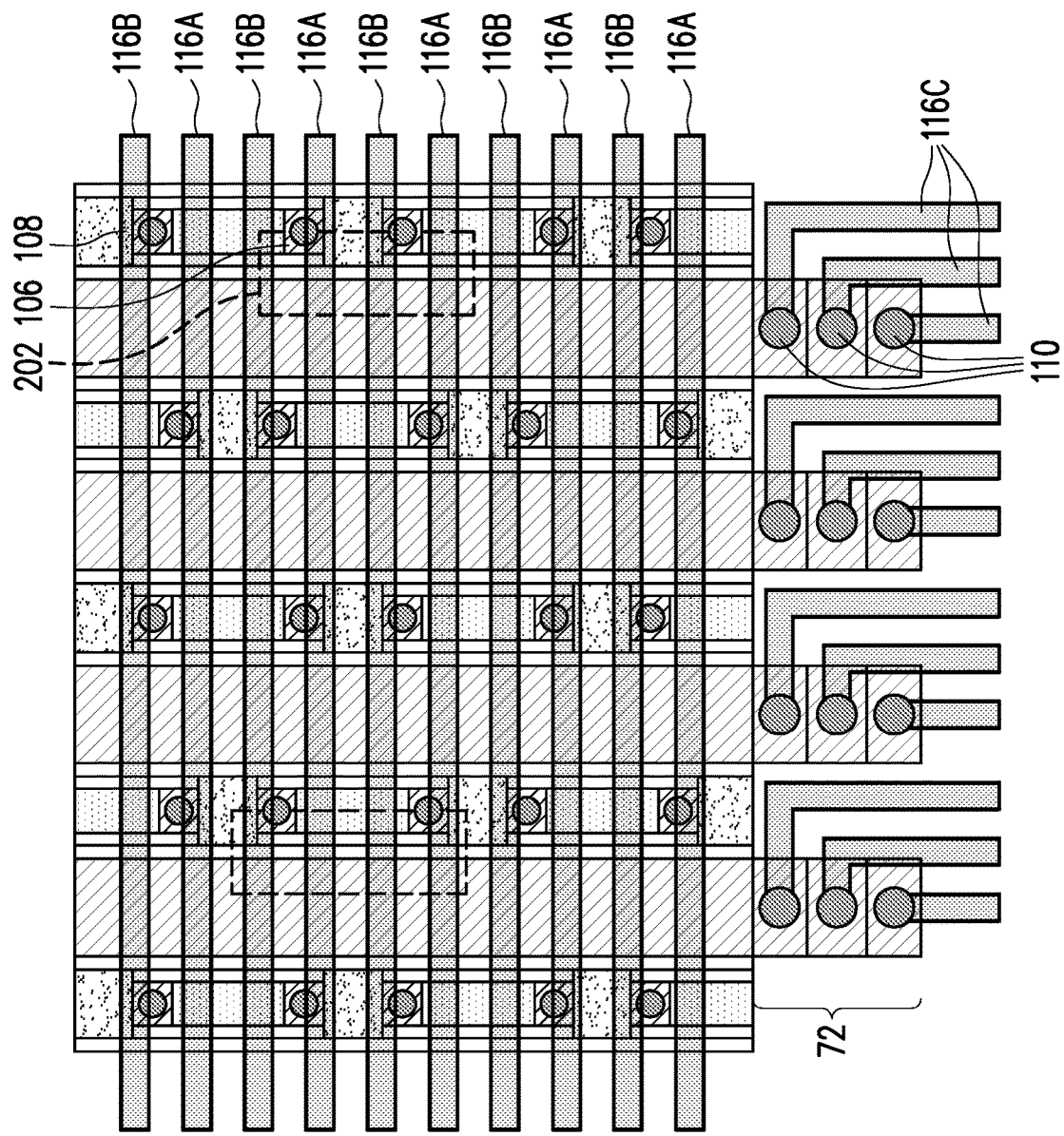
Figure 28C:
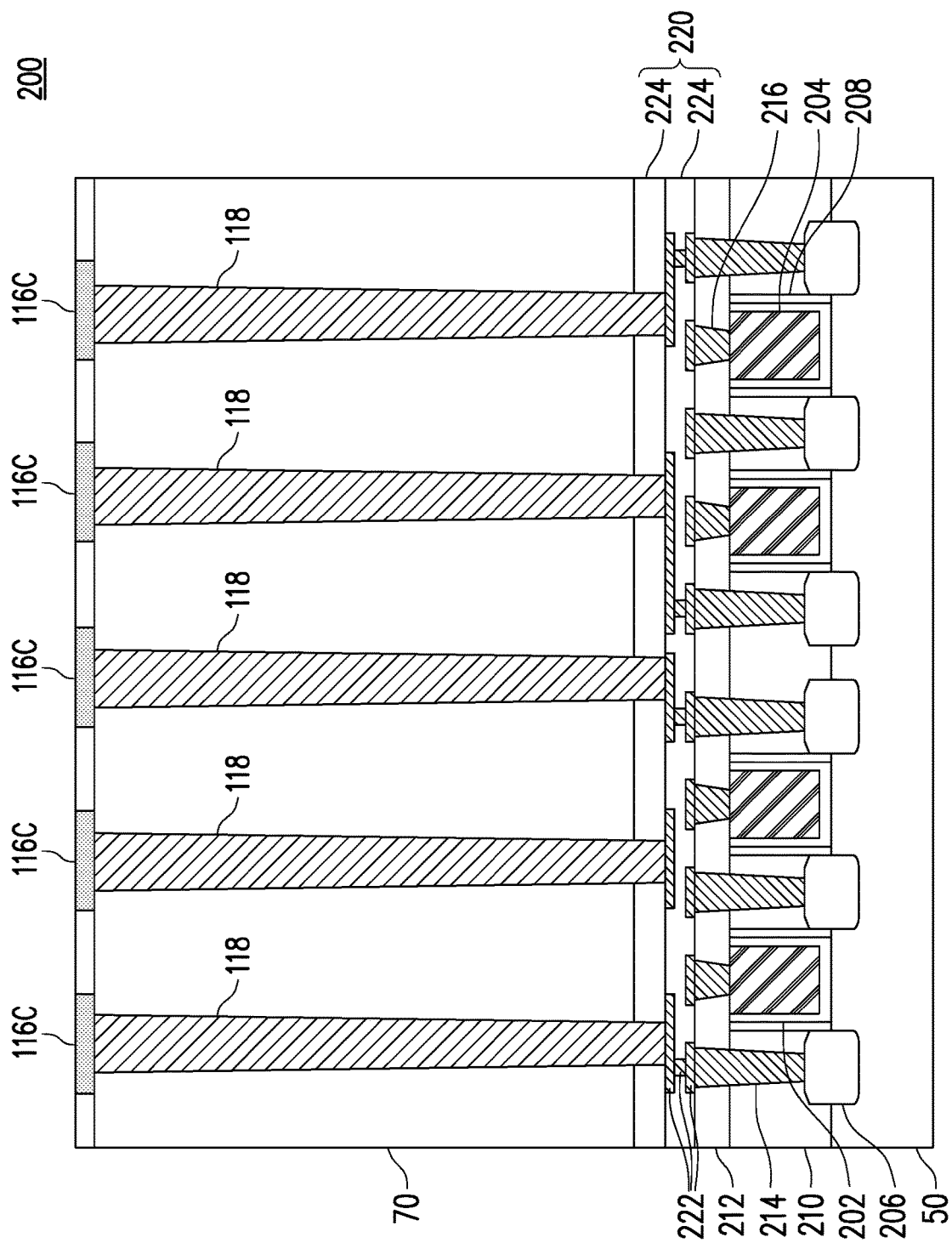
Figure 28D:
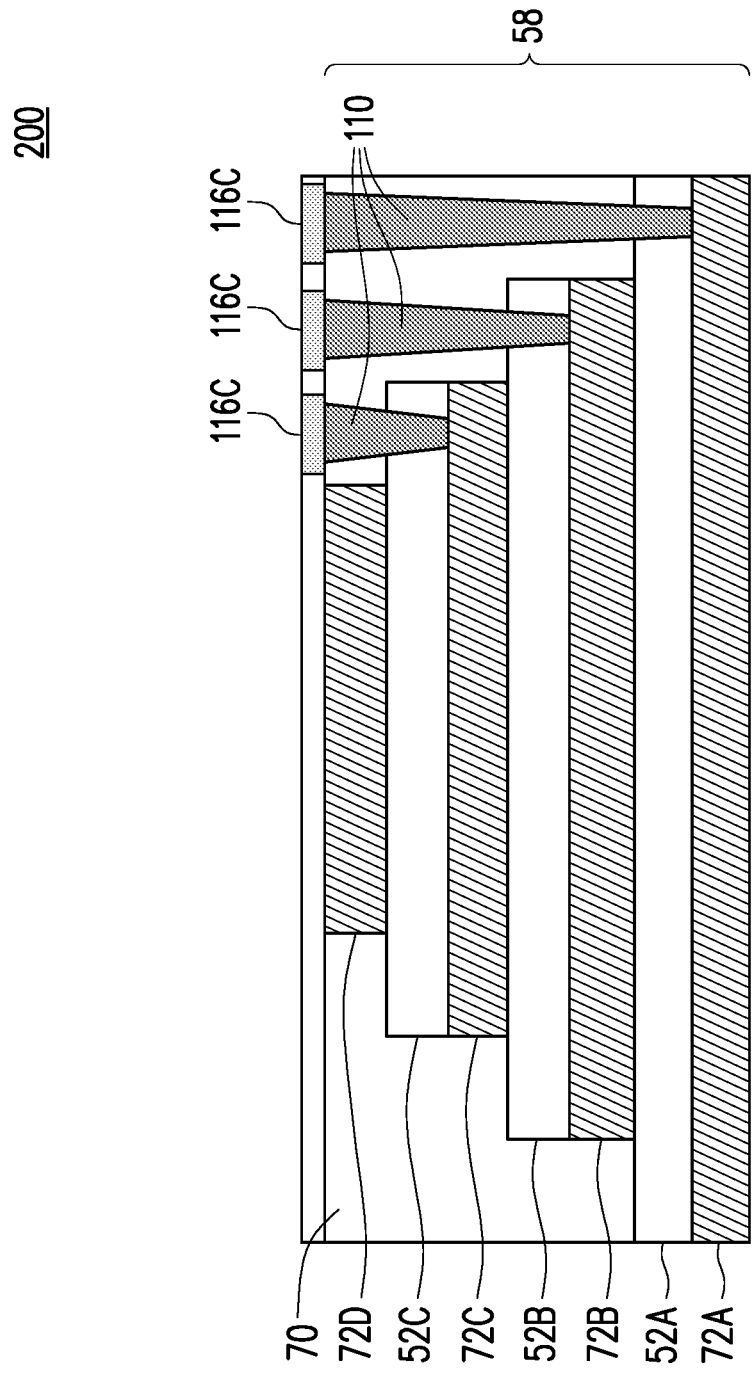

In FIGS. 28A, 28B, 28C, and 28D, contacts 110 are made to the conductive lines 72, the conductive lines 106, and the conductive lines 108. FIG. 28A illustrates a perspective view of the memory array 200; FIG. 28B illustrates a top-down view of the memory array 200; and FIG. 28C illustrates a cross-sectional view of the device and underlying substrate alone the line 30C'-30C' of FIG. 28A; and FIG. 28D illustrates a cross-sectional view of the device along line B-B' of FIG. 1A. In some embodiments, the staircase shape of the conductive lines 72 may provide a surface on each of the conductive lines 72 for the conductive contacts 110 to land on. Forming the contacts 110 may include patterning openings in the IMD 70 and the dielectric layers 52 to expose portions of the conductive layers 54 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 70. The remaining liner and conductive material form the contacts 110 in the openings.

As also illustrated by the perspective view of FIG. 28A, conductive contacts 112 and 114 may also be made to the conductive lines 106 and the conductive lines 108, respectively. The conductive contacts 110, 112, and 114 may be electrically connected to conductive lines 116A, 116B, and 116C, respectively, which connect the memory array to an underlying/overlying circuitry (e.g., control circuitry) and/or signal, power, and ground lines in the semiconductor die. For example, conductive vias 118 may extend through the IMD 70 to electrically connect conductive lines 116C to the underlying circuity of the interconnect structure 220 and the active devices on the substrate 50 as illustrated by FIG. 28C. Other conductive vias may be formed through the IMD 70 to electrically connect the conductive lines 116A and 116B to the underlying circuitry of the interconnect structure 220. In alternate embodiments, routing and/or power lines to and from the memory array may be provided by an interconnect structure formed over the memory array 200 in addition to or in lieu of the interconnect structure 220. Accordingly, the memory array 200 may be completed.

Figure 29:
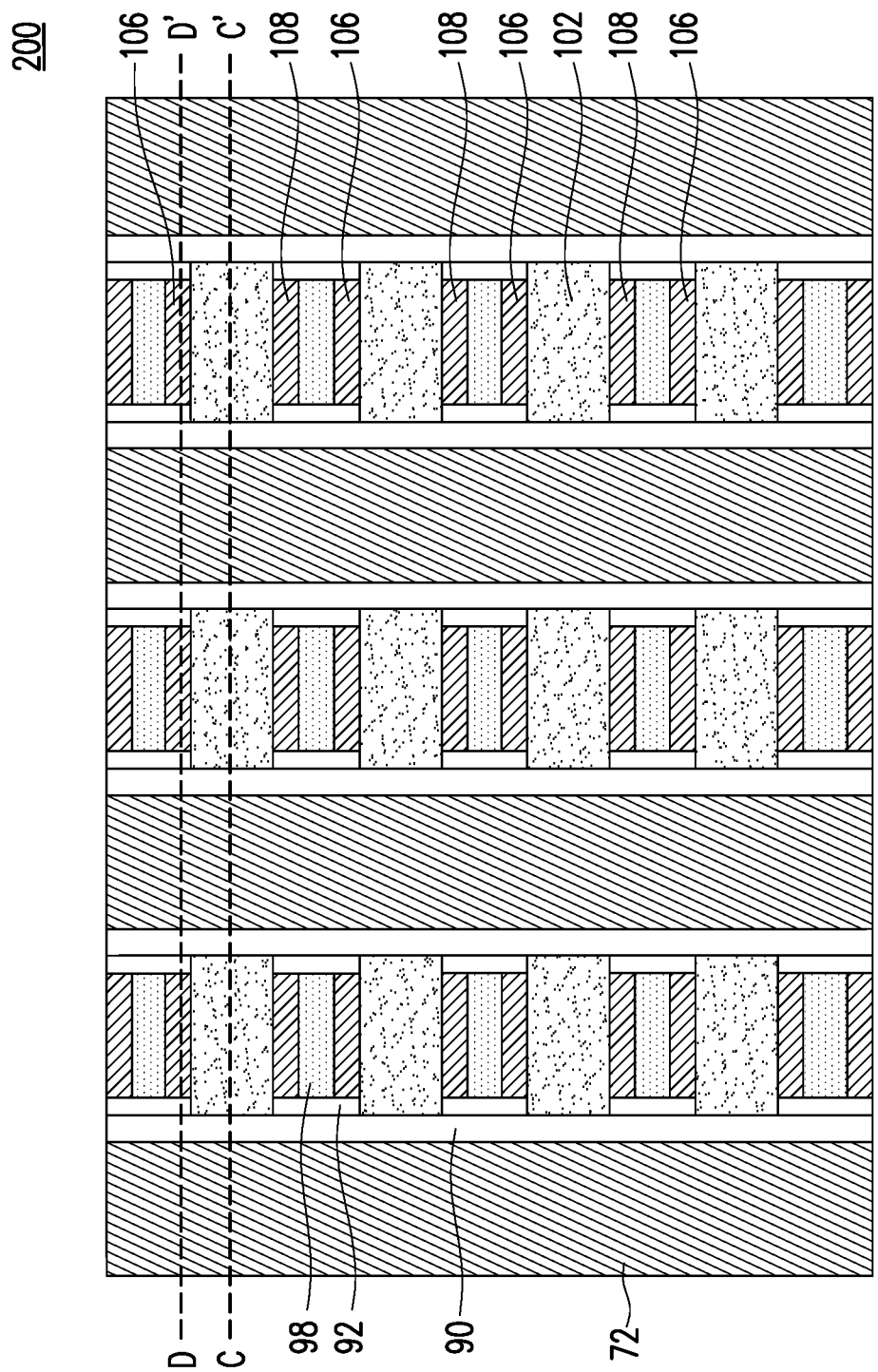
FIGS. 29, 30, and 31 illustrate varying views of a memory array in accordance with some embodiments.
Figure 30:
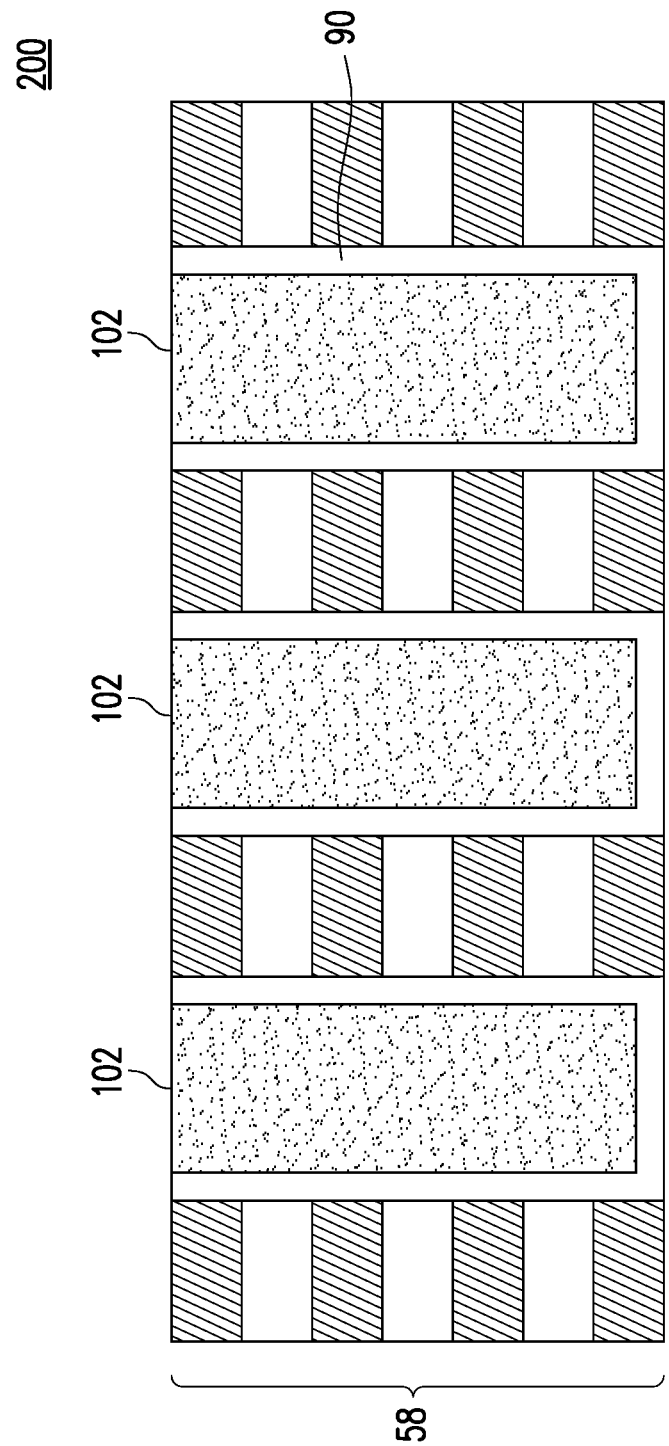
Figure 31:
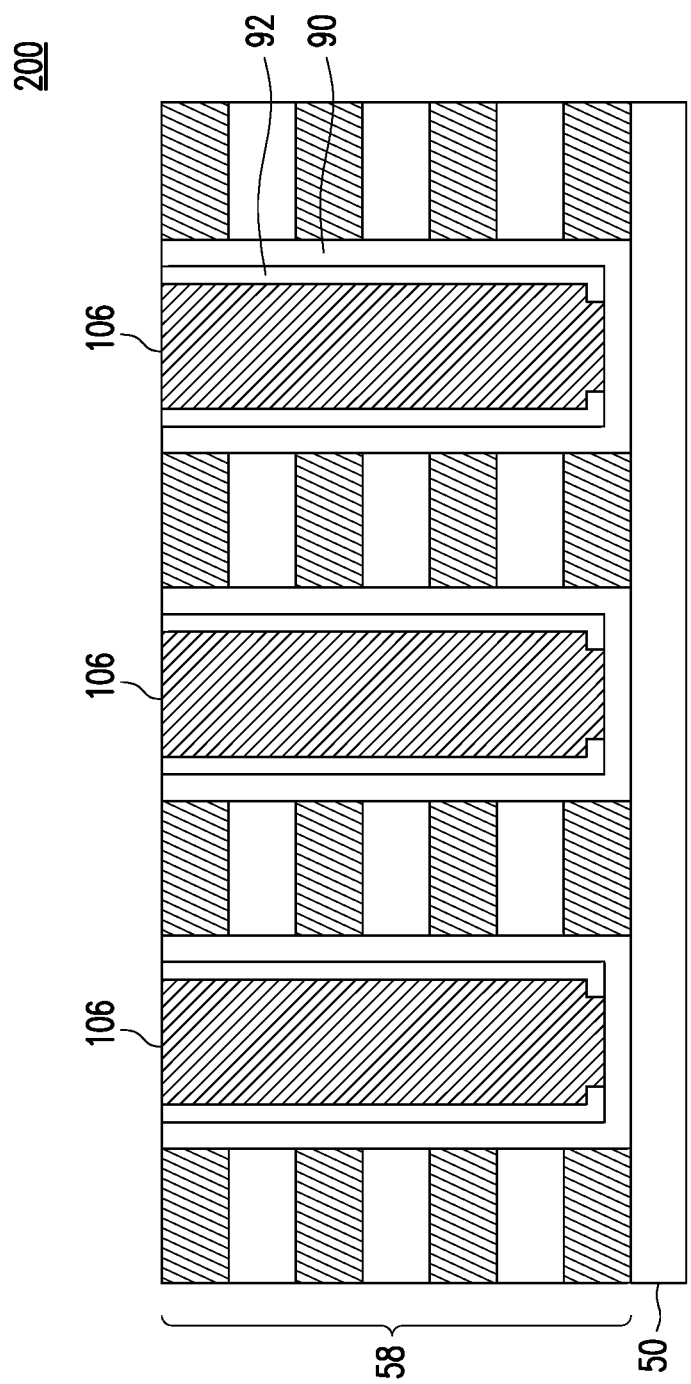

Although the embodiments of FIGS. 2 through 28B illustrate a particular pattern for the conductive lines 106 and 108, other configurations are also possible. For example, in these embodiments, the conductive lines 106 and 108 have a staggered pattern. In some embodiments, the conductive lines 106 and 108 in a same row of the array are all aligned with each other. FIG. 29 illustrates a top-down view, and FIG. 30 illustrates a cross-sectional view alone line C-C' of FIG. 28. FIG. 31 illustrates a cross-sectional view alone line D-D' of FIG. 29. In FIGS. 29, 30, and 31, like reference numerals indicate like elements formed by like processes as the elements of FIGS. 2 through 28B.

Various embodiments provide a 3D memory array with vertically stacked memory cells. The memory cells each comprise a TFT with a FE gate dielectric material and an oxide semiconductor channel region. In some embodiments, the FE material 90 may be a hafnium-based compound that comprises a rare earth metal. The rare earth metal may have an ionic radius larger than hafnium. For example, the rare earth metal may be lanthanum, yttrium, gadolinium, cerium, strontium, or the like. The inclusion of the rare earth metal may allow for the FE material 90 to achieve an orthorhombic crystalline structure with a relatively low-temperature annealing process (e.g., at about 400° C. or less). For example, the rare earth dopants in the FE material 90 may enlarge the composition range of a stable orthorhombic phase of the FE layer 90. Thus, the FE layer 90 comprising an embodiment rare earth metal provides an improved low thermal budget, BEOL integration for the memory array 200. Further, by including a rare earth metal in the FE material 90, the intrinsic fatigue performance and endurance of the FE material 90 may be improved. For example, in experimental data, the endurance of the FE material 90 may be improved by at least ten times compared to a FE material without an embodiment rare earth metal, and the FE material 90 may allow for at least $10^8$ polarization cycles without significant degradation of the FE material 90. Accordingly, various embodiments improve reliability of the resulting device and manufacturing ease.

In some embodiments, a memory cell includes a thin film transistor over a semiconductor substrate. The thin film transistor comprising: a ferroelectric (FE) material contacting a word line, the FE material being a hafnium-comprising compound, and the hafnium-comprising compound comprising a rare earth metal; and an oxide semiconductor (OS) layer contacting a source line and a bit line, wherein the FE material is disposed between the OS layer and the word line. Optionally in some embodiments, the rare earth metal has an ionic radius greater than an ionic radius of hafnium. Optionally in some embodiments, the rare earth metal is lanthanum, yttrium, gadolinium, cerium, or strontium. Optionally in some embodiments, the hafnium-comprising compound is an oxide. Optionally in some embodiments, the hafnium-comprising compound further comprises zirconium. Optionally in some embodiments, the hafnium-comprising compound has an orthorhombic lattice crystalline structure. Optionally in some embodiments, a longitudinal axis of the word line extends parallel to a major surface of a semiconductor substrate, a longitudinal axis of the source line extends perpendicular to the major surface of the semiconductor substrate, and a longitudinal axis of the bit line extends perpendicular to the major surface of the semiconductor substrate.

In some embodiments, a device includes a semiconductor substrate; a first memory cell over the semiconductor substrate, the first memory cell comprising a first thin film transistor, wherein the first thin film transistor comprises: a first portion of a ferroelectric material, the first portion of the ferroelectric material being on a sidewall of a first word line, and the ferroelectric material comprising a rare earth metal; and a first channel region on a sidewall of the ferroelectric material, the first channel region comprising an oxide semiconductor material; and a second memory cell over the first memory cell. Optionally in some embodiments, the ferroelectric material comprises HfLaO, HfCeO, HfGdO, HfZrLaO, HfZrGdO, HfZrYO, HfZrCeO, HfZrSrO, or a combination thereof. Optionally in some embodiments, the ferroelectric material has a crystalline structure with an orthorhombic lattice. Optionally in some embodiments, the oxide semiconductor material extends continuously from a sidewall of a bit line to a sidewall of a source line, and wherein the source line and the bit line each extend along a direction perpendicular to a major surface of the semiconductor substrate. Optionally in some embodiments, the second memory cell comprises a second thin film transistor, the second thin film transistor comprising: a second portion of the ferroelectric material, the second portion of the ferroelectric material contacting a second word line over the first word line, and the second word line and the first word line are separated by a dielectric layer; and a second channel region. Optionally in some embodiments, the first word line is longer than the second word line. Optionally in some embodiments, the oxide semiconductor material comprises ZnO, InWO, InGaZnO, InZnO, ITO, or a combination thereof.

In some embodiments, a method includes patterning a first trench extending through a first conductive line; depositing a ferroelectric (FE) material along sidewalls and a bottom surface of the first trench, wherein depositing the FE material comprises an atomic layer deposition (ALD) process to deposit a hafnium-comprising compound, and wherein the hafnium-comprising compound further comprises a rare earth metal; and depositing an oxide semiconductor (OS) layer over the FE material, the OS layer extending along the sidewalls and the bottom surface of the first trench. Optionally in some embodiments, the ALD process comprises: forming a first monolayer of hafnium oxide; and forming a second monolayer of a rare earth metal oxide over the first monolayer. Optionally in some embodiments, the ALD process further comprises: forming a third monolayer of zirconium oxide between the first monolayer and the second monolayer. Optionally in some embodiments, the ALD process further comprises: forming a third monolayer of zirconium oxide over the second monolayer. Optionally in some embodiments, the ALD process further comprises forming a fourth monolayer of hafnium oxide contacting the first monolayer; and forming a fifth monolayer of a rare earth metal oxide directly contacting the second monolayer. Optionally in some embodiments, the method further comprises after depositing the FE material, performing an annealing process on the FE material at a temperature of 400° C. or less, wherein the FE material has an orthorhombic lattice structure as a result of the annealing process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
a transistor over a semiconductor substrate, the transistor comprising:
a ferroelectric (FE) material directly contacting a word line, the FE material being a hafnium-comprising compound, and the hafnium-comprising compound comprising a rare earth metal, wherein the word line is one of a plurality of vertically stacked word lines, and wherein the FE material directly contacts a respective sidewall of each of the plurality of vertically stacked word lines; and
an oxide semiconductor (OS) layer contacting a source line and a bit line, wherein the FE material is disposed between the OS layer and the word line, and wherein the FE material further directly contacts the OS layer.

2. The memory cell of claim 1, wherein the rare earth metal has an ionic radius greater than an ionic radius of hafnium.

3. The memory cell of claim 1, wherein the rare earth metal is lanthanum, yttrium, gadolinium, cerium, or strontium.

4. The memory cell of claim 1, wherein the hafnium-comprising compound is an oxide.

5. The memory cell of claim 1, wherein the hafnium-comprising compound further comprises zirconium.

6. The memory cell of claim 1, wherein the hafnium-comprising compound has an orthorhombic lattice crystalline structure.

7. The memory cell of claim 1, a longitudinal axis of the word line extends parallel to a major surface of a semiconductor substrate, a longitudinal axis of the source line extends perpendicular to the major surface of the semiconductor substrate, and a longitudinal axis of the bit line extends perpendicular to the major surface of the semiconductor substrate.

8. The memory cell of claim 1, wherein a dielectric layer is disposed over and contacting the word line, and wherein the FE material extends above an interface between the dielectric layer and the word line.

9. A device comprising:
a semiconductor substrate;
a first memory cell over the semiconductor substrate, the first memory cell comprising a first thin film transistor, wherein the first thin film transistor comprises:
a first portion of a ferroelectric material, the first portion of the ferroelectric material being on a sidewall of a first word line, and the ferroelectric material comprising a rare earth metal; and
a first channel region on a sidewall of the ferroelectric material, the first channel region comprising an oxide semiconductor material; and
a second memory cell over the first memory cell, wherein the second memory cell comprises a second thin film transistor, the second thin film transistor comprising:
a second portion of the ferroelectric material, the second portion of the ferroelectric material contacting a second word line over the first word line, the second word line and the first word line being separated by a dielectric layer, and the ferroelectric material extending continuously from a level of a top surface of the second word line to a level of a bottom surface of the first word line; and
a second channel region, the second channel region comprising the oxide semiconductor material.

10. The device of claim 9, wherein the ferroelectric material comprises HfLaO, HfCeO, HfGdO, HfZrLaO, HfZrGdO, HfZrYO, HfZrCeO, HfZrSrO, or a combination thereof.

11. The device of claim 9, wherein the ferroelectric material has a crystalline structure with an orthorhombic lattice.

12. The device of claim 9, wherein the oxide semiconductor material extends continuously from a sidewall of a bit line to a sidewall of a source line, and wherein the source line and the bit line each extend along a direction perpendicular to a major surface of the semiconductor substrate.

13. The device of claim 9, wherein the first word line is longer than the second word line.

14. The device of claim 9, wherein the oxide semiconductor material comprises ZnO, InWO, InGaZnO, InZnO, ITO, or a combination thereof.

15. A device comprising:
a first conductive line;
a first dielectric material over the first conductive line;
a second conductive line over the first dielectric material;
a ferroelectric (FE) material along sidewalls of the first conductive line, the first dielectric material, and the second conductive line, wherein the FE material comprises a hafnium-comprising compound, and wherein the hafnium-comprising compound further comprises a rare earth metal;
a first oxide semiconductor (OS) material along a sidewall of the FE material, wherein the FE material separates the first OS material from the first conductive line and the second conductive line;
a second oxide semiconductor (OS) material along a sidewall of the FE material, wherein the FE material separates the second OS material from the first conductive line and the second conductive line; and
a third dielectric material separating the first OS material from the second OS material.

16. The device of claim 15 further comprising:
a third conductive line along a sidewall of the first OS material, wherein the first OS material is between the third conductive line and the FE material;
a fourth conductive line along the sidewall of the first OS material, wherein the first OS material is between the fourth conductive line and the FE material; and
a second dielectric material separating the third conductive line from the fourth conductive line.

17. The device of claim 16, wherein the first conductive line and the second conductive line extend along a first direction, and wherein the third conductive line and the fourth conductive line extend along a second direction that is orthogonal to the first direction.

18. The device of claim 15, wherein the FE material comprises HfLaO, HfCeO, HfGdO, HfZrLaO, HfZrGdO, HfZrYO, HfZrCeO, HfZrSrO, or a combination thereof.

19. The device of claim 15, wherein the FE material has a crystalline structure with an orthorhombic lattice.

20. The device of claim 15, wherein the FE material physically contacts the first conductive line, the second conductive line, the first OS material, and the second OS material.

* * * * *